US007962820B2

(12) United States Patent
Rajski et al.

(10) Patent No.: US 7,962,820 B2
(45) Date of Patent: *Jun. 14, 2011

(54) FAULT DIAGNOSIS OF COMPRESSED TEST RESPONSES

(75) Inventors: Janusz Rajski, West Linn, OR (US); Grzegorz Mrugalski, Wilsonville, OR (US); Artur Pogiel, Szubin (PL); Jerzy Tyszer, Poznan (PL); Chen Wang, Tigard, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/405,828

(22) Filed: Mar. 17, 2009

(65) Prior Publication Data

US 2009/0249147 A1    Oct. 1, 2009

Related U.S. Application Data

(63) Continuation of application No. 11/213,316, filed on Aug. 25, 2005, now Pat. No. 7,509,550, and a continuation-in-part of application No. 10/778,950, filed on Feb. 13, 2004, now Pat. No. 7,370,254.

(60) Provisional application No. 60/612,952, filed on Sep. 24, 2004, provisional application No. 60/447,637, filed on Feb. 13, 2003, provisional application No. 60/506,499, filed on Sep. 26, 2003.

(51) Int. Cl.
*G01R 31/3193* (2006.01)
*G01R 31/40* (2006.01)

(52) U.S. Cl. ........................ 714/732; 714/726

(58) Field of Classification Search ............ None
See application file for complete search history.

(56) References Cited

U.S. PATENT DOCUMENTS

| 4,161,041 A | 7/1979 | Butler et al. |
| 4,320,509 A | 3/1982 | Davidson |
| 4,503,537 A | 3/1985 | McAnney |

(Continued)

FOREIGN PATENT DOCUMENTS

EP    0438322    7/1991

(Continued)

OTHER PUBLICATIONS

U.S. Appl. No. 09/620,021, filed Jul. 20, 2000, Rajski et al.

(Continued)

*Primary Examiner* — Jeffrey A Gaffin
*Assistant Examiner* — Dipakkumar Gandhi
(74) *Attorney, Agent, or Firm* — Klarquist Sparkman, LLP

(57) ABSTRACT

Methods, apparatus, and systems for diagnosing failing scan cells from compressed test responses are disclosed herein. For example, in one nonlimiting exemplary embodiment, at least one error signature comprising multiple bits (including one or more error bits) is received. Plural potential-error-bit-explaining scan cell candidates are evaluated using a search tree. A determination is made as to whether one or more of the evaluated scan cell candidates explain the error bits in the error signature and thereby constitute one or more failing scan cells. An output is provided of any such one or more failing scan cells determined. Tangible computer-readable media comprising computer-executable instructions for causing a computer to perform any of the disclosed methods are also provided. Tangible computer-readable media comprising lists of failing scan cells identified by any of the disclosed methods are also provided.

20 Claims, 22 Drawing Sheets

U.S. PATENT DOCUMENTS

| | | | |
|---|---|---|---|
| 4,513,418 A | 4/1985 | Bardell, Jr. et al. |
| 4,536,881 A | 8/1985 | Kasuya |
| 4,602,210 A | 7/1986 | Fasang et al. |
| 4,687,988 A | 8/1987 | Eichelberger et al. |
| 4,754,215 A | 6/1988 | Kawai |
| 4,801,870 A | 1/1989 | Eichelberger et al. |
| 5,072,178 A | 12/1991 | Matsumoto |
| 5,090,035 A | 2/1992 | Murase |
| 5,091,908 A | 2/1992 | Zorian |
| 5,138,619 A | 8/1992 | Fasang et al. |
| 5,167,034 A | 11/1992 | MacLean, Jr. et al. |
| 5,173,906 A | 12/1992 | Dreibelbis et al. |
| 5,258,986 A | 11/1993 | Zerbe |
| 5,301,199 A | 4/1994 | Ikenaga et al. |
| 5,369,648 A | 11/1994 | Nelson |
| 5,412,665 A | 5/1995 | Gruodis et al. |
| 5,416,783 A | 5/1995 | Broseghini et al. |
| 5,450,414 A | 9/1995 | Lin |
| 5,533,035 A | 7/1996 | Saxena et al. |
| 5,533,128 A | 7/1996 | Vobach |
| 5,574,733 A | 11/1996 | Kim |
| 5,608,870 A | 3/1997 | Valiant |
| 5,612,729 A | 3/1997 | Ellis et al. |
| 5,631,913 A | 5/1997 | Maeda |
| 5,642,362 A | 6/1997 | Savir |
| 5,680,543 A | 10/1997 | Bhawmik |
| 5,694,402 A | 12/1997 | Butler et al. |
| 5,701,308 A | 12/1997 | Attaway et al. |
| 5,717,701 A | 2/1998 | Angelotti et al. |
| 5,790,562 A | 8/1998 | Murray et al. |
| 5,831,992 A | 11/1998 | Wu |
| 5,848,198 A | 12/1998 | Penn |
| 5,867,507 A | 2/1999 | Beebe et al. |
| 5,881,067 A | 3/1999 | Narayanan et al. |
| 5,883,906 A | 3/1999 | Turnquist et al. |
| 5,899,961 A | 5/1999 | Sundermann |
| 5,905,986 A | 5/1999 | Rohrbaugh et al. |
| 5,938,784 A | 8/1999 | Kim |
| 5,991,898 A | 11/1999 | Rajski et al. |
| 5,991,909 A | 11/1999 | Rajski et al. |
| 6,026,508 A | 2/2000 | Craft |
| 6,181,164 B1 | 1/2001 | Miller |
| 6,272,653 B1 | 8/2001 | Amstutz |
| 6,300,885 B1 | 10/2001 | Davenport et al. |
| 6,308,290 B1 | 10/2001 | Forlenza et al. |
| 6,308,291 B1 | 10/2001 | Kock et al. |
| 6,327,687 B1 | 12/2001 | Rajski et al. |
| 6,353,842 B1 | 3/2002 | Rajski et al. |
| 6,425,104 B1 | 7/2002 | Toumiya |
| 6,463,561 B1 | 10/2002 | Bhawmik et al. |
| 6,467,058 B1 | 10/2002 | Chakradhar et al. |
| 6,539,409 B2 | 3/2003 | Rajski et al. |
| 6,543,020 B2 | 4/2003 | Rajski et al. |
| 6,557,129 B1 | 4/2003 | Rajski et al. |
| 6,590,929 B1 | 7/2003 | Williams |
| 6,668,347 B1 | 12/2003 | Babella et al. |
| 6,671,839 B1 | 12/2003 | Cote et al. |
| 6,684,358 B1 | 1/2004 | Rajski et al. |
| 6,708,192 B2 | 3/2004 | Rajski et al. |
| 6,763,488 B2 | 7/2004 | Whetsel |
| 6,807,646 B1 | 10/2004 | Williams et al. |
| 6,829,740 B2 | 12/2004 | Rajski et al. |
| 6,874,109 B1 | 3/2005 | Rajski et al. |
| 6,950,947 B1 | 9/2005 | Purtell et al. |
| 6,993,694 B1 | 1/2006 | Kapur et al. |
| 7,032,148 B2 | 4/2006 | Wang et al. |
| 7,058,869 B2 | 6/2006 | Abdel-Hafez et al. |
| 7,093,175 B2 | 8/2006 | Rajski et al. |
| 7,111,209 B2 | 9/2006 | Rajski et al. |
| 7,146,584 B2 | 12/2006 | Varney |
| 7,191,373 B2 | 3/2007 | Wang et al. |
| 7,302,624 B2 | 11/2007 | Rajski et al. |
| 7,370,254 B2 | 5/2008 | Rajski et al. |
| 7,437,640 B2 | 10/2008 | Rajski et al. |
| 7,509,550 B2 * | 3/2009 | Rajski et al. ............... 714/732 |
| 7,552,373 B2 | 6/2009 | Wang et al. |
| 2002/0099992 A1 | 7/2002 | Distler et al. |
| 2002/0112199 A1 | 8/2002 | Whetsel |
| 2002/0124217 A1 | 9/2002 | Hiraide et al. |
| 2003/0120988 A1 | 6/2003 | Rajski et al. |
| 2003/0131298 A1 | 7/2003 | Rajski et al. |
| 2003/0188269 A1 | 10/2003 | Mitra et al. |
| 2004/0128599 A1 | 7/2004 | Rajski et al. |
| 2004/0172431 A1 | 9/2004 | Rajski et al. |
| 2004/0230884 A1 | 11/2004 | Rajski et al. |
| 2005/0015688 A1 | 1/2005 | Rajski et al. |
| 2005/0055613 A1 | 3/2005 | Mitra et al. |
| 2005/0097419 A1 | 5/2005 | Rajski et al. |
| 2006/0041812 A1 | 2/2006 | Rajski et al. |
| 2006/0041813 A1 | 2/2006 | Rajski et al. |
| 2006/0041814 A1 | 2/2006 | Rajski et al. |
| 2007/0011530 A1 | 1/2007 | Rajski et al. |
| 2007/0016836 A1 | 1/2007 | Rajski et al. |

FOREIGN PATENT DOCUMENTS

| | | |
|---|---|---|
| EP | 0 549 949 | 3/1998 |
| EP | 1978446 | 10/2008 |
| JP | 63-286780 | 11/1988 |
| JP | 01-239486 | 9/1989 |
| JP | 03-002579 | 1/1991 |
| JP | 03-012573 | 1/1991 |
| JP | 05-215816 | 8/1993 |
| JP | 05-249197 | 9/1993 |
| JP | 07-174822 | 7/1995 |
| JP | 08-015382 | 1/1996 |
| JP | 11-030646 | 2/1999 |
| JP | 11-264860 | 9/1999 |
| WO | WO 91/10182 | 7/1991 |
| WO | WO 01/38889 | 5/2001 |
| WO | WO 01/39254 | 5/2001 |

OTHER PUBLICATIONS

U.S. Appl. No. 11/213,316, filed Aug. 25, 2005, Rajski et al.
U.S. Appl. No. 11/213,327, filed Aug. 25, 2005, Rajski et al.
U.S. Appl. No. 11/213,672, filed Aug. 25, 2005, Rajski et al.
Aldrich et al., "Improving Test Quality and Reducing Escapes," *Fabless Forum Magazine*, vol. 10, No. 1, 2 pp. (2003).
Aitken et al., "A Diagnosis Method Using Pseudo-Random Vectors Without Intermediate Signatures," *Proc. ICCAD*, pp. 574-577 (1989).
Bardell, "Design Considerations for Parallel Pseudorandom Pattern Generators," *Journal of Electronic Testing: Theory and Applications*, 1, 73-87 (1990).
Bardell et al., *Built-In Test for VLSI Pseudorandom Techniques*, Chapter 4, "Test Response Compression Techniques," John Wiley & Sons, Inc., pp. 89-108 (1987).
Barnhart et al., "Extending OPMISR beyond 10x Scan Test Efficiency," *IEEE Design and Test*, vol. 19, No. 5, pp. 65-73 (Sep. 2002).
Bayraktaroglu et al., "Deterministic Partitioning Techniques for Fault Diagnosis in Scan-Based BIST," *Proc. ITC*, pp. 273-282 (2000).
Bayraktaroglu et al., "Diagnosis for Scan Based BIST: Reaching Deep into the Signatures," *Proc. Design Automation and Test in Europe*, pp. 102-109 (2001).
Benowitz et al., "An Advanced Fault Isolation System for Digital Logic," *IEEE Transactions on Computers*, vol. 24, No. 5, pp. 489-497 (1975).
Benware et al., "Impact of Multiple-Detect Test Patterns on Product Quality," *Proc. ITC*, pp. 1031-1040 (Sep. 2003).
Bhattacharya et al., "Synthesis of Single-Output Space Compactors for Scan-Based Sequential Circuits," *IEEE Transactions on Computer-Aided Design of Integrated Circuits and Systems*, vol. 21, No. 10, pp. 1171-1179 (Oct. 2002).
Caspi et al., "An A Priori Approach to the Evaluation of Signature Analysis Efficiency," *IEEE Trans. on Computers*, vol. 40, No. 9, pp. 1068-1071 (Sep. 1991).
Chakrabarty et al., "Optimal Space Compaction of Test Responses," *Proc. ITC*, pp. 834-843 (1995).
Chakrabarty et al., "Optimal Zero-Aliasing Space Compaction of Test Responses," *IEEE Transactions on Computers*, vol. 47, No. 11, pp. 1171-1187 (Nov. 1998).
Chakrabarty et al., "Test Response Compaction Using Multiplexed Parity Trees," *IEEE Transactions on Computer-Aided Design of Inte-

*grated Circuits and Systems*, vol. 15, No. 11, pp. 1399-1408 (Nov. 1996).

Chakrabarty, "Zero-Aliasing Space Compaction Using Linear Compactors With Bounded Overhead," *IEEE Transactions on Computer-Aided Design of Integrated Circuits and Systems*, vol. 17, No. 5, pp. 452-457 (May 1998).

Chan et al., "A Study of Faulty Signature for Diagnostics," *Proc. ISCAS*, pp. 2701-2704 (1990).

Chan et al., "A Study of Faulty Signatures Using a Matrix Formulation," *Proc. ITC*, pp. 553-561 (1990).

Chickermane et al., "Channel Masking Synthesis for Efficient On-Chip Test Compression," *Proc. ITC*, pp. 452-461 (2004).

Damarla et al., "Multiple Error Detection and Identification via Signature Analysis," *Journal of Electronic Testing: Theory and Applications*, vol. 7, No. 3, pp. 193-207 (1995).

Das et al., "Data Compression in Space Under Generalized Mergeability Based on Concepts of Cover Table and Frequency Ordering," *IEEE Transactions on Instrumentation and Measurement*, vol. 51, No. 1, pp. 150-172 (Feb. 2001).

Das et al., "Fault Tolerance in Systems Design in VLSI Using Data Compression Under Constraints of Failure Probabilities," *IEEE Transactions on Instrumentation and Measurement*, vol. 51, No. 6, pp. 1725-1747 (Dec. 2001).

Edirisooriya et al., "Diagnosis of Scan Path Failures," *Proc. VLSI Test Symp.*, pp. 250-255 (1995).

European Search Report dated Sep. 1, 2008, from European Application No. EP 08 15 9782.

Frohwerk, "Signature Analysis: A New Digital Field Services Method," *Hewlett-Packard Journal*, pp. 2-8 (May 1977).

Ghosh-Dastidar et al., "A Rapid And Scalable Diagnosis Scheme for BIST Environments with a Large Number of Scan Chains," *Proc. VLSI Test Symp.*, pp. 79-85 (2000).

Ghosh-Dastidar et al., "Fault Diagnosis in Scan-Based BIST Using Both Time and Space Information," *Proc. ITC*, pp. 95-102 (1999).

Guo et al., "A Technique for Fault Diagnosis of Defects in Scan Chains," *Proc. ITC*, pp. 268-277 (2001).

Han et al., "Test Resource Partitioning Based on Efficient Response Compaction for Test Time and Tester Channels Reduction," *Proc. ATS*, 6 pp. (Nov. 2003).

Hayes, "Check Sum Test Methods," *Proc. FTCS*, pp. 114-120 (1976).

Hayes, "Transition Count Testing of Combinational Logic Circuits," *IEEE Transactions on Computers*, vol. C-25, No. 6, pp. 613-620 (Jun. 1976).

Hellebrand et al., "Built-in Test for Circuits With Scan Based on Reseeding of Multiple Polynomial Linear Feedback Shift Registers," *IEEE Transactions on Computers*, vol. C-44, pp. 223-233 (Feb. 1995).

Hellebrand et al., "Generation of Vector Patterns Through Reseeding of Multiple-Polynomial Linear Feedback Shift Registers," *Proc. ITC*, pp. 120-129 (1992).

Hetherington et al., "Logic BIST for Large Industrial Designs: Real Issues and Case Studies," *Proc. ITC*, pp. 358-367 (1999).

Hsu et al., "A Case Study on the Implementation of the Illinois Scan Architecture," *Proc. ITC*, pp. 538-547 (2001).

Ivanov et al., "Programmable BIST Space Compactors," *IEEE Transactions on Computers*, vol. C-45, No. 12, pp. 1393-1404 (Dec. 1996).

Jas et al., "Scan Vector Compression/Decompression Using Statistical Coding," *Proc. VLSI Test Symp.*, pp. 114-120 (1999).

Jone et al., "Space Compression Method for Built-In Self-Testing of VLSI Circuits," *Int'l Journal of Computer Aided VLSI Design*, vol. 3, pp. 309-322 (1991).

Karpovsky et al., "Board-Level Diagnosis by Signature Analysis," *Proc. ITC*, pp. 47-53 (1988).

Karpovsky et al., "Design of Self-Diagnostic Boards by Multiple Signature Analysis," *IEEE Transactions on Computers*, vol. 42, No. 9, pp. 1035-1044 (Sep. 1993).

Kim et al., "On Using Signature Registers as Pseudorandom Pattern Generators in Built-in Self Testing," *IEEE Transactions on Computer-Aided Design*, vol. CAD-7, No. 8, pp. 919-928 (Aug. 1988).

Koenemann et al., "A SmartBIST Variant with Guaranteed Encoding," *Proc. ATS*, pp. 325-330 (2001).

Koenemann et al., "LFSR-Coded Test Patterns for Scan Designs," *Proc. European Test Conference*, pp. 237-242 (1991).

Konemann et al., "Built-In Logic Block Observation Techniques," *IEEE Test Conference*, 6 pp. (1979).

Kundu, "On Diagnosis of Faults in a Scan-Chain," *Proc. VLSI Test Symp.*, pp. 303-308 (1993).

Leininger et al., "Diagnosis of Scan-Chains by Use of a Configurable Signature Register and Error-Correcting Codes," *Proc. of the Design, Automation and Test in Europe Conference and Exhibition*, 6 pp. (Feb. 2004).

Lew Yan Voon et al., "BIST Linear Generator based on Complemented Outputs," *IEEE VLSI Test Symposium*, pp. 137-142 (1992).

Li et al., "Space Compression Methods With Output Data Modification," *IEEE Transactions on Computer-Aided Design*, vol. CAD-6, No. 2, pp. 290-294 (Mar. 1987).

Liu et al., "Identification of Error-Capturing Scan Cells in Scan-BIST With Applications to System-on-Chip," *IEEE Transactions on Computer-Aided Design*, vol. 23, No. 10, pp. 1447-1459 (Oct. 2004).

McAnney et al., "There is Information in Faulty Signatures," *Proc. ITC*, pp. 630-636 (1987).

Mitra et al., "X-Compact: An Efficent Response Compaction Technique," *IEEE Transactions on Computer-Aided Design*, vol. 23, No. 4, pp. 421-432 (Mar. 2004).

Mitra et al., "X-Compact: An Efficient Response Compaction Technique for Test Cost Reduction," *Proc. ITC*, pp. 311-320 (Oct. 2002).

Mitra et al., "X-tolerant signature analysis," *Proc. ITC*, pp. 432-441 (Oct. 2004).

Morosov et al., "Design of Parameterizable Error Propagating Space Compactors for Response Observation," *Proc. VLSI Test Symp.*, pp. 48-53 (2001).

Mrugalski et al., "Convolutional compaction-driven diagnosis of scan failures," *Proc. ETS*, 6 pp. (2005).

Mrugalski et al., "Fault Diagnosis in Designs with Convolutional Compactors," *Proc. ITC*, pp. 498-507 (Oct. 2004).

Mrugalski et al., "Synthesis of Pattern Generators Based on Cellular Automata with Phase Shifters," *Proc. ITC*, pp. 368-377 (1999).

Narayanan et al., "An Efficient Scheme to Diagnose Scan Chains," *Proc. ITC*, pp. 704-713 (1997).

Naruse et al., "On-chip Compression of Output Responses with Unknown Values Using LFSR Reseeding," *Proc. ITC*, pp. 1060-1068 (Sep. 2003).

Patel et al., "Application to Saluja-Karpovsky Compactors to Test Responses with Many Unknowns," *Proc. VLSI Test Symp.*, 6 pp. (Apr. 2003).

Pomeranz et al., "On Output Response Compression in the Presence of Unknown Output Values," *Proc. DAC*, pp. 255-258 (Jun. 2002).

Pouya et al., "Synthesis of Zero-Aliasing Elementary-Tree Space Compactors," *Proc. VLSI Test Symp.*, pp. 70-77 (1998).

Rajski et al., "Accumulator-Based Compaction of Test Responses," *IEEE Transactions on Computers*, vol. C-42, No. 6, pp. 643-650 (1993).

Rajski et al., *Arithmetic Built-In Self-Test for Embedded Systems*, Chapter 3, "Test Response Compaction," and Chapter 4, "Fault Diagnosis," Prentice Hall PTR, pp. 87-133 (1998).

Rajski et al., "Convolutional Compaction of Test Responses," *Proc. ITC*, pp. 745-754 (Sep. 2003).

Rajski et al., "Design of Phase Shifters for BIST Applications," *Proc. VLSI Test Symp.*, pp. 218-224 (1998).

Rajski et al., "Diagnosis of Scan Cells in BIST Environment," *IEEE Transactions on Computers*, vol. 48, No. 7, pp. 724-731 (Jul. 1999).

Rajski et al., "Embedded Deterministic Test for Low Cost Manufacturing Test," *Proc. ITC*, pp. 301-310 (Oct. 2002).

Rajski et al., "On the Diagnostic Properties of Linear Feedback Shift Registers," *IEEE Transactions on Computer-Aided Design*, vol. 10, No. 10, pp. 1316-1322 (1991).

Rajski et al., "Synthesis of X-tolerant Convolutional Compactors," *Proc. VLSI Test Symp.*, pp. 114-119 (2005).

Rajski et al., "Test Data Decompression for Multiple Scan Designs with Boundary Scan," *IEEE Transactions on Computers*, vol. 47, No. 11, pp. 1188-1200 (Nov. 1998).

Rajski et al., "Test Responses Compaction in Accumulators with Rotate Carry Adders," *IEEE Transactions on Computer-Aided Design of Integrated Circuits and Systems*, vol. CAD-12, No. 4, pp. 531-539 (1993).

Reddy et al., "A Data Compression Technique for Built-In Self-Test," *IEEE Transactions on Computers*, vol. 37, No. 9, pp. 1151-1156 (1988).

Robinson, "Aliasing Probabilities for Feedback Signature Compression of Test Data," *IEEE Trans. on Computers*, vol. 40, No. 7, pp. 867-873 (Jul. 1991).

Robinson et al., "Simultaneous Signature and Syndrome Compression," *IEEE Trans. on Computer-Aided Design*, vol. 7, No. 5, pp. 584-589 (May 1988).

Saluja et al., "Testing Computer Hardware Through Data Compression in Space and Time," *Proc. ITC*, pp. 83-88 (1983).

Savir et al., "Identification of Failing Tests with Cycling Registers," *Proc. ITC*, pp. 322-328 (1988).

Savir, "Syndrome-Testable Design of Combinational Circuits," *IEEE Transactions on Computers*, vol. C-29, No. 6, pp. 442-451 (1980).

Saxena et al., "Accumulator Compression Testing," *IEEE Transactions on Computers*, vol. C-35, No. 4, pp. 317-321 (Apr. 1986).

Saxena et al., "Analysis of Checksums, Extended-Precision Checksums, and Cyclic Redundancy Checks," *IEEE Transactions on Computers*, vol. C-39, No. 7, pp. 969-975 (Jul. 1990).

Saxena et al., "Extended Precision Checksums," *Proc. FTCS*, pp. 142-147 (1987).

Serra et al., "The Analysis of One-Dimensional Linear Cellular Automata and Their Aliasing Properties," *IEEE Transactions on Computer-Aided Design*, vol. Cad-9, No. 7, pp. 767-778 (Jul. 1990).

Seuring et al., "Space Compaction of Test Responses for IP Cores Using Orthogonal Transmission Functions," *Proc. VLSI Test Symp.*, pp. 213-219 (2000).

Smith, "Measures of the Effectiveness of Fault Signature Analysis," *IEEE Transactions on Computers*, vol. C-29, No. 6, pp. 510-514 (Jun. 1980).

Sogomonyan et al., "Early Error Detection in Systems-in-Chip for Fault-Tolerance and At-Speed Debugging," *Proc. VLSI Test Symp.*, pp. 184-189 (2001).

Stroud et al., "Improving the Efficiency of Error Identification via Signature Analysis," *Proc. VLSI Test Symp.*, pp. 244-249 (1995).

Tang et al., "On Efficient X-handling Using a Selective Compaction Scheme to Achieve High Test Response Compaction Ratios," *IEEE Int. Conf. VLSI Design*, pp. 59-65 (Jan. 2005).

Tekumalla, "On Reducing Aliasing Effects and Improving Diagnosis of Logic BIST Failures," *Proc. ITC*, pp. 737-744 (Sep. 2003).

Venkataraman et al., "An Efficient BIST Scheme Based on Reseeding of Multiple Polynomial Linear Feedback Shift Registers," *Proc. IEEE/ACM Int'l Conf. on Computer-Aided Design*, pp. 572-577 (1993).

Waicukauski et al., "Diagnosis of BIST Failures by PPSFP Simulation," *Proc. ITC*, pp. 480-484 (1987).

Waicukauski et al., "Failure Diagnosis of Structured VLSI," *IEEE Design and Test of Computers*, pp. 49-60 (Aug. 1989).

Wang, "BIST Using Pseudorandom Test Vectors and Signature Analysis," *IEEE Custom Integrated Circuits Conference*, pp. 1611-1618 (1998).

Wang et al., "On Compacting Test Responses Data Containing Unknown Values," *Proc. ICCAD*, pp. 855-862 (Nov. 2003).

Williams et al., "Bounds and Analysis of Aliasing Errors in Linear-Feedback Shift Registers," *IEEE Transactions on Computer-Aided Design*, vol. CAD-7, No. 1, pp. 75-83 (Jan. 1988).

Wohl et al., "Analysis and Design of Optimal Combinational Compactors," *IEEE VLSI Test Symp.*, 6 pp. (Apr. 2003).

Wohl et al., "Design of Compactors for Signature-Analyzers in Built-In Self-Test," *Proc. ITC*, pp. 54-63 (2001).

Wohl et al., "Efficient Compression and Application of Deterministic Patterns in a Logic BIST Architecture," *40th Design Automation Conference*, pp. 566-575 (2003).

Wohl et al., "X-tolerant Compression and Application of Scan-ATPG Patterns in a BIST Architecture," *Proc. ITC*, pp. 727-736 (Sep. 2003).

Wu et al., "Scan-Based BIST Fault Diagnosis," *IEEE Transactions on Computer-Aided Design of Integrated Circuits and Systems*, vol. 18, No. 2, pp. 203-211 (Feb. 1999).

Yamaguchi et al., "An Efficient Method for Compressing Test Data," *Proc. ITC*, pp. 79-88 (1997).

Zacharia, et al., "Decompression of Test Data Using Variable-Length Seed LFSRs," *Proc. VLSI Test Symp.*, 426-433 (1995).

Zacharia et al., "Two-Dimensional Test Data Decompressor for Multiple Scan Designs," *Proc. ITC*, pp. 186-194 (1996).

Pomeranz et al., "Static Test Compaction for Multiple Full-Scan Circuits," *Int'l Conf. on Computer Design*, pp. 393-396 (Oct. 2003).

Rajski et al., "Test Data Compression and Compaction for Embedded Test of Nanometer Technology Designs," *Int'l Conf. on Computer Design*, pp. 331-336 (Oct. 2003).

Zorian et al., "Programmable Space Compaction for BIST," *Int'l Symp. On Fault-Tolerant Computing*, pp. 340-349 (Jun. 1993).

\* cited by examiner

$$
\begin{array}{c}
\phantom{x^0} \\
x^0 \\
x^1 \\
x^2 \\
x^3 \\
x^4 \\
x^5 \\
x^6
\end{array}
\begin{array}{ccc}
SC_0 & SC_1 & SC_2
\end{array}
$$

$$
\begin{bmatrix}
0 & 0 & 0 \\
0,1 & 1 & 0 \\
1,2 & 0,2 & 0,1 \\
0,2,3 & 0,1,3 & 0,1,2 \\
1,3 & 1,2 & 1,2,3 \\
2 & 2,3 & 2,3 \\
3 & 3 & 3
\end{bmatrix}
$$

$$
\begin{array}{c}
c_0 \\
c_1 \\
c_2 \\
c_3
\end{array}
\begin{array}{ccc}
SC_0 & SC_1 & SC_2
\end{array}
$$

$$
\begin{bmatrix}
x^0, x^1, x^3 & x^0, x^2, x^3 & x^1, x^2, x^3 \\
x^1, x^2, x^4 & x^1, x^3, x^4 & x^2, x^3, x^4 \\
x^2, x^3, x^5 & x^2, x^4, x^5 & x^3, x^4, x^5 \\
x^3, x^4, x^6 & x^3, x^5, x^6 & x^4, x^5, x^6
\end{bmatrix}
$$

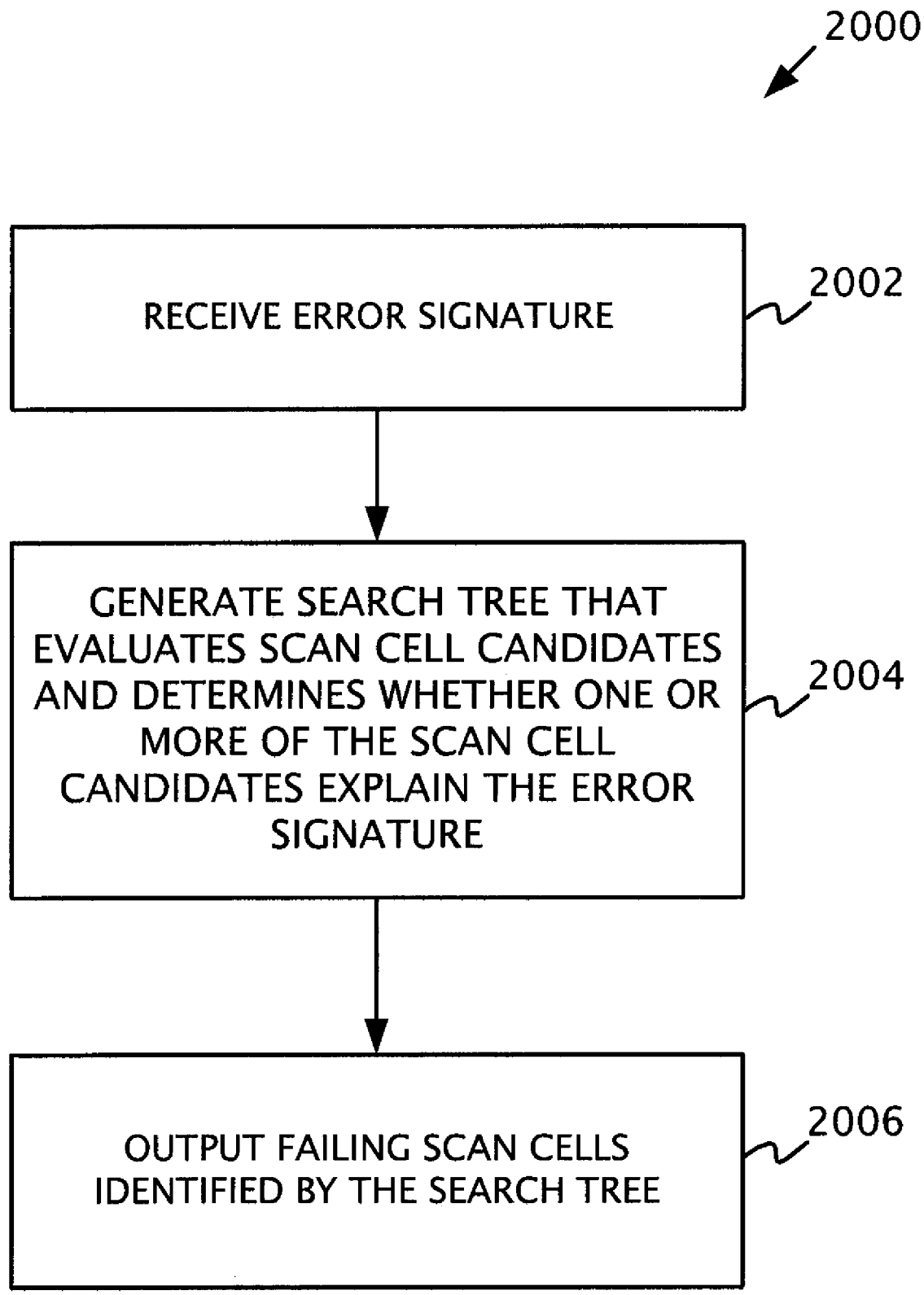

FAULT DIAGNOSIS OF COMPRESSED TEST RESPONSES

CROSS-REFERENCE TO RELATED APPLICATIONS

This application is a continuation of U.S. patent application Ser. No. 11/213,316, filed Aug. 25, 2005, now U.S. Pat. No. 7,509,550 which U.S. patent application Ser. No. 11/213,316 claims the benefit of U.S. Provisional Patent Application No. 60/612,952, filed Sep. 24, 2004, and is a continuation-in-part of U.S. patent application Ser. No. 10/778,950, filed Feb. 13, 2004, now U.S. Pat. No. 7,370,254 which claims the benefit of U.S. Provisional Application No. 60/447,637, filed Feb. 13, 2003, and U.S. Provisional Patent Application No. 60/506,499, filed Sep. 26, 2003, all of which are hereby incorporated by reference.

FIELD

This application relates to testing integrated circuits. For example, this application discloses methods for analyzing compressed test responses in order to identify scan cells that captured error values after application of one or more test patterns.

BACKGROUND

The accurate diagnosis of faults is an increasingly important aspect of testing integrated circuits, especially in view of ever-increasing gate counts and shrinking feature sizes. For circuits that do not utilize compression techniques during testing, fault diagnosis is relatively straightforward. For circuits that have embedded compression hardware, however, accurate fault diagnosis presents a formidable challenge.

The use of compression during the testing of integrated circuits has become widespread. In general, compression helps reduce the volume of test data required for even traditional stuck-at test sets. Such sets, for example, often exceed the capacity of automatic test equipment (ATE) used to test today's multimillion-gate integrated circuits. Moreover, due to the limited bandwidth between the circuit-under-test (CUT) and the ATE, the use of compressed test data and compressed test responses can help decrease test time, and thus the test cost.

The use of scan-based designs for testing purposes has also become widespread. Scan-based designs provide direct access to the internal nodes of the CUT, and thus can help improve fault diagnosis and silicon debugging. For example, the shallow combinational logic that typically exists between scan cells in scan-based designs can make the diagnosis of many high-performance VLSI devices much easier.

For scan-based designs that also utilize compression hardware, fault diagnosis is typically performed in one of three manners: bypass diagnosis, direct diagnosis, and indirect diagnosis. Of these, indirect diagnosis is typically easier to implement in that it uses simpler hardware, is compatible with existing diagnosis tools, and allows for online diagnosis support. Indirect diagnosis is typically performed in two stages. First, the scan cells of the CUT that are driven by cones of logic affected by actual faults are identified. For example, scan cells that captured unexpected (and thus erroneous) values upon application of one or more test patterns are identified from the compressed test responses output from the compactor. From the scan cells identified from such a procedure (sometimes referred to as "failing scan cells"), one can then apply a second diagnosis technique (for example, using a known diagnosis tool for scan-based designs) that helps locate the physical location of the faulty component or element within the CUT.

Many of the conventional fault diagnosis techniques for CUTs having compaction hardware require substantial additional hardware on the CUT or require multiple test sessions to produce useful results for diagnostic purposes. For these reasons, fault diagnosis has been viewed as impractical for production testing. Accordingly, there is a need for diagnostic techniques, especially indirect diagnostic techniques, that can be performed without substantially increasing the hardware overhead of the CUT and that can efficiently diagnose failing scan cells during production testing.

SUMMARY

Disclosed below are representative embodiments of methods, apparatus, and systems for performing or enhancing fault diagnosis that should not be construed as limiting in any way. Instead, the present disclosure is directed toward all novel and nonobvious features and aspects of the various disclosed methods, apparatus, systems, and equivalents thereof, alone and in various combinations and subcombinations with one another. The disclosed technology generally concerns fault diagnosis techniques that can be applied to scan-based or partially scan-based designs. Embodiments of the disclosed scheme can be used to identify failing scan cells in an accurate and time-efficient manner. Further, embodiments of the disclosed techniques can be applied during production testing in many cases to identify failing scan cells after a single test session.

In one of the exemplary methods disclosed, at least one error signature comprising multiple bits is received. In this embodiment, the bits of the error signature correspond to bits of a compressed test response produced by a compactor in the circuit-under-test in response to at least one applied test pattern. The bits of the error signature further comprise one or more error bits that indicate errors at corresponding one or more bit locations of the compressed test response. The bits of the error signature may further comprise one or more unknown bits. Plural potential-error-bit-explaining scan cell candidates are evaluated using a search tree. A determination is made as to whether one or more of the evaluated scan cell candidates explain the error bits in the error signature and thereby constitute one or more failing scan cells. An output is provided of any such one or more failing scan cells determined. The exemplary method can further comprise selecting the error signature from a list of error signatures, and the selection can be based at least partially on the number of errors in the error signature. Further, in certain implementations, the act of receiving at least one error signature can comprise receiving an error signature corresponding to a compressed test response for a single applied test pattern. Further, the act of receiving at least one error signature can comprise receiving an error signature corresponding to the initial compressed test response for one or more applied test patterns. In some implementations, the order in which the scan cell candidates are evaluated using the search tree is prioritized. For example, the order can be at least partially dependent on any one or more of the following: (1) whether the respective scan cell candidates were previously determined to be failing scan cells; (2) whether the respective scan cell candidates are in a scan chain having one or more scan cells that were previously determined to be failing scan cells; (3) the number of error bits in the error signature that are determined in part by scan cells output during the same time period as the respective scan cell candidates; (4) whether the error signature received matches a generic error pattern indicative of two or more errors masking one another in the compactor; (5) weights assigned to the scan cell candidates (wherein the weights correspond to a likelihood that a respective scan cell candidate is at least a part of a solution group of one or more failing scan cells). In certain implementations, at least a first and a second error signature are received (the second error signature is different than the first). In these implementations, a determination can be made as to whether one or more failing scan cells determined to explain the error bits in the first error signature also explain error bits of the second error signature. For any embodiment, a list of the failing scan cells can be stored and used to locate a defect in the circuit-under-test.

In another of the exemplary methods disclosed, an error signature comprising multiple bits is received. In this embodiment, the bits of the error signature correspond to bits of a compressed test response produced by a compactor in the circuit-under-test. The bits of the error signature further comprise one or more error bits that indicate errors at corresponding bit locations of the compressed test response. At least one error bit of the error signature is selected, and at least one scan cell candidate is selected from a set of scan cells known to contribute to the bit of the compressed test response corresponding to the selected error bit. A determination is made as to whether the selected scan cell candidate explains the selected error bit by updating the error signature to include the contribution of the selected error bit. In some embodiments, if the selected scan cell candidate does not explain the selected error bit in the error signature, the updated error signature is used as the error signature and the method is iteratively repeated at least one time. In certain embodiments, a backtracking act is performed to an earlier iteration if no solution is found. Further, a backtracking act can also be performed if progress toward a solution does not meet a threshold after a predetermined number of scan cell candidates have been selected and determined not to explain the selected error bit. In certain implementations, the act of updating the error signature is performed by computing a bit-wise modulo-two sum of the error signature and an error print associated with the selected at least one scan cell candidate. Any embodiment of this exemplary method may further comprise diagnosing a defect in the circuit-under-test using one or more scan cells determined to explain the presence of the selected error bit.

In another of the exemplary methods disclosed, at least first and second error signatures are received. In this exemplary embodiment, each error signature comprises error bits that indicate the presence of one or more errors in one or more corresponding compressed test responses produced by a compactor on the circuit-under-test in response to at least one applied test pattern. Further, the first error signature comprises one or more unknown bits. A search tree is generated that identifies one or more sets of scan cells that explain the error bits in the first error signature. A determination is made as to whether any of the identified sets of scan cells also explain the error bits of the second signature. In certain implementations, the first signature and the second signature correspond to the response of the circuit-under-test to a single applied test pattern. Further, the first signature and the second signature can be respectively generated from consecutively applied test patterns. Additionally, a variety of different compactors can be used to generate the compressed test responses. For example, in some embodiments, a feedback-free compactor produces the compressed test responses. In certain embodiments, the act of generating the search tree comprises selecting at least one of the error bits of the first error signature, selecting a scan cell candidate from a set of scan cells known to contribute to at least one bit of the compressed test response corresponding to the selected error bit, and determining whether the scan cell candidate explains the selected error bit in the error signature by updating the error signature to include the contribution of the selected error bit. Any embodiment of the exemplary method can further comprise storing a list of identified scan cells that explain the error bits in the first and second error signatures.

In another of the exemplary methods disclosed, one or more signatures are received that indicate the presence of one or more errors in one or more corresponding compressed test responses resulting from the application of at least one test pattern applied to a circuit-under-test. Scan cells in the circuit-under-test that caused the errors in the one or more compressed test responses are identified by analyzing the one or more signatures. In this exemplary method, the analysis includes selecting a scan cell candidate that potentially caused an error in a compressed test response based at least partially on a weight value associated with the scan cell candidate. The weight value of this embodiment is indicative of the likelihood that the scan cell candidate caused the error in the compressed test response. A list of the identified scan cells in the circuit-under-test that caused the errors can be stored. In certain embodiments, the weight values associated with scan cell candidates are updated based on results from one or more previously analyzed signatures. In some implementations, each respective signature is associated with a compressed test response output from a feedback-free compactor. Further, each respective signature can be associated with a compressed test response indicative of the response of the circuit-under-test to a single test pattern. In some embodiments, the signature analysis comprises selecting a branch of a search tree and performing a branch-and-bound search procedure along the selected branch. Further, the act of analyzing can also comprise the act of terminating the branch-and-bound search procedure along the selected branch after a predetermined number of scan cells have been considered along the selected branch. In some embodiments, the scan cells from which the scan cell candidate is selected during signature analysis is limited to scan cells in one or more selected scan chains of the circuit-under-test. For example, the one or more selected scan chains can be fewer than all scan chains of the circuit-under-test. In certain embodiments, respective weight values are computed during signature analysis for other possible scan cell candidates. At least some of the other possible scan cell candidates can be removed from scan cell candidate consideration based at least in part on their respective weight values. Any of the exemplary methods can further include diagnosing a defect using the list of the scan cells in the circuit-under-test that caused the errors.

In another of the exemplary methods disclosed, one or more failing scan cells of a circuit-under-test are identified from signatures indicative of one or more errors in corresponding compressed test responses received from a feedback-free compactor (which is coupled to the circuit-under-test). In this embodiment, one or more scan cell candidates are selected from a set of scan cell candidates. Further, information about one or more previously identified failing scan cells at least partially determines which of the one or more scan cell candidates are selected. A determination is made as to whether the selected scan cell candidates justify the one or more errors in a respective signature. The scan cell candidates determined to justify the one or more errors in the respective signature are stored in a solution set of one or more failing scan cells associated with the respective signature. Further, the set of scan cell candidates can be enlarged or reduced based at least partially on the information about previously identified failing scan cells. In some implementations, the information about previously identified failing scan cells comprises an identification of the failing scan cells, a scan chain location of the failing scan cells, or both. A branch-and-bound search procedure can be used in some implementations to identify the failing scan cells. For any embodiment of the exemplary method, a physical defect in the circuit-under-test can be identified that contributes to the one or more failing scan cells.

According to another of the exemplary methods disclosed, a value in a compressed test response is identified that indicates that an error was captured in at least one scan cell of a circuit-under-test upon application of a test pattern. A scan cell candidate is selected from a set of scan cells known to affect the value. For example, the selection can be based at least partially on at least one of the following criteria: (a) whether the scan cell candidate is known to have captured errors upon application of other test patterns; (b) whether the scan cell candidate is located in a scan chain known to have captured errors upon application of other test patterns; or (c) the number of error bits in the error signature that are determined in part by scan cells output during the same time period as the scan cell candidate. A determination can be made as to whether the scan cell candidate at least partially explains the error in the compressed test response. The scan-cell-candidate selection can be additionally based on whether an error signature corresponding to the compressed test response at least partially matches a generic error pattern indicative of two or more errors masking one another in a compactor. In certain implementations, the compressed test response is provided by a feedback-free compactor and/or by a finite memory compactor. In any implementation of the exemplary embodiment, a list of scan cells that explain errors in compressed test responses can be stored and one or more defects in the circuit-under-test diagnosed from the stored list of scan cells.

In another disclosed embodiment, a compactor for compacting test responses in a circuit-under-test is provided. In this embodiment, the compactor includes an injector network comprising combinational logic. The injector network of this exemplary embodiment further comprises injector-network outputs and injector-network inputs. At least some of the injector-network inputs are logically coupled to two or more injector-network outputs according to respective injector polynomials. The compactor of this exemplary embodiment further comprises a selection circuit that includes selection-circuit outputs coupled to the injector-network inputs and selection-circuit inputs coupled to scan-chain outputs of the circuit-under-test. The selection circuit of this embodiment is configured to selectively route signals from the scan-chain outputs to the injector-network inputs according to one of plural different input configurations. Further, in certain exemplary implementations, the selection circuit is configured to alternate input configurations in response to a control signal. For example, in selected implementations, only two input configurations are possible, and the control signal comprises a single-bit control signal. In some embodiments, the scan-chain outputs of the circuit-under-test are clocked out at a first rate and the selection circuit is configured to alternate input configurations at a rate faster than the first rate at which the scan-chain outputs are clocked. Further, in certain implementations of the compactor, a plurality of memory elements are coupled to the injector-network outputs. In these implementations, the respective injector polynomials can be selected to prevent masking of an unknown value in the memory elements. In some embodiments, the plurality of memory elements comprise a first register and the circuit further comprises a second register that is also coupled to the injector-network outputs. Further, in these embodiments, the first and the second registers are coupled to the injector-network outputs via one or more demultiplexers. The demultiplexers, for example, can be configured to selectively route values from the injector-network outputs to one of the first register or the second register in response to a control signal. The selection circuit can also be configured to alternate input configurations in response to the same control signal as the demultiplexers.

In another disclosed embodiment, a circuit is provided that includes a circuit-under-test that is part of the circuit. The circuit-under-test of this embodiment comprises scan chains. This circuit embodiment further includes a compactor circuit coupled to the scan chains and configured to receive a test response output from the scan chains. The compactor circuit of this exemplary embodiment is operable to generate two or more compressed test responses from the test response. The two or more compressed test responses are generated, for example, according to different compaction functions. The compactor circuit of this circuit embodiment also comprises at least one memory element. In some implementations, the compactor circuit further comprises an injector network of XOR or XNOR gates. Further, the memory element of the compactor circuit can be part of one or more registers coupled to the outputs of the injector network. In some implementations of this circuit embodiment, the compactor circuit comprises a single injector network that is operable to generate the two or more compressed test responses. In these implementations, the compactor circuit can further comprise one or more switches coupled between outputs of the scan chains and inputs of the single injector network. For example, the one or more switches can be configured to selectively couple outputs of the scan chains to the inputs of the single injector network according to two or more different input configurations. In some implementations of the circuit, the compactor circuit is feedback-free.

In another disclosed embodiment, a method of synthesizing a compactor is provided. According to this embodiment, one or more polynomials representing possible injector networks for coupling a plurality of memory elements in the compactor to respective scan-chain outputs are generated. Further, the polynomials are generated so that the number of memory elements between connections to the respective scan-chain outputs in a register of the compactor is greater than a minimum value and less than a maximum value. In certain embodiments, the minimum value is greater than one and the maximum value is less than the total number of memory elements in the register. One of the polynomials for a respective scan-chain output can be selected based at least in part on the number of scan-chain outputs to which the memory elements associated with the selected polynomial are already assigned. The selection can be performed, for example, so that the memory elements of the compactor are each coupled to approximately the same number of scan-chain outputs. Further, the polynomial selected can be a first polynomial, and the exemplary method can further include selecting a second polynomial for another respective scan-chain output, wherein the second polynomial is a nonshifted version of the first polynomial.

Any of the disclosed methods may be implemented in computer-readable media comprising computer-executable instructions for causing a computer to perform the method. Further, computer-readable media storing results from any of the described methods are also disclosed. Any of the disclosed methods may be performed during production testing of a circuit-under-test. Circuits having faults identified in part using any of the disclosed methods are also within the scope of this disclosure. Further, with respect to the hardware embodiments described herein, computer-readable media storing computer-executable instructions for causing a computer to design such embodiments or storing design data for implementing or simulating such embodiments are also disclosed.

The foregoing and additional features and advantages of the disclosed embodiments will become more apparent from the following detailed description, which proceeds with reference to the following drawings.

BRIEF DESCRIPTION OF THE DRAWINGS

FIG. 4B shows a first exemplary matrix representation of the compactor in FIG. 4A.

FIG. 4C shows a second exemplary matrix representation of the compactor in FIG. 4A.

FIG. 20 is a flowchart of an exemplary general method for performing fault diagnosing using a search-tree-based technique.

DETAILED DESCRIPTION

General Considerations

Figure 1:
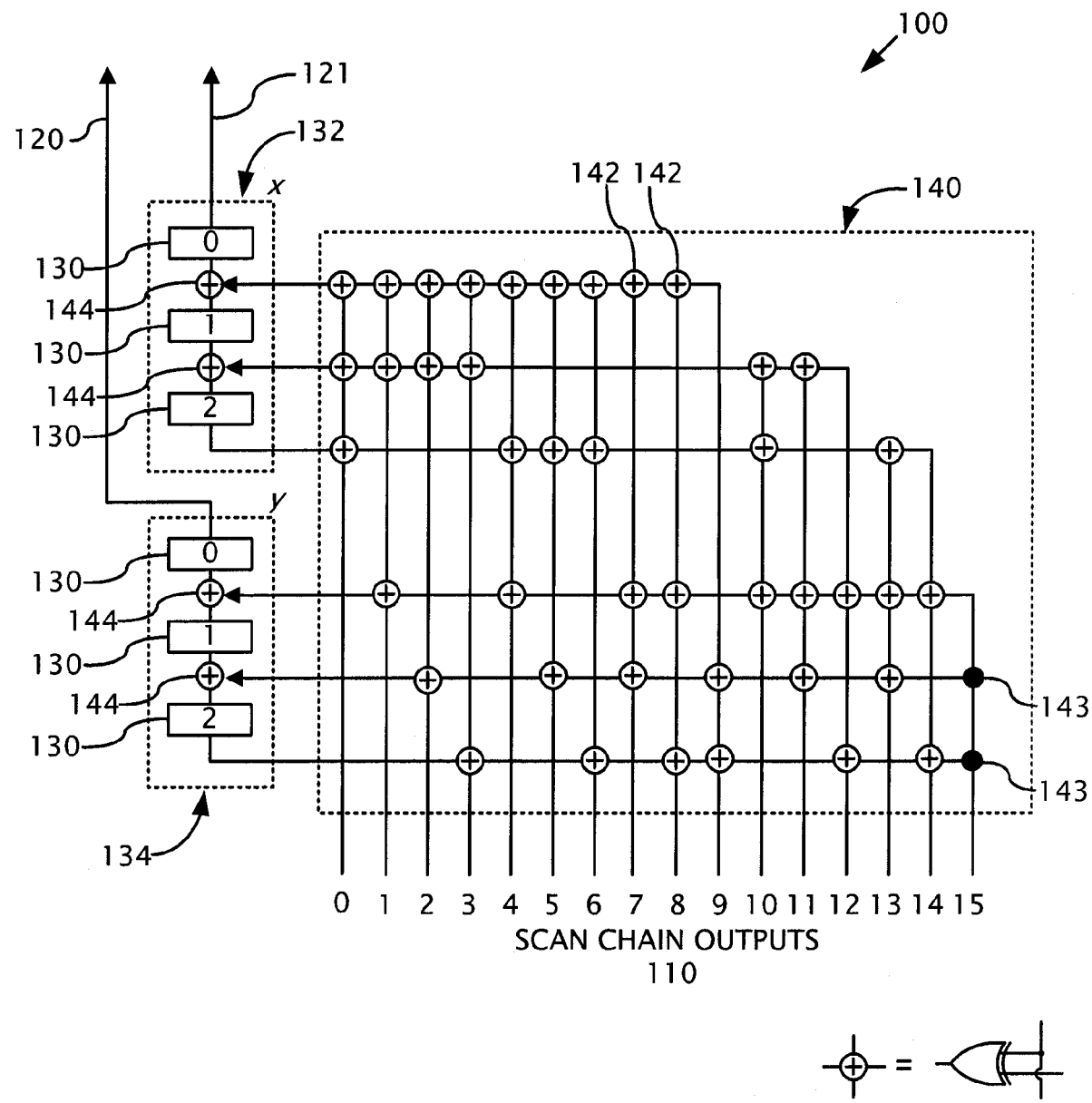
FIG. 1 is a block diagram illustrating a first exemplary embodiment of a convolutional compactor.

Disclosed below are representative embodiments of methods, apparatus, and systems for performing or enhancing fault diagnosis that should not be construed as limiting in any way. Instead, the present disclosure is directed toward all novel and nonobvious features and aspects of the various disclosed methods, apparatus, and systems, alone and in various combinations and subcombinations with one another. The disclosed technology is not limited to any specific aspect or feature described, or combination thereof, nor do the disclosed methods, apparatus, and systems require that any one or more specific advantages be present or problems be solved. Moreover, any of the methods, apparatus, and systems described herein can be used in connection with a wide variety of scan-based or partially-scan-based circuits that utilize embedded compression hardware.

Although the operations of some of the disclosed methods are described in a particular, sequential order for convenient presentation, it should be understood that this manner of description encompasses rearrangement, unless a particular ordering is required by specific language set forth below. For example, operations described sequentially may be rearranged or performed concurrently. Moreover, for the sake of simplicity, the attached figures may not show the various ways in which the disclosed methods, apparatus, and systems can be used in conjunction with other methods, apparatus, and systems. Additionally, the description sometimes uses terms like "determine" and "identify" to describe the disclosed technology. These terms are high-level abstractions of the actual operations that are performed. The actual operations that correspond to these terms will vary depending on the particular implementation and are readily discernible by one of ordinary skill in the art.

The disclosed embodiments can be implemented in a wide variety of environments. For example, any of the disclosed techniques can be implemented in software comprising computer-executable instructions stored on tangible computer-readable media (e.g., one or more CDs, volatile memory components (such as DRAM or SRAM), or nonvolatile memory components (such as hard drives)). Such software may comprise, for example, electronic design automation (EDA) software used to diagnose test responses captured and compressed during production testing of one or more integrated circuits (e.g., application specific integrated circuits (ASICs), programmable logic devices (PLDs) such as field-programmable gate arrays (FPGAs), or a systems-on-a-chip (SoCs), any of which can have digital, analog, or mixed-signal components thereon). This particular software implementation should not be construed as limiting in any way, however, as the principles disclosed herein are generally applicable to other software tools. Circuit faults that are detected in part using the disclosed techniques may in some circumstances be repaired.

Such software can be executed on a single computer or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For the same reason, computer hardware for executing the software implementations is not described in further detail. Any of the disclosed methods can alternatively be implemented (partially or completely) in hardware (e.g., an ASIC, PLD, or SoC).

Further, diagnostic results produced from any of the disclosed methods can be created, updated, or stored on tangible computer-readable media, volatile memory components, or nonvolatile memory components using a variety of different data structures or formats. For example, a list comprising failing scan cells identified by the application of any of the disclosed embodiments may be stored on such computer readable-media. Such diagnostic results can be created or updated at a local computer or over a network (e.g., by a server computer).

The disclosed embodiments are often described as being applied to compressed test responses obtained from so-called "convolutional compactors," which are described in U.S. Published Patent Application No. 2004/0230884. U.S. Published Patent Application No. 2004/0230884 is considered to be part of the present disclosure and is hereby incorporated by reference. The disclosed technology, however, is not limited to this application and can be generally applied to compressed test results obtained from any source, such as other forms of embedded compression hardware. For example, the compressed test responses analyzed by any of the described embodiments can be produced by other feedback-free compactors, finite memory compactors, or spatial compactors.

The Convolutional Compactor

FIG. 1 shows an example of a convolutional compactor 100. Because errors that are input into the compactor 100 can be clocked completely out of the compactor after a finite period of clock cycles and before an entire signature is output, the convolutional compactor is sometimes referred to as a type of "finite memory compactor" or a type of "feedback-free compactor." The exemplary compactor 100 comprises sixteen compactor inputs (which are coupled to sixteen scan-chain outputs 110 listed numerically from "0" to "15" in FIG. 1), two compactor outputs 120, 121, and six memory elements 130 (e.g., flip-flops). The six memory elements 130 are divided in this example between the compactor outputs 120, 121 so that each compactor output in this example is respectively coupled to one of two registers 132, 134, each comprising three memory elements 130. Register 132 is also referred to herein as "register x," whereas register 134 is referred to as "register y." Further, the memory elements 130 within each register 132, 134 are sometimes referred to in terms of their position in the registers, which corresponds to a bit position in the signature (or compressed test response) that is output from the compactor 100. For example, as shown in FIG. 1, the memory elements 130 can be referred to as storing bits "0," "1," or "2" within the respective registers 132, 134. The exemplary compactor 100 further includes an injector network 140 comprising gates 142 and nodes 143 (both of which are sometimes referred to as "taps") that couple the scan-chain outputs 110 to various combinations of the memory elements 130. For clarity, FIG. 1 only expressly highlights two gates 142 and two nodes 143, though it should be understood that multiple additional gates and nodes are shown in the figures. (This convention of referencing features in the figures will be used throughout the disclosure.) In the illustrated embodiment, the gates 142 comprise XOR gates and are arranged such that each scan-chain output 110 is coupled to three memory elements 130. For instance, the output of the scan chain 7 is coupled to bit 0 of register x and bits 0 and 1 of register y of the compactor. Additional gates 144 are interspersed between the memory elements 130 such that the values from the injector network are combined with values being shifted through the registers 132, 134. Each combination of gates 142 and nodes 143 used to inject the value of a scan-chain output 110 into the memory elements 130 can also be referred to as an injector network for that individual scan-chain output. Thus, the illustrated compactor can be viewed as comprising sixteen individual injector networks connected to the registers 132, 134. Though the disclosed embodiments are described as comprising injector networks of XOR gates, the gates may alternatively comprise XNOR gates or other suitable logic gates. Moreover, U.S. Published Patent Application No. 2004/0230884 discusses additional and alternative features and aspects of various embodiments of the exemplary convolutional compactor.

In general, a convolutional compactor can support an arbitrary compaction rate and provide any number of outputs, including just a single output. The total number M of memory elements, the size m of each register, and the injector polynomials indicating how the scan chains are connected to the memory elements determine some of the performance characteristics of a convolutional compactor, including its ability to handle unknown states. For purposes of this disclosure, the injector networks coupling the scan-chain outputs 110 to the memory elements 130 can be described by polynomials of the form: $x^a+y^b+z^c$, where x, y, and z refer to the registers to which the gates or nodes of the injector network are coupled and the powers of the polynomial refer to the memory element within each respective register to which the gate or node of the injector network is coupled. For example, the injector network coupled to scan-chain output 1 in FIG. 1 can be said to employ an injector polynomial $P_1=y^0+x^1+x^0$, while scan-chain output 14 is connected through injector polynomial $P_{14}=y^2+y^9+x^2$. Note that a shifted version of $P_1$, (e.g., $y^1+x^2+x^1$) is desirably not used because errors injected in two consecutive time frames through such polynomials would cancel (or mask) each other.

Design Considerations in Synthesizing the Convolutional Compactor

Typically, there are several alternative eligible injector polynomials that can be used to couple the scan-chain outputs to the memory elements of the compactor. These polynomials can be generated and selected according to a variety of methods. For example, according to one exemplary method, groups of polynomials are generated wherein each polynomial in a group corresponds to an injector arrangement with shifted taps along the compactor memory elements (that is, the polynomials in the group comprise shifted versions of one another with each tap remaining connected to the same register). In one desirable embodiment of this method, only a single polynomial from each group is selected for use in the compactor, thus preventing the possibility of 2-error masking. Further, the polynomial can be chosen randomly, as it has been observed that random polynomial selection helps balance the injector network and reduce the possibility of masking caused by even-numbered errors greater than two.

Figure 2:
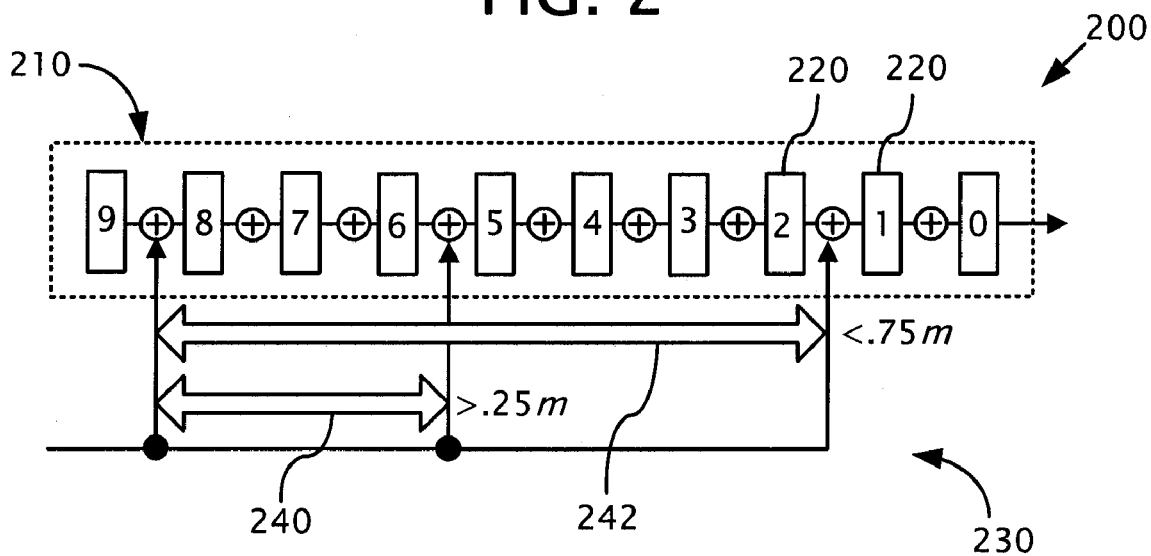
FIG. 2 is a block diagram illustrating an embodiment of a balanced injector network as can be used in the convolutional compactor of FIG. 1

The balance of the overall injector network in a compactor can be further improved by using polynomials that have a minimum and/or maximum span between their taps. By providing a minimum span between polynomial taps, the resulting injector networks can more efficiently handle burst errors injected from adjacent scan cells. FIG. 2 is a block diagram 200 illustrating a polynomial and corresponding injector network having a minimum and maximum span. In FIG. 2, a register 210 comprising multiple memory elements 220 is shown. The representative injector network 230 in FIG. 2 is defined by a corresponding polynomial having three taps (here, $x^1 + x^5 + x^8$). Assuming that the number of memory elements in the register 210 is m, the polynomial corresponding to the injector network 230 can be generated such that the spans 240, 242 between the memory elements connected by the taps are greater than a selected (or predetermined) minimum and/or less than a selected (or predetermined) maximum. For example, in the illustrated embodiment, the minimum span is selected as 0.25 m and the maximum span is 0.75 m. Thus, span 240 represents a minimum allowed span (as it spans three memory elements, or 0.3 m) and span 242 represents a maximum allowed span (as it spans seven memory elements, or 0.7 m). The actual value of the minimum and maximum allowed span can vary from implementation to implementation and depends on the desired amount of balance in the injector network 230. Further, certain embodiments utilize only a maximum span, only a minimum span, or neither during polynomial generation. In the experiments discussed later in this disclosure, the minimum separation between two consecutive taps (connected to the same register) was chosen to be 0.25 m, while the maximum separation between the taps of the same polynomial was 0.75 m.

To further improve the balance of the injector network in a compactor, the polynomials used to implement the compactor can be selected so that the memory elements in the compactor are coupled to the same or approximately the same number of scan-chain outputs. This can be accomplished, for instance, by employing a stage fan-in histogram to guide the compactor synthesis process. According to one particular implementation, for example, each entry of the histogram corresponds to a memory element in the compactor and indicates the number of scan chains to which the memory element is currently coupled. In order to connect a new injector polynomial in this implementation, all possible candidate locations can be evaluated by computing a cost function equal to the sum of the current histogram entries corresponding to the taps of the candidate polynomials. The candidate polynomial with the smallest cost can be selected, and all relevant histogram entries updated. As a result of this polynomial-selection process, the memory elements of the compactor will be driven by the same or approximately the same number of injector polynomial taps.

Because the exemplary convolutional compactor comprises a linear circuit, its behavior can be analyzed based on the "error test responses" it receives from the scan-chain outputs and the "error signatures" it produces. In the exemplary embodiments discussed in this disclosure, an error test response E is defined as $E = R_{ff} + R_f$, where $R_{ff}$ and $R_f$ are respective fault-free and faulty test responses before compression and "+" denotes the bit-wise XOR operation (which is equivalent to a bit-wise modulo-two sum). Similarly, an error signature S is defined as $S = S_{ff} + S_f$, where $S_{ff}$ and $S_f$ are respective fault-free and faulty signatures. In other embodiments, an XNOR or other suitable operation can be used to compute error test responses and error signatures. As used herein, the term "signature" refers to the bits produced by a compactor, which represent the compressed version of a CUT's test response to a particular test pattern. Therefore, a signature is sometimes referred to as a compressed test response. An error signature, then, refers to a modified form of the signature used in determining the presence and location of any errors in the signature. For example, because of the XOR operation in the exemplary form of error signature S described above, an error signature S comprising all "0"s indicates that no fault was detected in the test response, whereas an error signature S comprising one or more "1"s is indicative of the presence of a fault. Further, the j-th scan cell located in the i-th scan chain may produce an "error print" in the signature of the following form: $x^{a+j} + y^{b+j} + z^{c+j}$, where $P_i = x^a + y^b + z^c$ is the injector polynomial associated with scan chain i.

In a typical convolutional compactor, the same error signatures can be caused by different error prints. When multiple errors are injected into a compactor, for example, the error signals can interact with each other in the registers and memory elements of the compactor. Consequently, certain error signals can be masked, leading to ambiguity in the identification of the scan cells that captured the errors. Even if no error masking occurs, multiple different error prints may exist that explain a particular recorded signature. Therefore, one possible aspect of synthesizing the convolutional compactor is the selection of its size M (the total number of memory elements), as this number impacts the diagnostic resolution. In most cases, the issue of having indistinguishable solutions can be avoided by employing a sufficiently large compactor. This aspect of convolutional compactors is illustrated in Tables 1 and 2 below.

TABLE 1

Average Error Masking for 370 Faulty Chips

| d | M | | | | | | |
|---|---|---|---|---|---|---|---|
| | 48 | 64 | 96 | 128 | 160 | 192 | 256 |
| 8 | 2.47 | 2.58 | 2.67 | 2.78 | 2.83 | 2.82 | 2.84 |
| 16 | — | 2.66 | 2.75 | 2.82 | 2.84 | 2.85 | 2.89 |
| 24 | — | — | 2.81 | 2.84 | 2.85 | 2.87 | 2.91 |
| 32 | — | — | — | 2.85 | 2.87 | 2.89 | 2.91 |
| 40 | — | — | — | 2.86 | 2.89 | 2.90 | 2.91 |
| 48 | — | — | — | — | 2.87 | 2.89 | 2.91 |
| 56 | — | — | — | — | — | 2.88 | 2.92 |

Table 1 summarizes the results of an analysis of fail log information collected during production scan testing of an industrial design. In the analysis, simulation of the actual failing responses was carried out using M-bit single-output convolutional compactors coupled to 100 scan chains, each 1050 bits long. Each entry in the table was then obtained by dividing the total number of erroneous signals occurring in signatures by the total number of failing scan cells producing these signatures. Note that no masking would give the value of 3.0, since polynomials with a fan-out of three were employed. As can be seen, increasing both the size M of the compactor and the separation d between polynomial taps resulted in diminished error masking.

A more detailed breakdown of a mapping between failing scan cells (for the same experimental data) and the corresponding erroneous signals is given in Table 2.

TABLE 2

| | Mapping of Scan Errors to Signatures (%) | | | | | | | |
|---|---|---|---|---|---|---|---|---|
| | M = 64 | | | | M = 128 | | | |
| F | 0 | 1 | 2 | 3 | 0 | 1 | 2 | 3 |
| 1 | 0 | 0 | 0 | 100 | 0 | 0 | 0 | 100 |
| 2 | 0 | 0 | 2.19 | 97.81 | 0 | 0 | .94 | 99.06 |
| 3 | 0 | 0 | 3.53 | 96.47 | 0 | 0 | 4.51 | 95.49 |
| 4 | 0 | .3 | 5.85 | 93.84 | 0 | .12 | 3.90 | 95.98 |
| 5 | 0 | .61 | 8.24 | 91.15 | 0 | .30 | 5.09 | 94.61 |
| 6 | .08 | .89 | 12.25 | 86.78 | 0 | .23 | 6.36 | 93.41 |
| 7 | .03 | 2.51 | 16.48 | 80.98 | 0 | .49 | 10.94 | 88.57 |
| 8 | .17 | 3.19 | 21.03 | 75.60 | .04 | .52 | 14.53 | 84.91 |
| 9 | .05 | 3.99 | 23.69 | 72.27 | .05 | 1.46 | 16.52 | 81.97 |
| 10 | .25 | 6.15 | 28.55 | 65.05 | 0 | 1.30 | 19.40 | 79.30 |

In Table 2, the total number of cases in which a given number F of scan cells capturing errors is further divided into scenarios that produced zero, one, two, and three "1"s in the resulting error signatures. The results are presented for two single-output compactors (M=64 and 128) with a compression ratio of 128×. As can be seen, the error signatures produced by the larger compactor have more error bits than those produced by the smaller compactor.

Figure 3:
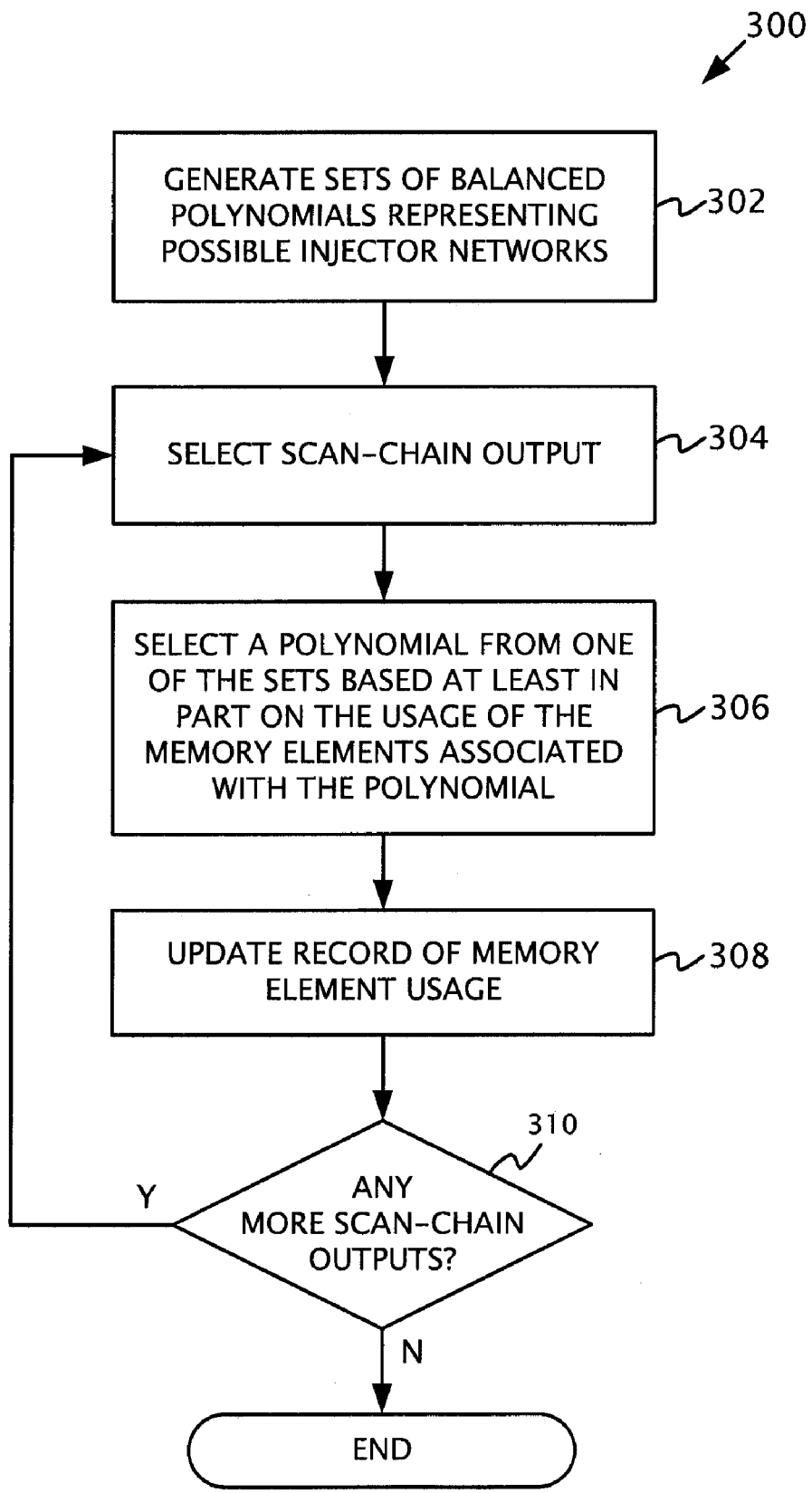
FIG. 3 is a flowchart of an exemplary method for synthesizing a compactor (such as the convolutional compactor of FIG. 1) using balanced injector networks.

FIG. 3 is a flowchart showing an exemplary technique 300 for synthesizing a convolutional compactor utilizing the above-described techniques and considerations. In particular, FIG. 3 shows one exemplary method for selecting polynomials for injector networks to be used in a compactor embodiment. Although the method is described in the context of synthesizing a convolutional compactor, it can be more generally applied to any compactor for which balanced injector networks are desirable (e.g., other finite memory or spatial compactors). For purposes of this discussion, the compactor is assumed to have a large number of memory elements in comparison to the number of scan-chain outputs. For example, the number of memory elements can be chosen such that a maximum span of 0.75 m is allowed for all injector networks. On account of the number of memory elements, a variety of valid polynomials will exist for each scan-chain output.

At process block 302, sets of candidate polynomials are generated, wherein each set comprises polynomials that could potentially mask each other (e.g., shifted versions of one another). Further, according to the illustrated embodiment, the candidate polynomials are balanced polynomials. The polynomials can be balanced, for example, by setting a minimum span between taps connected to the same register to be greater than one memory element, and similarly setting a maximum span to be less than the longest possible span for a given register. For instance, in one particular implementation, a minimum separation between two consecutive taps (connected to the same register) is set as 0.25 m, and a maximum span is set as 0.75 m. These exemplary values should not be construed as limiting in any way, however, as they may vary depending on the implementation or on the desired balance to be achieved in the compactor. Further, certain embodiments utilize only a maximum span, a minimum span, or neither.

At process block 304, the next scan-chain output to be coupled to the compactor is selected. At process block 306, an injector polynomial for the scan-chain output is selected from one of the sets. In the illustrated embodiment, this selection is based at least in part on the current usage of the memory elements associated with the polynomial. That is, the selection is made with consideration given to how many other injector networks are coupled to the memory elements associated with the selected polynomials. In general, the selection should be made so that polynomials coupling the scan-chain output to less-frequently-used memory elements are favored over polynomials coupling the scan-chain output to more-frequently-used memory elements. In one exemplary implementation, a stage fan-in histogram as described above is used to record and update memory element usage. After selection, the remaining polynomials in the set comprising shifted versions of the selected polynomial can be discarded from further consideration.

At process block 308, a record of the memory usage of the memory elements is updated. For example, the memory usage may be recorded in a histogram (as described above) or other appropriate database or data structure.

At process block 310, a determination is made as to whether there are any further scan-chain outputs for which injector networks are to be generated. If so, the next scan-chain output is selected at process block 304; otherwise, the process terminates.

Representing the Compactor for Fault-Diagnosis Purposes

Exemplary representations of a convolutional compactor that can be utilized in implementations of the disclosed embodiments are presented in this section. The disclosed representations may be implemented, for example, as one or more databases or data structures in software-based implementations of the disclosed embodiments. The exemplary representations should not be construed as limiting in any way, however, as other equivalent representations exist that are considered to be within the scope of the present disclosure. Moreover, the exemplary representations shown can be used to model compactors other than convolutional compactors. For example, the representations can be used to model other feedback-free compactors, finite memory compactors, spatial compactors, or time compactors.

For the sake of simplicity, it is assumed that the compactor being represented is a single-output compactor, though compactors with multiple outputs can be represented in a similar manner. For purposes of this discussion, let $S=M+L-1$ be the signature size, where M is the total number of memory elements in the compactor and L is the length of the longest scan chain in the circuit-under-test. Also let N represent the number of scan chains. A first exemplary representation is based on an S×N matrix, with the entry in row s and column n of the matrix comprising the set (or list) of the one or more scan cells driving bit s of the signature and located in scan chain n.

Figure 4A:
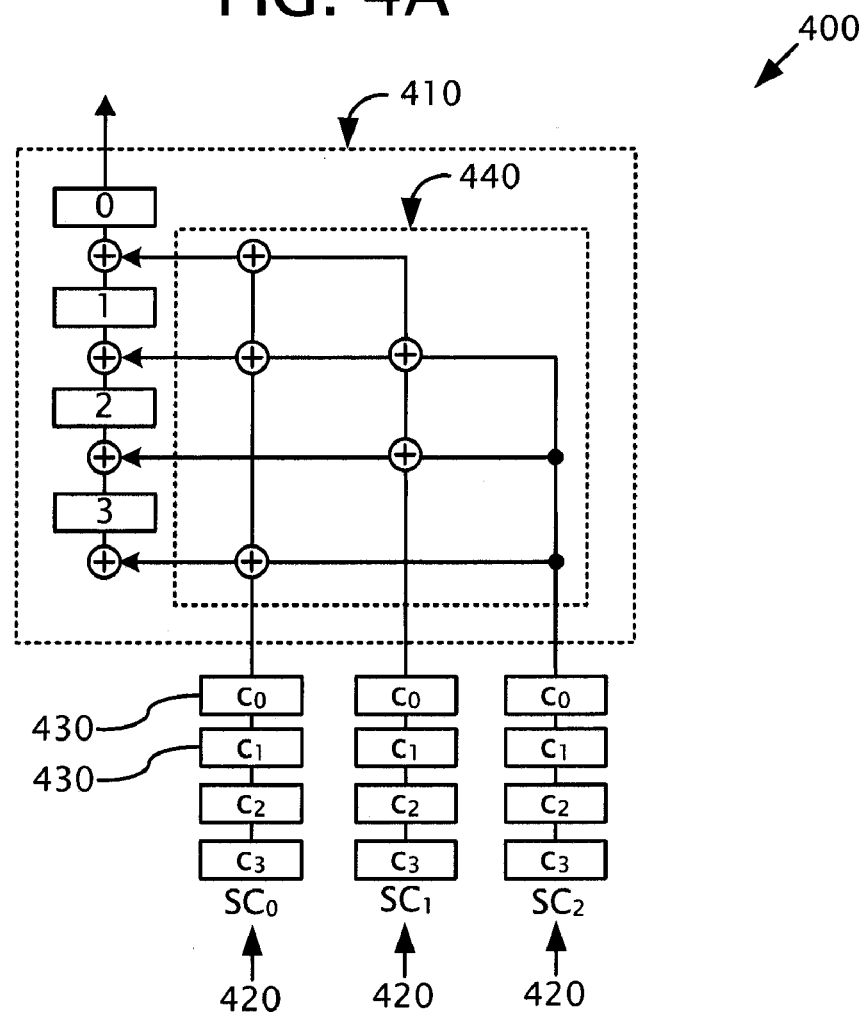
FIG. 4A is a block diagram illustrating a second exemplary embodiment of a convolutional compactor together with exemplary scan chains to which it is coupled.

To illustrate this exemplary representation, consider the compactor 410 shown in FIG. 4A. In particular, FIG. 4A is a block diagram 400 illustrating an exemplary 4-bit compactor 410 driven by three scan chains 420 (labeled "$SC_0$," "$SC_1$," and "$SC_2$," respectively). Each scan chain comprises four scan cells, some being number as 400, (labeled "$c_0$," "$c_1$," "$c_2$," and "$c_3$," respectively). An injector network 440 is also shown. The injector polynomials implementing the injector network and respectively associated with the scan chains 420 are: $x^3+x^1+x^0$ for $SC_0$, $x^2+x^1+x^0$ for $SC_1$, and $x^3+x^2+x^1$ for $SC_2$.

FIG. 4B shows a representation 450 of the compactor 410 according to this first matrix format. Rows $x_0$ through $x_6$ correspond to the bits of the resulting signature and columns $SC_0$ through $SC_2$ correspond to the scan chains coupled to the compactor. Each entry of the exemplary representation 450 indicates which scan cells in the corresponding scan chain at least partially affect or determine the value of the corresponding signature bit. Thus, by generating the representation 450, the set of scan cells in a scan chain contributing to a given signature bit can be easily determined. For this reason, this type of representation is sometimes referred to as the "signature-bit matrix." The order in which the scan cells appear in the entries of the matrix may depend on certain factors described below. Further, it is worth noting that, for the illustrated compactor 410, each entry in the representation 450 is comprised of at most three elements. For instance, the first scan cell $c_0$ located in $SC_2$ produces the following error print: $x^3+x^2+x^1$. The error prints produced by cells $c_1$ and $c_2$ of the same scan chain are shifted versions of this first error print and can be found by multiplying the error print by the respective position of the scan cells $c_1$ and $c_2$ within the scan chain. Thus, the error print for $c_1$ located in $SC_2$ is $x^1(x^3+x^2+x^1)=x^4+x^3+x^2$, and the error print for $c_2$ located $SC_2$ is $x^2(x^3+x^2+x^1)=x^5+x^4+x^3$. Accordingly, cells $c_0$, $c_1$ and $c_2$ of $SC_2$ all appear in the entry of the representation 450 associated with signature bit $x^3$ and $SC_2$. The same reasoning applies to cells from the remaining scan chains. As a result, bit $x^3$ can be modified by nine different scan cells in total. Further, for purposes of this disclosure, an entry in the representation 450 can be identified as (n, s), wherein n corresponds to the column of the representation and s corresponds to the row. Thus, the entry associated with $SC_2$ and signature bit $x^3$ can be identified as (2, 3).

Another representation 470 of the compactor 410 comprises an N×L matrix, where N is the scan chain number and L is the length of the longest scan chain, and wherein each entry corresponds to a particular scan cell in the scan chains. According to one exemplary embodiment, the content of each entry comprises a set (or list) of the signature bits that are affected by the respective scan cell. This exemplary representation is sometimes referred to herein as a "scan-chain matrix."

FIG. 4C shows a representation 470 of the compactor 410 according to this second matrix format. Rows $c_0$ through $C_4$ of the representation 470 correspond to the respective position of the scan cell in its scan chain, and columns $SC_0$ through $SC_2$ correspond to the scan chains of the compactor. Each entry of the exemplary representation 470 indicates the signature bits that are at least partially affected or determined by the value of the corresponding scan cell.

Moreover, in one exemplary form, the entries in the representation 470 include additional information. For example, the number of signature errors that are found to be caused by a scan cell can be recorded and continuously updated in a corresponding entry of the matrix. Additionally, a cell's status as being part of a currently considered solution may also be stored and updated as part of an entry within the matrix. As more fully explained below, this additional information can be used in certain embodiments of the diagnostic techniques described herein to increase the efficiency with which a solution is found.

Exemplary Techniques for Performing the Basic Diagnostic Search

In certain exemplary embodiments of the disclosed technology, a depth-first search procedure (for example, a depth-first branch and bound search procedure) is used as the basic technique for identifying scan cells that capture error values after application of a test pattern (the failing or failing scan cells) and cause a given error signature. In other embodiments, however, other types of branch and bound search procedures can be used (for example, a width-first procedure). As explained below, the basic search procedure can be modified in a variety of ways by one or more additional techniques, which can enable the search procedure to more quickly find the proper solution.

FIG. 20, for example, is a flowchart illustrating a general method for performing diagnostics using a search tree technique (for example, a depth- or width-first branch and bound procedure or combination thereof). The general technique shown in FIG. 20 can be implemented as part of any of the diagnostic methodologies described herein. At process block 2002, an error signature is received. The error signature can comprise, for example, multiple bits corresponding to bits of a compressed test response produced by a compactor in the circuit-under-test (for example, a feedback-free compactor or spatial compactor, such as a convolutional compactor). In this embodiment, the bits of the error signature further comprise one or more error bits that indicate errors at corresponding bit locations of the compressed test response.

The error signature of this embodiment (or any embodiment described herein) can further be the first error signature received that is associated with a circuit-under-test's response to a particular test pattern. Thus, for example, the error signature can be an error signature produced during production testing as part of a single test session (and not part of a specialized test session performed only after an error has been detected). For this reason, such an error signature is sometimes referred to as a "single-test-session error signature." Further, the error signature received in this or any other embodiment can correspond to a compressed test response produced by the associated compactor upon application of a single test pattern.

At process block 2004, a search tree is generated that evaluates multiple scan cell candidates and identifies one or more failing scan cells by determining whether one or more of the scan cell candidates explain the error bits in the error signature. For example, the search tree can be implemented at least in part by using any of the exemplary search procedures described herein (such as the search function (Table 3) or the select function (Table 10) described below). The search tree can be described as a dynamically generated search tree with vertices that represent the various candidate scan cells considered and the updated error signatures they yield. At the root of the search tree, for example, is the error signature S showing the presence of at least one error (e.g., containing at least one "1" within the error signature). From the root, the search tree can be dynamically generated by selecting a scan cell known to contribute to one of the error bits of the error signature. For example, according to one exemplary implementation, the search procedure begins with the rightmost error bit in the error signature. This particular selection process should not be construed as limiting in any way, however, as the search technique may alternatively begin with the leftmost error bit or some other error bit (e.g., through random selection). The exemplary search technique attempts to justify the selected error bit by selecting and evaluating one or more scan cells. This scan cell selection process can proceed, for example, by selecting a scan cell candidate from a set of scan cell candidates known to contribute to the error bit (e.g., using a matrix or data structure, such as the signature-bit matrix described above and illustrated in FIG. 4B). According to one implementation, the search technique evaluates all solution possibilities for a selected scan cell within the search tree before considering the next scan cell. In other embodiments, described in detail below, the solution space traversed by the search tree can be limited. In certain embodiments, when the search technique determines that a selected scan cell could not have produced the observed error, it returns (or backtracks) to the associated node in the tree and tries another scan cell. Conceptually, this implementation can be viewed as a form of a backtracking search. The order in which the scan cells known to contribute to an error bit are evaluated may vary from implementation to implementation. For example, in one implementation, scan cells are considered in the order in which they appear within a scan chain, which themselves are considered in the order in which they are coupled to the compactor. Alternatively, and as more fully described below, scan cell selection can be based on one or more weight values associated with the scan cells.

In FIG. 20, when the search tree has identified scan cells candidates that explain the error signature received, the scan cells can be termed "failing scan cells" and output at process block 2006. Thus, the term "failing scan cells" refers to those scan cells identified during diagnostics as having captured error values that produced the observed error signature. The failing scan cells identified can be stored in a list or other data structure comprising the results of the diagnostics, which may further include additional information relating to the test (for example, information about the test pattern associated with each set of failing scan cells identified).

Figure 5:
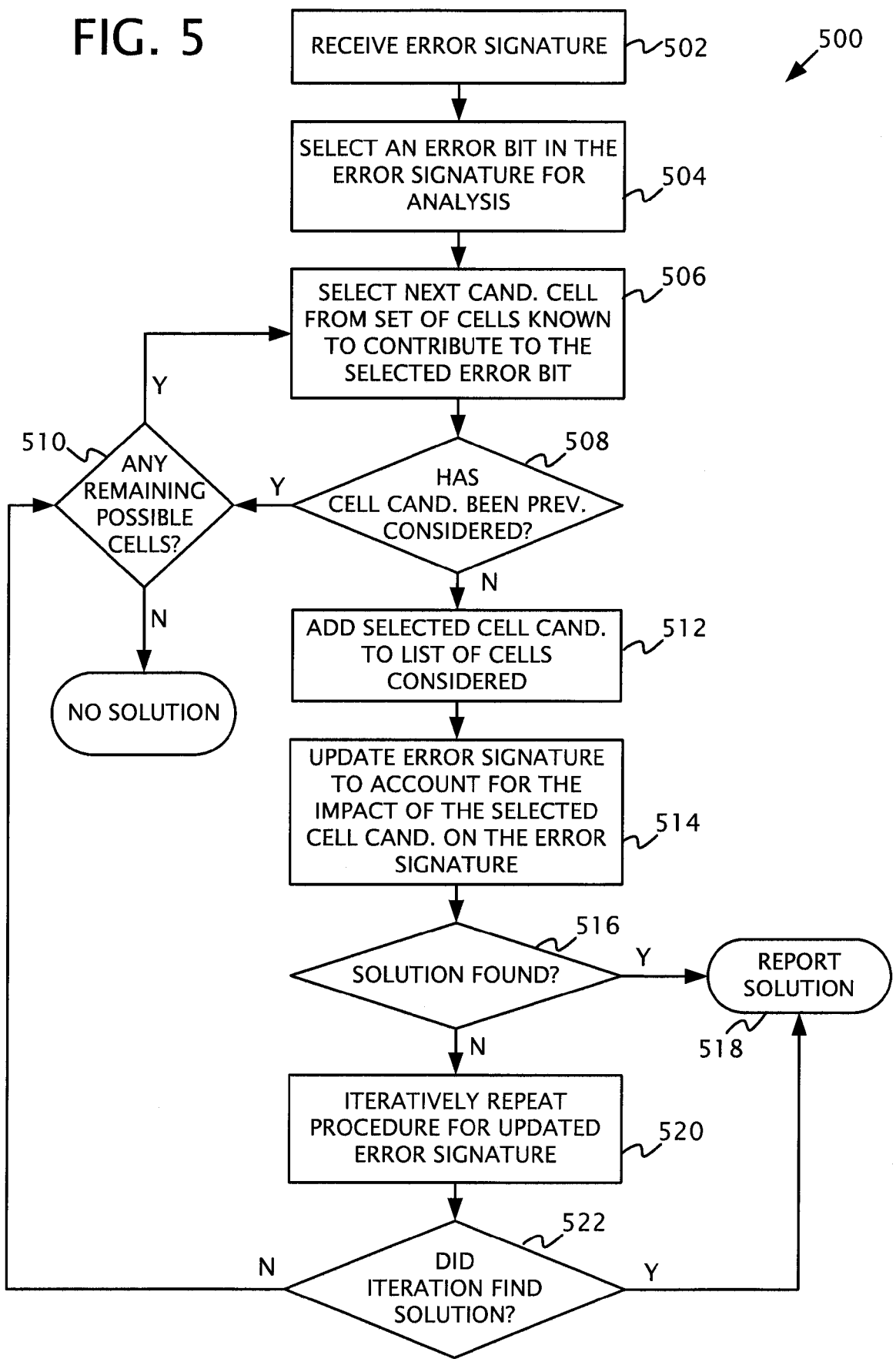
FIG. 5 is a flowchart of an exemplary search procedure for identifying one or more failing scan cells from an error signature as can be used in fault diagnosis.

FIG. 5 is a flowchart 500 of a more specific exemplary search technique as may be used in embodiments of the fault diagnosis technology described herein. The exemplary technique is described as being applied to an error signature produced from a single-output compactor, but can readily be modified for application to error signatures from compactors having different numbers of outputs. Further, it is assumed that a matrix or data structure (such as the signature-bit matrix shown in FIG. 4B) has been created and can be used to determine which scan cells contribute to the particular error bits in the error signature.

At process block 502, an error signature (such as an error signature S) is received. As more fully explained below, the error signature can be an error signature output from the compactor outputs, or an updated error signature resulting from an earlier iteration of the search technique 500. At process block 504, an error bit within the error signature is selected for analysis. According to one exemplary implementation, the rightmost error bit (or the first error bit output from the compactor) is selected. At process block 506, using information from a matrix or data structure such as shown in FIG. 4B, a scan cell candidate is selected from a set (or list) of scan cells known to contribute to the selected error bit. According to one implementation, the selection process is performed in numerical order from scan chain 0 to scan chain N, and in numerical order of the scan cells with each respective scan chain. In other embodiments, and as more fully explained below, the selection process can be guided by one or more weight values and may be limited to scan cells within certain scan chains. At process block 508, a determination is made as to whether the scan cell selected in process block 506 has been previously considered in the analysis. If so, then at process block 510, a determination is made as to whether any remaining possible scan cell candidates exist. If there are remaining possible scan cell candidates, then the method 500 continues again at process block 506; otherwise, all possible candidates have been considered and no solution exists. At process block 512, the selected scan cell is added to a list of scan cells considered. At process block 514, the error signature is updated. In one exemplary embodiment, this updating procedure comprises combining the error signature with the error print of the selected scan cell (e.g., using a bit-wise XOR operation). In this way, the error signature is updated to reflect or indicate the impact of the selected scan cell on the error signature. At process block 516, the updated error signature is evaluated to determine whether a solution has been found. For example, in one particular implementation, if the updated error signature comprises all "0"s, then a solution has been found. The solution comprises the one or more selected scan cells that resulted in the error signature being updated to include all "0"s (or no error bits). If a solution exists, it is reported at process block 518. Otherwise, the search procedure 500 is recursively iterated using the updated error signature from process block 514 as the error signature being received at process block 502. At process block 522, a determination is made as to whether the iteration of the search procedure found a solution. If so, the solution is reported at process block 518; otherwise, the next scan cell candidate is selected at process block 506 if there are remaining possible scan cell candidates as determined at process block 510.

An example of a specific, non-limiting implementation of the search technique shown in FIG. 5 is provided in the pseudocode shown in Tables 3 and 4 below. This particular implementation should not be construed as limiting in any way, however, as it may be varied in arrangement and detail without departing from the underlying principles of the disclosed technology. In the exemplary implementation, the basic search and backtracking technique is termed the "search" function and calls a separate "update" function that is used to update the error signatures with the error print of the current scan cell being evaluated. Further, the scan_chain matrix referred to in the pseudocode can be identical to the scan-chain matrix described above and illustrated in FIG. 4C.

TABLE 3

Pseudocode for an Exemplary "Search" Function

```
search ( ) {
    if (n__Ones == 0) return true
    done = false
    ptr = Signature [first__one]. drivers
    while (not done and ptr ≠ null){
        scan = ptr → scan
        cell = ptr → cell
        ptr = ptr → next
        if (not Scan__chains[scan][cell]. selected){
            used__cells = used__cells + 1
            Scan__chains[scan][cell]. selected = true
            update (scan, cell)
            if (search ( )) done = true
            else {
                used__cells = used__cells − 1
                Scan__chains[scan][cell]. selected = false
                update (scan, cell)
            }
        }
    }
    return done
}
```

TABLE 4

Pseudocode for an Exemplary "Update" Function

```
Update (scan, cell) {
    for tap = 1 to 3 {
        bit = Scan__chains[scan][cell].injectors[tap]
        Signature[bit] = Signature[bit] ⊕ 1
        if (Signature[bit] == 0){
            n__Ones = n__Ones − 1
            locate (first__one)
        }
        else {
            n__Ones = n__Ones + 1
            if (bit < first__one) first__one = bit
        }
    }
}
```

As with the search technique described above with respect to FIG. 5, the search function of Table 3 is desirably implemented recursively. When the search function is invoked at a level of the search tree beyond the root level, a number of scan cells have already been chosen, and the corresponding content of the error signature in this example comprises the bit-wise modulo-two sum of the original error signature with the "1"s provided through the injector polynomials associated with the selected cells (the error prints of the selected cells). For each updated error signature, the search function tries to select a new scan cell associated with the rightmost signature bit set to "1" from a set of scan cells known to contribute to the bits of the error signature (termed drivers in the exemplary pseudocode and obtained from a data structure or matrix such as the signature-bit matrix described above and illustrated in FIG. 4B). The error signature is updated with the error print from the selected scan cell in an attempt to resolve the error signature such that it becomes an "all-zero" (or error-free-indicating) vector. In the exemplary pseudocode, the auxiliary update function is called to update the error signature. The exemplary form of the update function also keeps track of the current number of "1"s (or other error-indicating bits) in the error signature in a variable termed n_Ones. Further, the exemplary update function determines the new location of the rightmost "1" in the signature.

In this exemplary implementation, if the search function does not succeed in finding a complete list of failing scan cells, the function cancels or ignores decisions made hitherto, thereby moving the error signature back to its previous status. The function then proceeds to try another scan cell as a possible candidate. If all driver cells for a particular error signature have been examined, the exemplary function backtracks by returning to its caller and begins repeating the search procedure for the next candidate scan cell at that level of recursion.

According to one exemplary implementation, the search function is performed with the n_Ones variable set to the actual number of "1"s in the received signature, and the first_one variable set to the location of the rightmost error bit in the error signature. According to one embodiment and as more fully explained below, when a solution is found, the scan_chains matrix can be updated so that the entries corresponding to the one or more scan cells in the solution indicate that the scan cells were found to capture an error. For example, an entry may be updated to indicate the number of times that the corresponding scan cell was found to be part of a solution.

Figure 6:
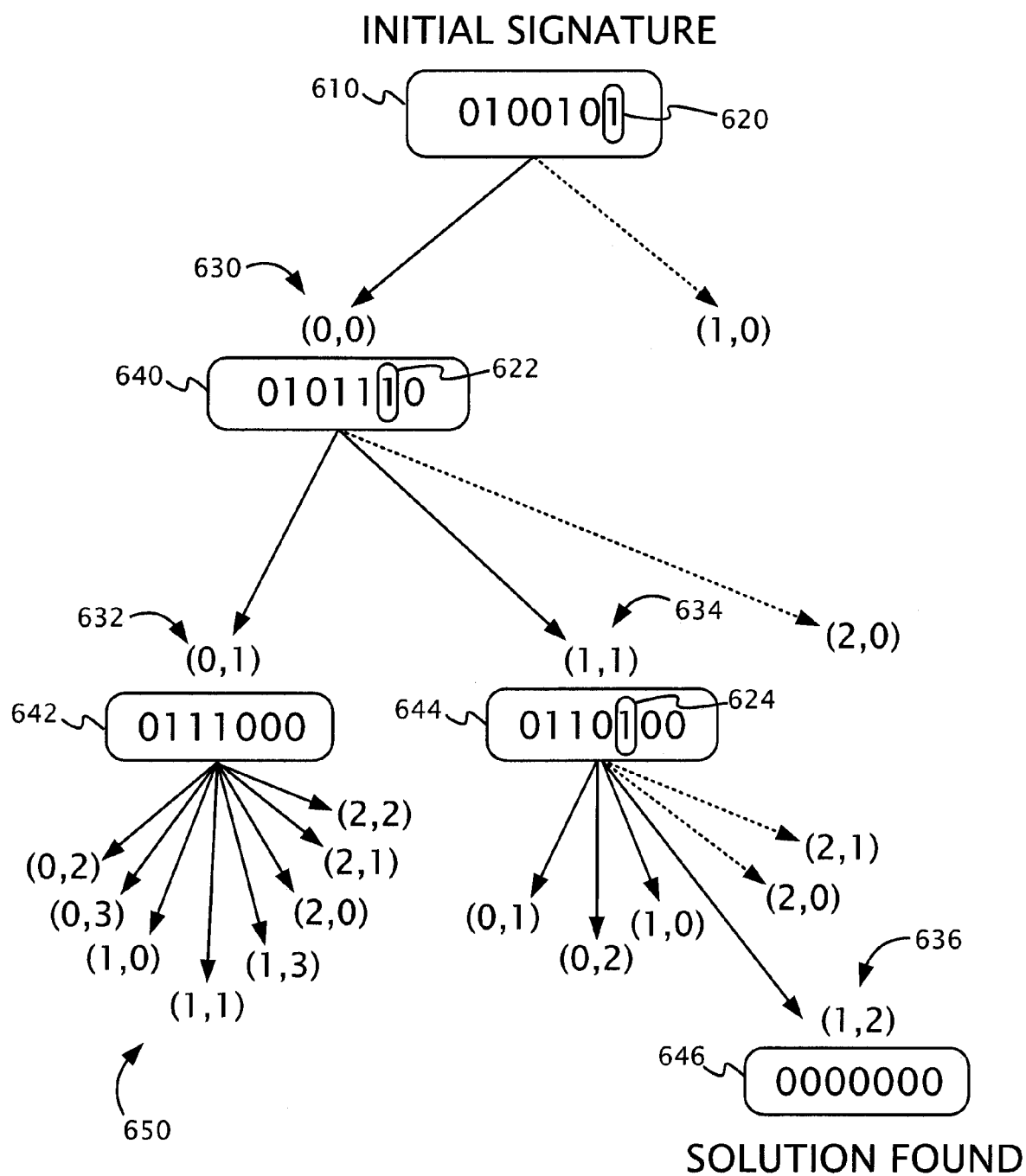
FIG. 6 is a block diagram illustrating how the search procedure of FIG. 5 proceeds.

FIG. 6 is a block diagram 600 conceptually illustrating the application of the exemplary search technique to an error signature produced by the convolutional compactor 410 illustrated in FIG. 4A. Assume for purposes of this example, that errors are captured in scan cells (0,0), (1,1), and (1,2) after application of a test pattern. The error prints associated with these scan cells are:

$$(0,0) = x^3 + x^1 + x^0,$$

$$(1,1) = x^4 + x^3 + x^1, \text{ and}$$

$$(1,2) = x^5 + x^4 + x^2. \tag{1}$$

The error signature produced by the compactor 410 and resulting from these three errors can be given by:

$$\begin{array}{r} x^3 + x^1 + x^0 \\ x^4 + x^3 + x^1 \\ \underline{x^5 + x^4 + x^2} \\ x^5 + x^2 + x^0 \end{array} \tag{2}$$

That is, as a result of the three errors in the scan cells, errors will be appear on the 0th, 2nd, and 5th bit of the error signature produced by the compactor. Thus, error signature S (resulting from the bit-wise XOR combination of the fault-free and faulty signature) will be "0100101," where each "1" corresponds to the location in the compressed test response wherein an error was found (here, $x^0$, $x^2$ and $x^5$).

Referring to FIG. 6, the error signature "0100101" forms a root 610 of the search tree. Because $x^0$ is the rightmost error bit 620 of the error signature, it is selected in this example for evaluation and its drivers are found. The scan cells driving the bit can be found, for example, using a matrix or data structure such as the signature-bit matrix described above. In this example, the scan cell candidates are selected in numerical order, thus cell (0,0) (shown at 630) is selected. Calling the update function yields a new form of the error signature. In particular, the error signature $(x^5 + x^2 + x^0)$ is XORed with the error print $(x^3 + x^1 + x^0)$ associated with the cell (0,0). Thus, $$\begin{array}{r} x^5 + x^2 + x^0 \\ \underline{x^3 + x^1 + x^0} \\ x^5 + x^3 + x^2 + x^1 \end{array} \tag{3}$$

which corresponds to an updated error signature of "0101110," at a second vertice 640 of the search tree.

Because bit $x^1$ is now the rightmost error bit 622, it is selected next for evaluation. Error bit $x^1$ is driven by cells (0,0), (0,1), (1,1) and (2,0). Because bit (0,0) was already considered, (0,1) is selected (shown at 632). Calling the update function combines the error signature $(x^5 + x^3 + x^2 + x^1)$ with the error print $(x^4 + x^2 + x^1)$ for cell (0,1). Thus, $$\begin{array}{r} x^5 + x^3 + x^2 + x^1 \\ \underline{x^4 + x^2 + x^1} \\ x^5 + x^4 + x^3 \end{array} \tag{4}$$

which corresponds to an updated error signature of "0111000" at a third vertice 642 of the search tree.

This process continues in a similar fashion for all scan cell candidates known to contribute to the rightmost error bit (here, $x^3$) until a solution is found or until no more cells can be used to cancel the error bit of the signature under consideration. FIG. 6 does not show these additional searches in detail but illustrates at 650 the eight scan cell candidates to be considered at this level of the search tree. If no more scan-cell candidates exist, then the search algorithm backtracks to vertice 640 and selects the next scan cell candidate at that level of the search tree.

In this case, for instance, the next candidate cell is (1,1) (shown at 634). Calling the update function combines the error signature $(x^5 + x^3 + x^2 + x^1)$ with the error print $(x^4 + x^3 + x^1)$ for cell (1,1). Thus, $$\begin{array}{r} x^5 + x^3 + x^2 + x^1 \\ \underline{x^4 + x^3 + x^1} \\ x^5 + x^4 + x^2 \end{array} \tag{5}$$

which corresponds to an updated error signature of "0110100" at a fourth vertice 644. The process iteratively proceeds as described above from the rightmost error bit 624 until candidate cell (1,2) (shown at 636) is selected for consideration. When the update function is called for scan cell (1,2), the error signature $(x^5 + x^4 + x^2)$ is combined with the error print $(x^5 + x^4 + x^2)$ for (1,2). Thus, $$\begin{array}{r} x^5 + x^4 + x^2 \\ \underline{x^5 + x^4 + x^2} \\ 0 \end{array} \tag{6}$$

indicating that a solution 646 has been found. In particular, the solution comprises the scan cells selected that resulted in the error signature being fully explained or cancelled out. This process is sometimes referred to as "justifying" the error signature. From FIG. 6, for instance, one can see the path along the search tree through scan cells (0,0), (1,1), and (1,2) to arrive at the proper solution.

The exemplary backtracking technique described above provides a robust way of locating scan cells that may produce a given signature. Because the diagnostic reasoning is basically dependent on the error bits present in the error signature, the same technique could be used to recreate all possible scan cell configurations that might yield a given signature. However, with the increasing size M of the compactor, the number of scan chains, and the number of scan cells, the respective search tree grows large quickly, leading to undesirably long processing times. Even with the small size of the compactor in the example given above, one can see from FIG. 6 how many depth-first searches are performed before a solution is found as a result of the search function described above. In particular, the solid arrows in FIG. 6 illustrate searches that would actually be performed before a solution is found according to the exemplary implementation, whereas the dashed arrows indicate searches that would have been performed had the solution not been found. Note that for illustrative purposes, the full extent of the searching performed is not shown.

Enhancing the Diagnostic Search

The embodiments of the basic search procedure described above can be modified or enhanced using a number of different techniques. Any one or combination of the techniques described below may be used in connection with an embodiment of the above-described search procedure to increase the efficiency and/or speed with which an accurate solution is found.

Exemplary Weight Functions to Guide Scan Cell Candidate Selection

As shown in the previous sections, one can use a backtracking algorithm to determine failing scan cells. However, because the search space may be quite large, it is desirable to accelerate the diagnostic process so that a solution matching the actual location of failing scan cells can be obtained more quickly. To help achieve this goal, a measure of the likelihood that particular scan cells captured the errors can be utilized. For example, in certain embodiments, the scan cell selection process can be guided by weight functions that are associated with the scan cells and updated as the error signatures are analyzed. According to one representative embodiment, the weight W of a given cell is proportional to the probability that the cell belongs to the actual error pattern. In one particular, non-limiting implementation, the total weight of a cell $c_i$ can be given as follows:

$$W(c_i) = B_i S_i (1 + C_i), \quad (7)$$

where $B_i$ is a weight value based on the number of error bits in the error signature that are affected in the same time frame that cell $c_i$ is output from the scan chains, $S_i$ is a weight value based on the number of times the scan chain in which cell $c_i$ is located has appeared in previous solutions, and $C_i$ is a weight value based on the number of times the cell $c_i$ has been found to be a part of a previously determined solution. Thus, $S_i$ and $C_i$ account for a proven presence of the same scan chain or scan cell in other solutions obtained for test vectors analyzed earlier.

In one exemplary implementation, the computation of coefficient $B_i$ is based on individual counters associated with each scan cell. For a given error signature, the counters for each scan cell can be used to record the total number of error bits in the given signature that are determined in part by the cell $c_i$. This number is termed the "error-signature weight" of the scan cell. The error-signature weight of a cell for a particular error signature can be computed, for example, using a matrix or data structure such as the signature-bit matrix described above. In some embodiments, the value of $B_i$ is determined by summing the error-signature weights of all scan cells from the various different scan chains having the same time frame as that of cell $c_i$. Each scan cell that is input into the injector network during the same time frame would therefore have the same value of $B_i$. The use of cumulative statistics associated with scan cells of a particular time frame rather than individual cell weights results from the observation that the use of individual scan cell weights can sometimes misguide the scan cell selection process. For example, consider again the convolutional compactor 410 shown in FIG. 4A and assume that errors are again captured in scan cells (0,0), (1,1), and (1,2). Using the signature-bit matrix from FIG. 4B or equivalent matrix or data structure, the error-signature weights and value of $B_i$ for the scan cells can be computed and tabulated as follows:

TABLE 5

| | Exemplary computation of $B_i$ | | | |
|---|---|---|---|---|
| | $SC_0$ | $SC_1$ | $SC_2$ | $B_i$ |
| $c_0$ | <u>1</u> | 2 | 1 | 4 |
| $c_1$ | 1 | <u>0</u> | 1 | 2 |
| $c_2$ | 2 | <u>2</u> | 1 | 5 |
| $c_3$ | 0 | 1 | 1 | 2 |

As seen from Table 5, the error-signature weights associated with the cells that actually captured the errors are not necessarily the largest ones (counters corresponding to the actual failing cells are printed in bold and underlined). For example, the error print created by scan cell (1,1) is completely masked by the errors captured in the other scan cells. Consequently, the weight of cell (1,1) in Table 5 is "0," even though it is part of the solution. If used directly to indicate the most likely sites of errors, these numbers could lead to a computationally less efficient diagnostic process, though such an implementation is still considered to be within the scope of this disclosure. Also shown in Table 5 are the values of $B_i$ associated with the four time frames during which the scan cells are input into the injector network. The four time frames correspond to the four scan cells ($c_0$ through $c_3$) in each scan chain.

Using the weight $B_i$, embodiments of the search procedure described above can be modified such that when a candidate scan cell is selected for evaluation (e.g., at process block 506 of FIG. 5), priority is given to the scan cell belonging to a time frame with the largest weight $B_i$.

The scan cell selection process can be further improved by utilizing additional information obtained during a signature preprocessing phase. This additional information can be used to further modify the value of $B_i$ or can be included as a separate weight value in a weight function. According to one exemplary implementation, for example, the error signatures received from the compactor can be analyzed to try to match the signatures to one of several known generic scenarios in which errors injected from the scan-chain outputs interact with each other in the injector network in a particular and recognizable way. Thus, if a scan cell is recognized as a likely part of a solution set of failing scan cells based on this analysis, its individual weight can be increased accordingly. For example, in the implementation described above, the weight value $B_i$ can be increased for any cells matching a generic error pattern.

Examples of generic error patterns are described below and illustrated in FIGS. 7A-7H. In particular, and using FIG. 7A to illustrate the components shown throughout FIGS. 7A-7H, FIG. 7A shows a compactor portion 700 having a register portion 702 and one or more representative injector networks 704 configured according to corresponding injector polynomials. In FIGS. 7A-7H, errors are assumed to be injected through each of the illustrated injector networks 704. FIGS. 7A-7H also illustrate whether the memory elements of the register 702 are loaded with the error (shown as an "error" symbol 706) or whether the memory elements are error free (shown as an "OK" symbol 708). The exemplary error patterns are not to be construed as exhaustive or limiting in any way. For example, implementations of the disclosed fault diagnosis technique can use any combination or subcombination of these error patterns (or none of the error patterns) and can include one or more additional error patterns not described herein.

The following example error patterns were derived from empirical studies, which indicated that error bits occur in signatures mostly due to the following origins:

An error print of three error bits, where the error bits are not all adjacent to one another, is typically produced by a single scan cell having an error print of the form:

$$E_1 = x^a + y^b + z^c.$$

Figure 7A:
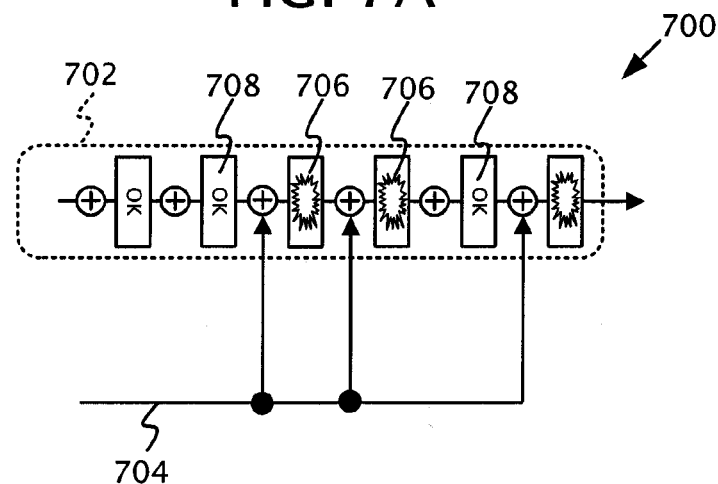
FIGS. 7A-7H illustrate exemplary generic error patterns as can be used to guide the scan cell candidate selection process in FIG. 5.

A representative injector network of this form is illustrated in compactor portion 700 of FIG. 7A.

An error print of four error bits is typically produced by two scan cells having error prints of the following forms:

$$E_1 = x^a + y^b + z^c$$

$$E_2 = x^a + y^d + z^e.$$

Figure 7B:
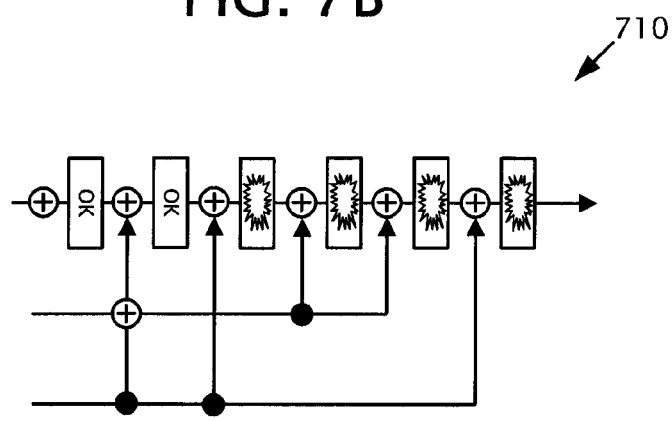

Representative injector networks implementing these forms are illustrated in compactor portion 710 of FIG. 7B.

An error print of two error bits is typically produced by two scan cells having error prints of the following form:

$$E_1 = x^a + y^b + z^c$$

$$E_2 = x^a + y^b + z^d.$$

Figure 7C:
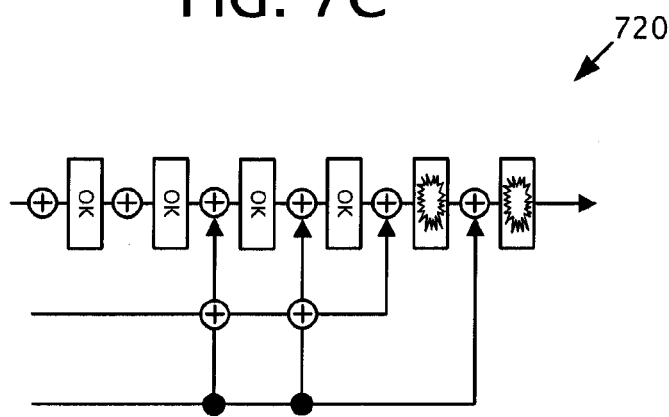

Representative injector networks implementing these forms are illustrated in compactor portion 720 of FIG. 7C.

An error print of five error bits is typically produced by three scan cells having error prints of the following form:

$$E_1 = x^a + y^b + z^c$$

$$E_2 = x^a + y^d + z^e$$

$$E_3 = x^f + y_b + z^g.$$

Figure 7D:
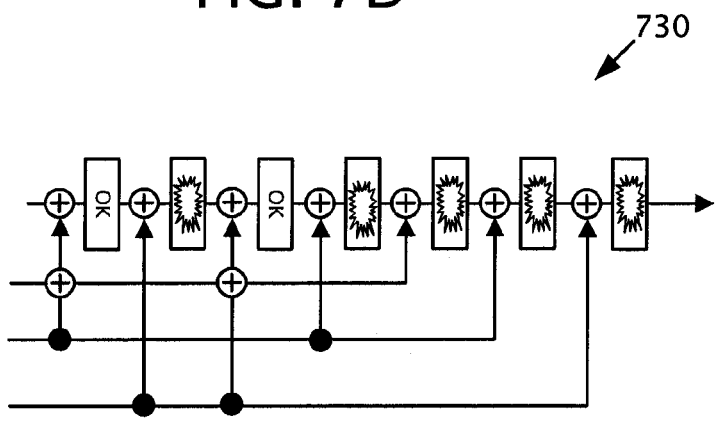

Representative injector networks implementing these forms are illustrated in compactor portion 730 of FIG. 7D.

An error print of three error bits is produced by three scan cells having error prints of the following form:

$$E_1 = x^a + y^b + z^c$$

$$E_2 = x^a + y^d + z^e$$

$$E_3 = x^f + y^d + z^c.$$

Figure 7E:
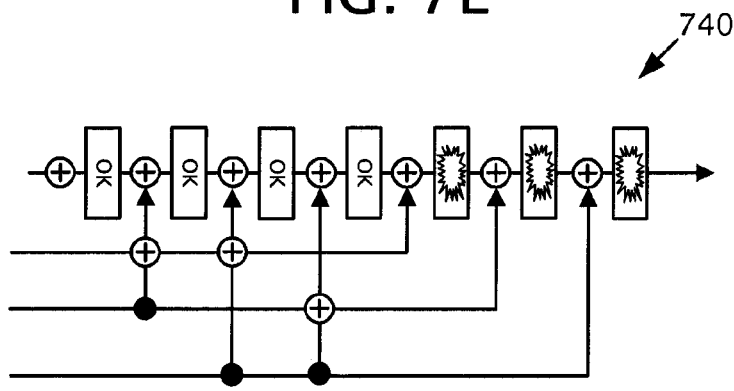

Representative injector networks implementing these forms are illustrated in compactor portion 740 of FIG. 7E.

An error print of a single error bit can be produced by three scan cells having error prints of the following form:

$$E_1 = x^a + y^b + z^c$$

$$E_2 = x^e + y^b + z^d$$

$$E_3 = x^e + z^c + z^d.$$

Figure 7F:
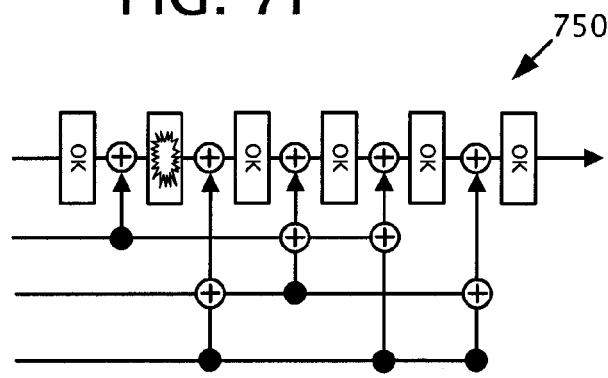

Representative injector networks implementing these forms are illustrated in compactor portion 750 of FIG. 7F.

An error print of a single error bit can also be produced by three scan cells having error prints of the following form:

$$E_1 = x^a + y^b + z^c$$

$$E_2 = x^a + y^b + z^d$$

$$E_3 = x^a + z^c + z^d.$$

Figure 7G:
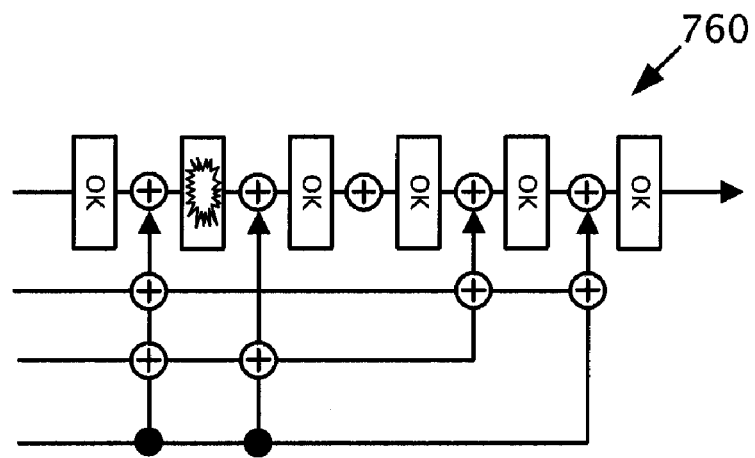

Representative injector networks implementing these forms are illustrated in compactor portion 760 of FIG. 7G.

An error print of six error bits can be produced by four scan cells having error prints of the following form:

$$E_1 = x^a + y^b + z^c$$

$$E_2 = x^a + y^d + z^e$$

$$E_3 = x^f + y^b + z^g$$

$$E_4 = x^h + y^i + z^c.$$

Figure 7H:
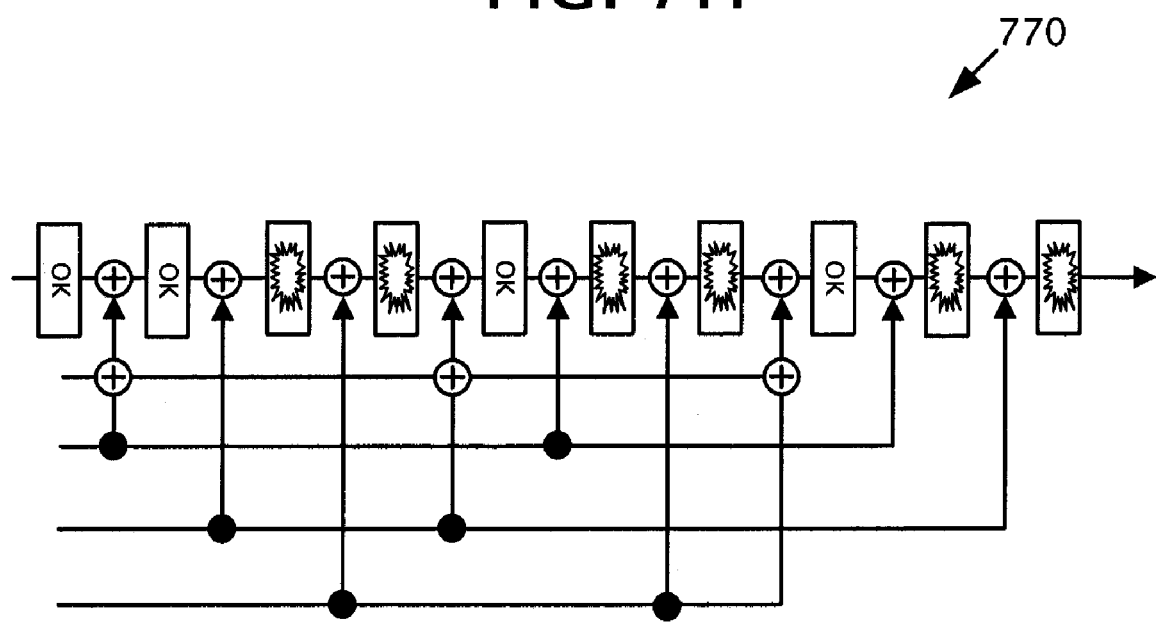

Representative injector networks implementing these forms are illustrated in compactor portion 770 of FIG. 7H.

Results obtained from previously analyzed error signatures can also be used to guide the scan cell selection process. For instance, weights assigned to scan cells can be dynamically updated during the fault diagnosis procedure so that scan cells known to have previously captured faulty values can be given a higher priority during subsequent application of the search procedure. This approach is reasonable because experimental evidence shows that, for many stimuli, faults often propagate to the same scan cells or, at least, to the same scan chains. One can take advantage of this observation, for example, by preferring cells located in scan chains hosting cells already found to have captured errors upon application of other test patterns.

The weight value $S_i$ in Equation (7), for example, can be employed to account for the probability that a scan chain capturing an earlier error will catch a later error. According to one particular implementation, for example, $S_i = B_i$ if a scan chain containing cell $c_i$ has appeared in previous solutions more than a predetermined number of times T (note that according to the exemplary equation, T must be greater than 1); otherwise, $S_i$ is set to 1. The value of the threshold T for the scan cells in a particular scan chain can correspond to the fraction of faulty signatures considered so far that have been found to result from errors captured in the scan chain. For example, in the experiments discussed below, T was equal to 0.02A, where A is a sum of a scan chain's occurrence in previously determined solutions.

The weight value $C_i$ in Equation (7) can be used to account for the likelihood that an individual scan cell caused a particular error signature. For example, according to one specific implementation, $C_i$ indicates the number of times a given cell was found to be part of a solution for a previously diagnosed error signature.

In order to prevent $S_i$ and $C_i$ from growing infinitely, their values can be normalized. For example, in one particular embodiment, the values are divided by the total number of test patterns deployed so far. Alternatively, the values can be divided by the total number of error signatures captured. In certain implementations, $S_i$ and $C_i$ are incrementally updated after successive solutions are obtained. In other embodiments, however, the values are updated at regular intervals or according to some other timeline. In this way, embodiments of the fault diagnosis technique modify their behavior based on newly acquired data, and thus can be said to learn from experience.

Figure 8:
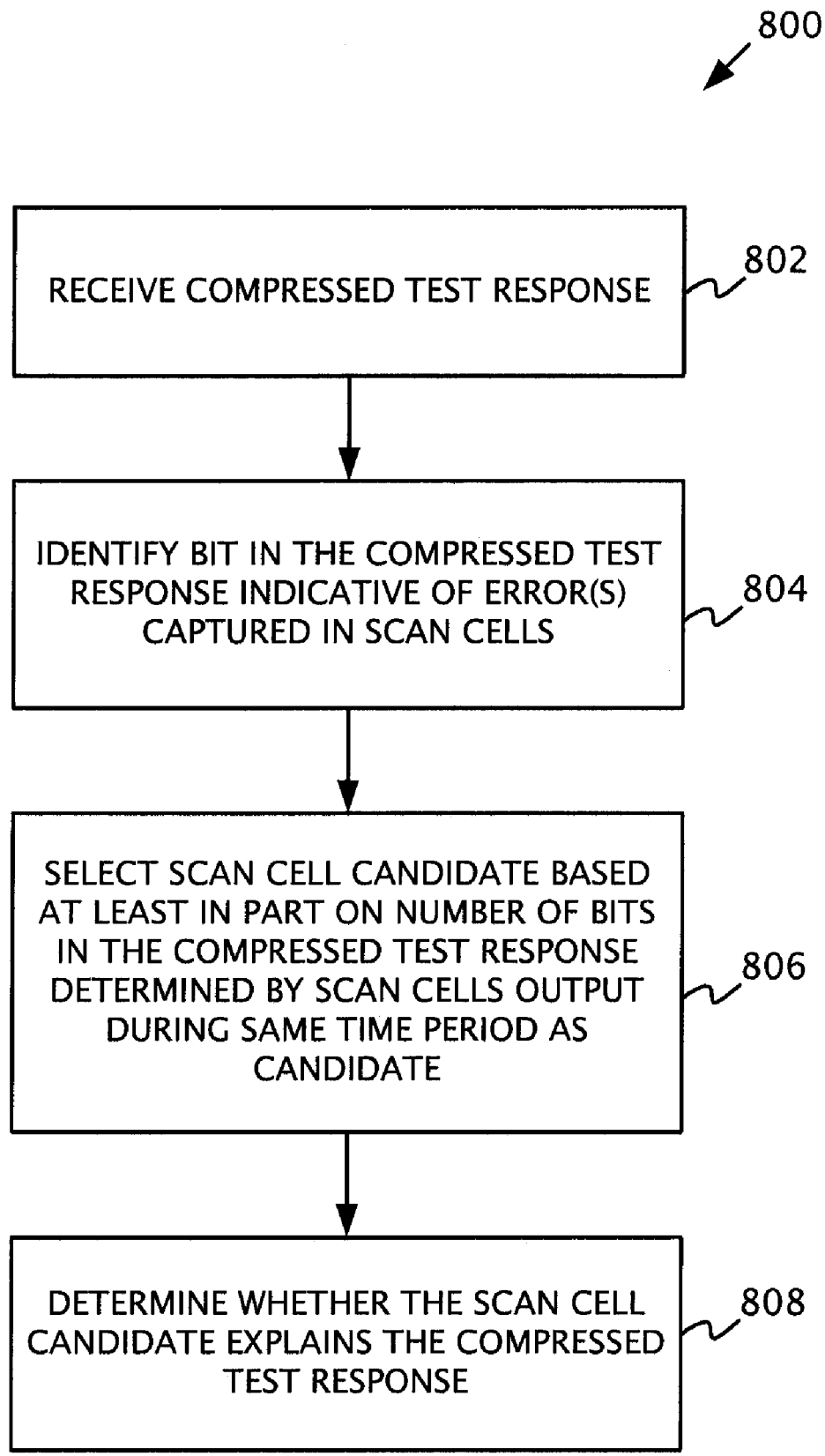
FIG. 8 is a flowchart of an exemplary method for performing fault diagnosis wherein scan cell candidate selection is based at least in part on the number of error bits in the compressed test response that are determined by scan cells output during the same time frame as the scan cell candidate.
Figure 9:
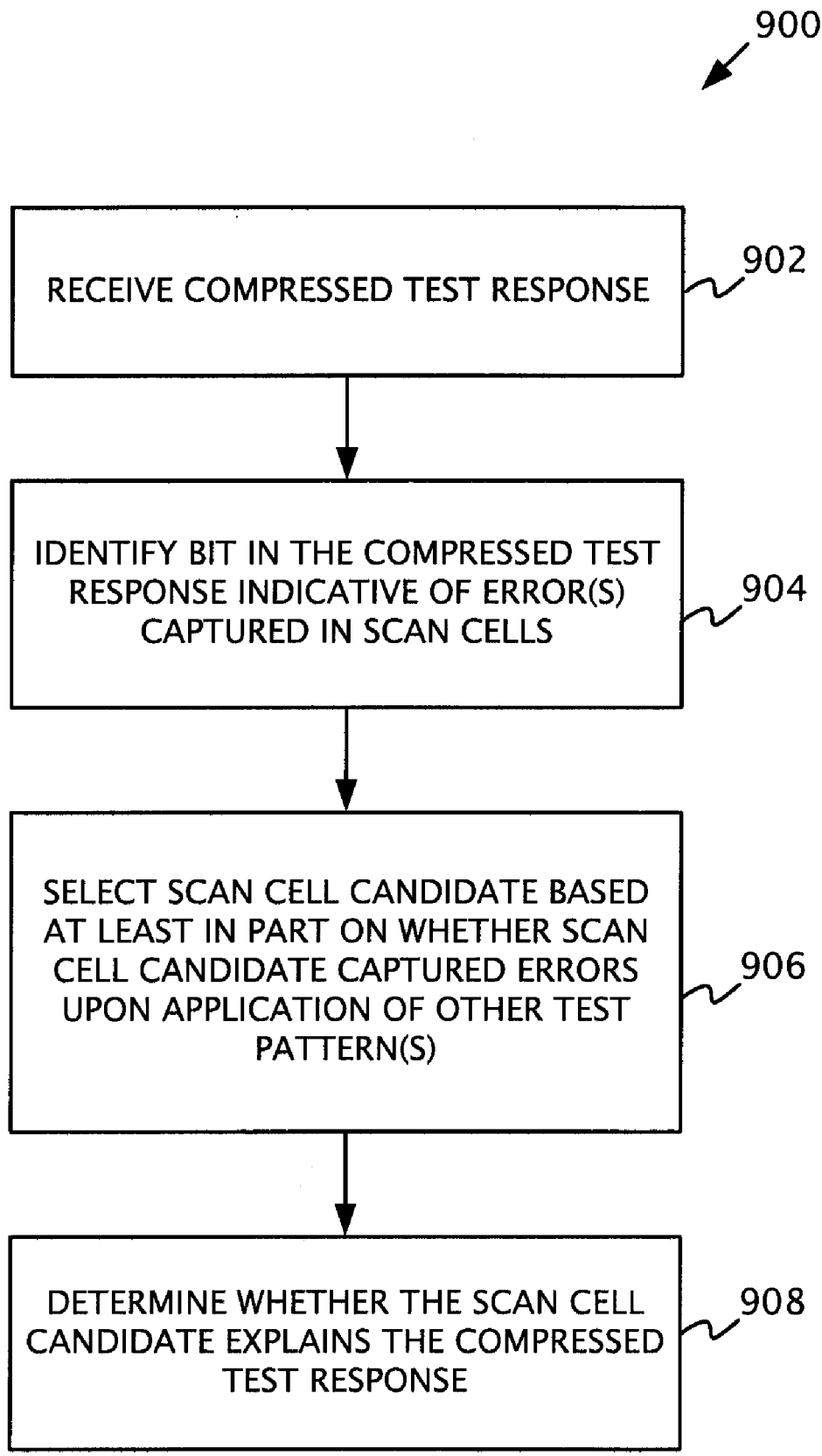
FIG. 9 is a flowchart of an exemplary method for performing fault diagnosis wherein scan cell candidate selection is based at least in part on whether the scan cell candidate captured errors upon application of other test patterns.
Figure 10:
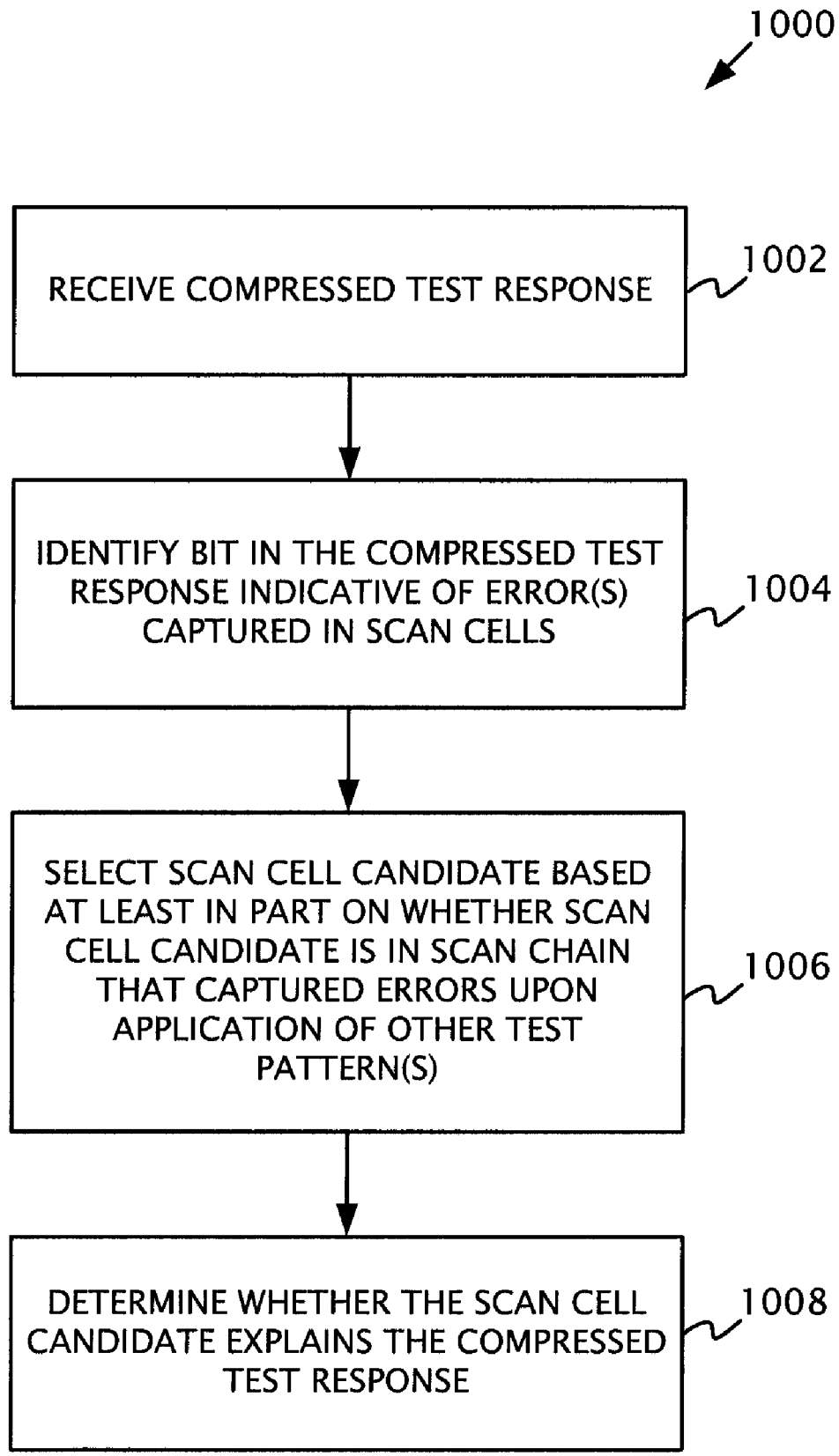
FIG. 10 is a flowchart of an exemplary method for performing fault diagnosis wherein scan cell candidate selection is based at least in part on whether the scan cell candidate is in a scan chain having scan cells that captured errors upon application of other test patterns.

Although Equation (7) shows that the weight W associated with a particular scan cell comprises three different components, any of the weight components described above may be used individually or in different combinations with one another or with other weighting factors or values to provide guidance during the scan cell candidate selection process. FIGS. 8 through 10, for example, are flowcharts showing general diagnostic procedures wherein the components of Equation (7) are used individually. The illustrated diagnostic techniques are not to be construed as limiting, as they can additionally include any of the other aspects of the technology described herein.

FIG. 8 is a flowchart 800 of a general diagnostic procedure wherein scan cell candidate selection is guided at least in part by considering which scan cells in the scan chains most significantly affect the error bits in the compressed test response. At process block 802, a compressed test response is received from a circuit-under-test. At process block 804, a bit in the compressed test response that is indicative of an error being captured in one or more scan cells of the circuit-under-test upon application of a test pattern is identified. In one exemplary embodiment, the bit is identified by creating an error signature as described above and selecting one of the "1"s (or other corresponding error bits) in the error signature. At process block 806, a scan cell candidate is selected from a set of scan cells known to affect the value of the identified bit (e.g., using the signature-bit matrix described above or other equivalent or functionally similar data structure). In this embodiment, the selection is based at least partially on the number of error bits in the compressed test response that are affected by scan cells output during the same time frame as the selected scan cell candidate. For example, the scan cells in the set can each be associated with a weight value (such as the weight $B_i$ described above) that is proportional to or otherwise corresponds with the number of scan cells that contribute to error bits in the error signature and that are output during a same time frame. In one embodiment, the scan cell having the highest weight value is selected as the scan cell candidate. At process block 808, a determination is made as to whether the scan cell candidate explains the compressed test response. For example, this determination can be made by performing a bit-wise XOR sum of the error signature associated with the compressed test response and an error print associated with the scan cell candidate.

FIG. 9 is a flowchart 900 of an exemplary general procedure in which scan cell candidate selection is guided at least in part by a scan cell's presence in earlier solutions. At process block 902, a compressed test response is received from a circuit-under-test. At process block 904, a bit in the compressed test response that is indicative of an error being captured in at least one scan cell of the circuit-under-test upon application of a test pattern is identified (e.g., using an error signature as described above). At process block 906, a scan cell candidate is selected from a set of scan cells known to affect the value of the identified bit (e.g., using the signature-bit matrix described above or other equivalent or functionally similar data structure). In this embodiment, the selection is based at least partially on whether the scan cell candidate was found to have captured errors upon application of other test patterns. For example, each of the scan cells in the set may be associated with a weight value (such as the weight $C_i$ described above) that is proportional to or otherwise corresponds to the number of times the respective scan cell is found to have captured errors upon application of other test patterns. The scan cell with the highest weight can be selected. At process block 908, a determination is made as to whether the scan cell candidate explains the compressed test response received (e.g., by updating an error signature associated with the compressed test response with a corresponding error print using a bit-wise XOR or XNOR sum).

FIG. 10 is a flowchart 1000 of an exemplary general procedure by which scan cell candidate selection is guided at least in part by a scan cell's presence in a scan chain having one or more scan cells found to be part of one or more earlier solutions. At process block 1002, a compressed test response is received from a circuit-under-test. At process block 1004, a bit in the compressed test response that is indicative of an error captured in at least one scan cell of the circuit-under-test upon application of a test pattern is identified (e.g., using an error signature S as described above). At process block 1006, a scan cell candidate is selected from a set of scan cells known to affect the value of the identified bit (e.g., using the signature-bit matrix described above or other equivalent data structure). In this embodiment, the selection is based at least partially on whether the scan cell candidate is in a scan chain that was found to have captured one or more errors upon application of other test patterns. For example, each of the scan cells in the set may be associated with a weight value (such as the weight $S_i$ described above) that is proportional to or otherwise corresponds to the number of scan cells in the same scan chain that are found to have captured one or more errors upon application of other test patterns. In one embodiment, the scan cell with the highest weight is selected. At process block 1008, a determination is made as to whether the scan cell candidate explains the compressed test response received (e.g., by updating an error signature associated with the compressed test response with a corresponding error print using a bit-wise XOR or XNOR sum).

Reducing the Search Space

The disclosed search procedures sometimes analyze branches of the search tree that do not lead to a solution because the scan chain candidates associated with the branch and its successors are infeasible. In such cases, it is desirable to modify the search procedure so that neither this branch nor its successors are considered. By appropriately modifying the search procedure, the number of options can be reduced and the search tree effectively "pruned".

Discussed below are exemplary techniques that can be used to reduce the search space traversed by the search procedure. These techniques should not be construed as limiting in any way, as they may used in various combinations or subcombinations, or excluded entirely from implementations of the disclosed diagnosis technology.

One exemplary technique for reducing the search space traversed by the search procedures is to provide a limit on the depth of the search. For instance, a limit can be placed on the number of scan cells that can be considered as part of a valid solution. According to one implementation, this limit can be upwardly adjusted if no solution is found at the lower limit.

Consider, for example, the exemplary pseudocode shown above in Tables 3 and 4. In the exemplary pseudocode, the variable used_cells is used to track the number of scan cells currently considered as part of the solution. A limit (termed herein max_cells) can then be assigned such that as soon as the number of selected scan cells (the value of used_cells) exceeds the value of max_cells, the search function backtracks. The value of max_cells can be a user-defined or preset value. Further, the value of max_cells may be increased if no solution is at first found.

Another exemplary technique for reducing the search space is to provide a mechanism by which the progress of the search technique is evaluated as the search progresses in order to assess whether the currently selected scan cells are likely to produce a solution. For example, even if the number of selected cells remains less than max_cells, it may become apparent that the number of error bits (n_Ones in the exemplary pseudocode) remaining in the current signature is too large given the number of cells already chosen. Thus, embodiments of the search technique can be modified such that, if the number of error bits in an error signature is not reduced to at least a value P after some number C of scan cells have been considered as part of a solution, the technique will backtrack. According to one specific non-limiting implementation, for example, the beginning of the exemplary search function introduced above in Table 3 can be rewritten as:

```
search ( ) {
    if (n_Ones == 0) return true
    if (used_cells > max_cells) return false
    if (used_cells > C and n_Ones > P ) return false
    done = false
    ...
}
```

The value of C can vary from implementation to implementation, as can the value of P. Further, these values can be user-defined or predetermined.

Figure 11:
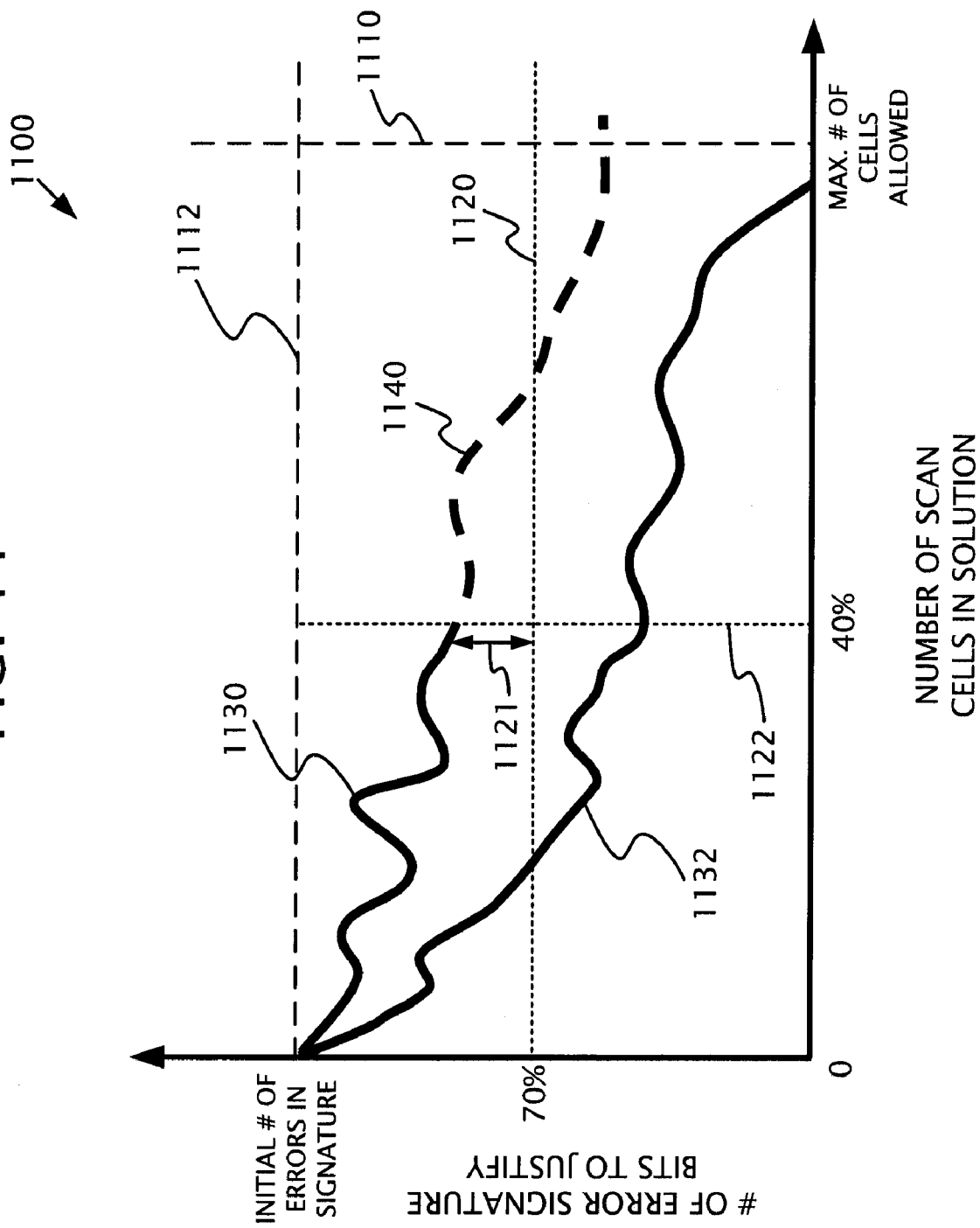
FIG. 11 is a block diagram conceptually illustrating how progress toward a solution can be monitored and used to guide scan cell candidate selection.

FIG. 11 is a graph 1100 conceptually illustrating this exemplary technique of monitoring progress toward a solution and backtracking if the progress does not meet a certain threshold. In particular, FIG. 11 shows a graph 1100 wherein the number of scan cells in a solution forms the x axis and the number of error bits left to justify in the error signature forms the y axis. Also shown is a maximum limit of the number of scan cells allowed in a solution (shown as dashed line 1110) and an initial number of error bits in the error signature under consideration (shown as dashed line 1112). Assume for purposes of this example that the search technique terminates if the number of error bits (e.g., "1"s) in an error signature is not reduced to at least 70% of the original number (represented by dotted line 1120) after the number of cells considered for a solution reaches 40% of the maximum number allowed (represented by dotted line 1122). Two exemplary plots are shown in FIG. 11 and illustrate progress toward a solution upon initial selection of two different scan cell candidates. In particular, plot 1130 shows the progress of a search that began with the selection of a scan cell candidate that is not part of the solution. As can be seen, when the search reaches the 40% limit at line 1122, the number of error bits to still be justified in the error signature is greater than 70% of the initial number of errors (shown as difference 1121). Accordingly, the search procedure terminates, thereby preventing the search from continuing along an ultimately unsuccessful path (shown as dashed line 1140). By contrast, plot 1132 represents a search that began with the selection of a scan cell candidate this is part of the solution. When this search reaches the 40% limit at line 1122, the number of error bits still to be justified is less than the 70% minimum, and the search continues.

It should be understood that this technique is not limited to performing a single check during the progress of a given search procedure. Instead, multiple additional limits can be established to provide additional control over the search space.

Yet another technique for reducing the search space is to use a weight function, such as the exemplary weight function of Equation (7) or any of its components (individually or in various combinations with one another), to identify portions of the search space that are unlikely to contain a solution. For example, and in the syntax of the psuedocode introduced above in Tables 3 and 4, the following instruction can be used:

if (Scan_chains[scan][cell]·weight<min) continue, which can be placed after selecting a next scan cell as a possible part of the solution set of failing scan cells (inside the while loop). According to this example, if a selected cell's weight is smaller than the value of the acceptable minimum (min), the technique ignores the scan cell and selects the next cell. If there are no more scan cells to select from the set of possible scan cells with weights greater than the acceptable minimum, the technique backtracks.

Another exemplary technique for pruning the search space is to provide a limit on the number of scan chains that can host failing scan cells. This can be done, for example, in a manner similar to that used in limiting the number of scan cells allowed to form part of the solution. It is also possible to designate directly certain scan chains such that the selection of scan cell candidates is confined only to the designated scan chains. For example, a matrix representation, such as the signature-bit matrix shown in FIG. 4B, can be used to identify one or more scan chains that have greater numbers of scan cells contributing to respective error bits of an error signature. The search can then be limited to scan chains above a certain threshold number.

As was illustrated in Table 5, errors injected into compactor registers may cancel each other, thus leaving a diagnostic procedure in which cells that are part of the actual solution may have zero weights. These cells are desirably not ignored, however, as they might comprise the actual solution. On the other hand, there are scan cells having weights equal to zero that will most likely never be a part of any error pattern. Such cells are usually found in time frames in which all of the corresponding cells from the other scan chains also have zero weights. Moreover, such cells are usually found in time frames that are adjacent to other time frames having zero weights. Together, these scan cells can be said to form "zero zones," or "error-free zones." The occurrence of error-free zones might be caused by error clustering (a phenomenon where only neighboring scan cells are affected by faults). Regardless of cause, the scan cells in the error-free zones typically do not capture any failure response.

Figure 12:
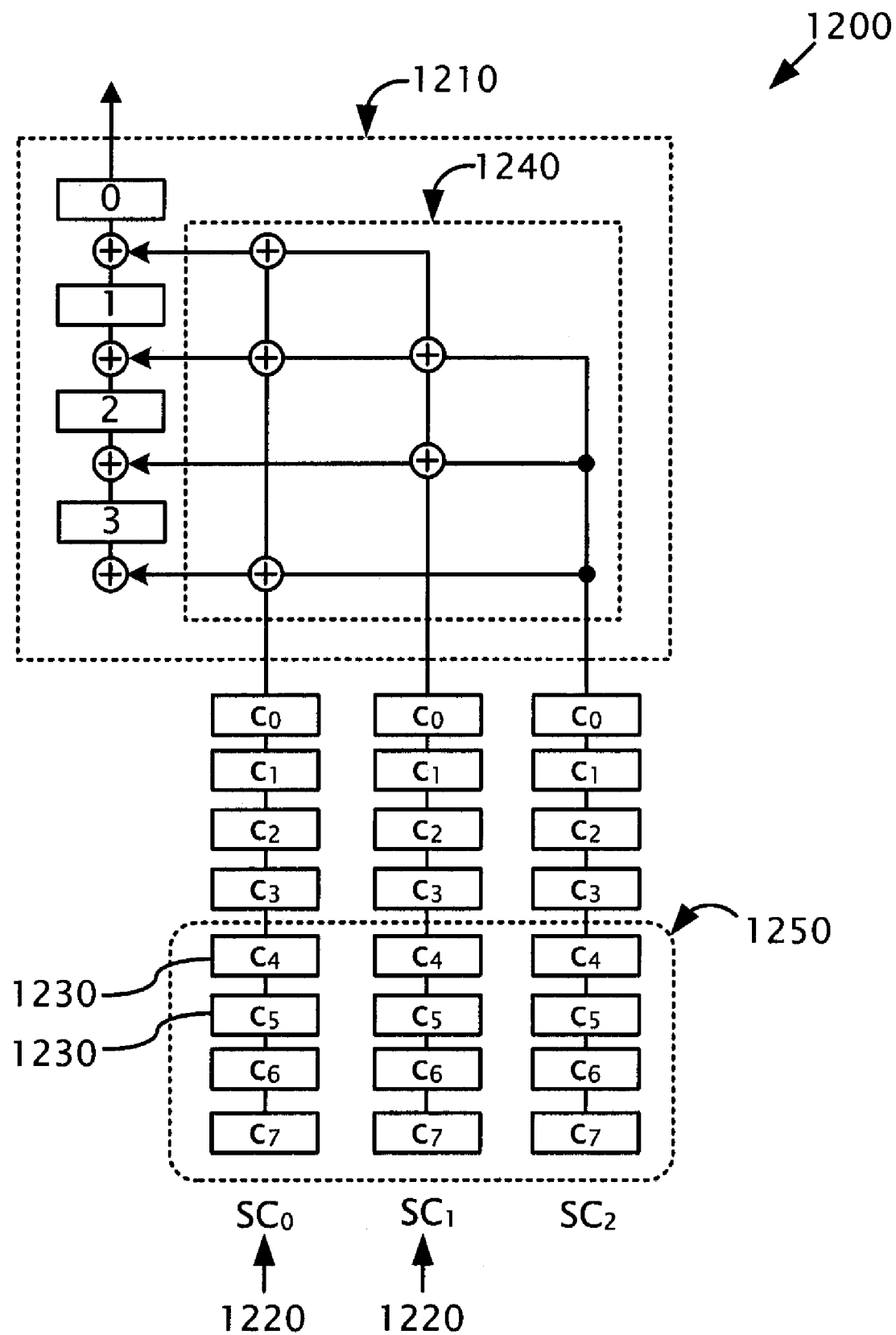
FIG. 12 is a block diagram illustrating a third exemplary embodiment of a convolutional compactor illustrating error-free zones of scan cells in the scan chains coupled to the compactor.

The concept of error-free zones is illustrated in FIG. 12. FIG. 12 shows a circuit portion 1200 that includes a compactor 1210 having an injector network 1240 arranged according to the same injector polynomials as the compactor 410 of FIG. 4A. In contrast to the circuit shown in FIG. 4A, however, the scan chains 1220 of the circuit in FIG. 12 have four additional memory elements 1230 per scan chain (labeled as "$c_4$," "$c_5$," "$c_6$," and "$c_7$," respectively). Assuming that errors are captured at scan cells (0,0) (1,1) (1,2) again, the resulting error signature produced will be: "00000100101." Using a matrix such as the signature-bit matrix or other equivalent data structure generated for the compactor 1210, the weights $B_i$ for each scan cell can be computed. For example, in Table 6 below, $B_i$ is associated with each scan cell c output during a time frame i and has a value indicative of the total number of signature bits in the error signature that are affected by the scan cells of time frame i.

TABLE 6

Exemplary computation of $B_i$ showing error-free zone

|  | $SC_0$ | $SC_1$ | $SC_2$ | $B_i$ |
|---|---|---|---|---|
| $c_0$ | 1 | 2 | 1 | 4 |
| $c_1$ | 1 | 0 | 1 | 2 |
| $c_2$ | 2 | 2 | 1 | 5 |
| $c_3$ | 0 | 1 | 1 | 2 |
| $c_4$ | 0 | 0 | 0 | 0 |
| $c_5$ | 0 | 0 | 0 | 0 |
| $c_6$ | 0 | 0 | 0 | 0 |
| $c_7$ | 0 | 0 | 0 | 0 |

From Table 6, it can be seen that the scan cells output during time frames 4 through 7 ($c_4$ through $c_7$) have a total weight of "0" and are adjacent to one another. Thus, the scan cells are not believed to contribute to the observed error signature, and can be considered to be within an error-free zone 1250 of the circuit. Consequently, the search procedure can be modified such that no scan cells within the error-free zone are selected and searched. If no solution is found, the zone can be removed and searched. In certain implementations and in order to differentiate the error-free zones from other scan cells with zero weights, some or all cell weights in these areas can be assigned a weight value of "−1."

Exemplary Embodiments of Overall Fault Diagnosis Methodologies

Exemplary embodiments of overall fault diagnosis methodologies are described in this section. In certain of the described embodiments, finding the set of failing scan cells proceeds by iteration using results obtained from earlier diagnoses. Starting from the simplest cases, these exemplary embodiments gradually attempt to solve more complex problems based on information gained in the previous steps. For example, the set of scan cell candidates considered during an iteration can be modified based at least partially on information about previously identified failing scan cells. The information used can comprise, for instance, the identity of the failing scan cells, the scan chain location of the failing scan cells, or both. In certain embodiments, the information from previous steps is at least partially used in a weight value associated with respective scan cell candidates. The weight values can be indicative of the likelihood that the scan cell candidate is part of a solution and can thus be used as a criteria for ordering the scan cell selection process.

Figure 13:
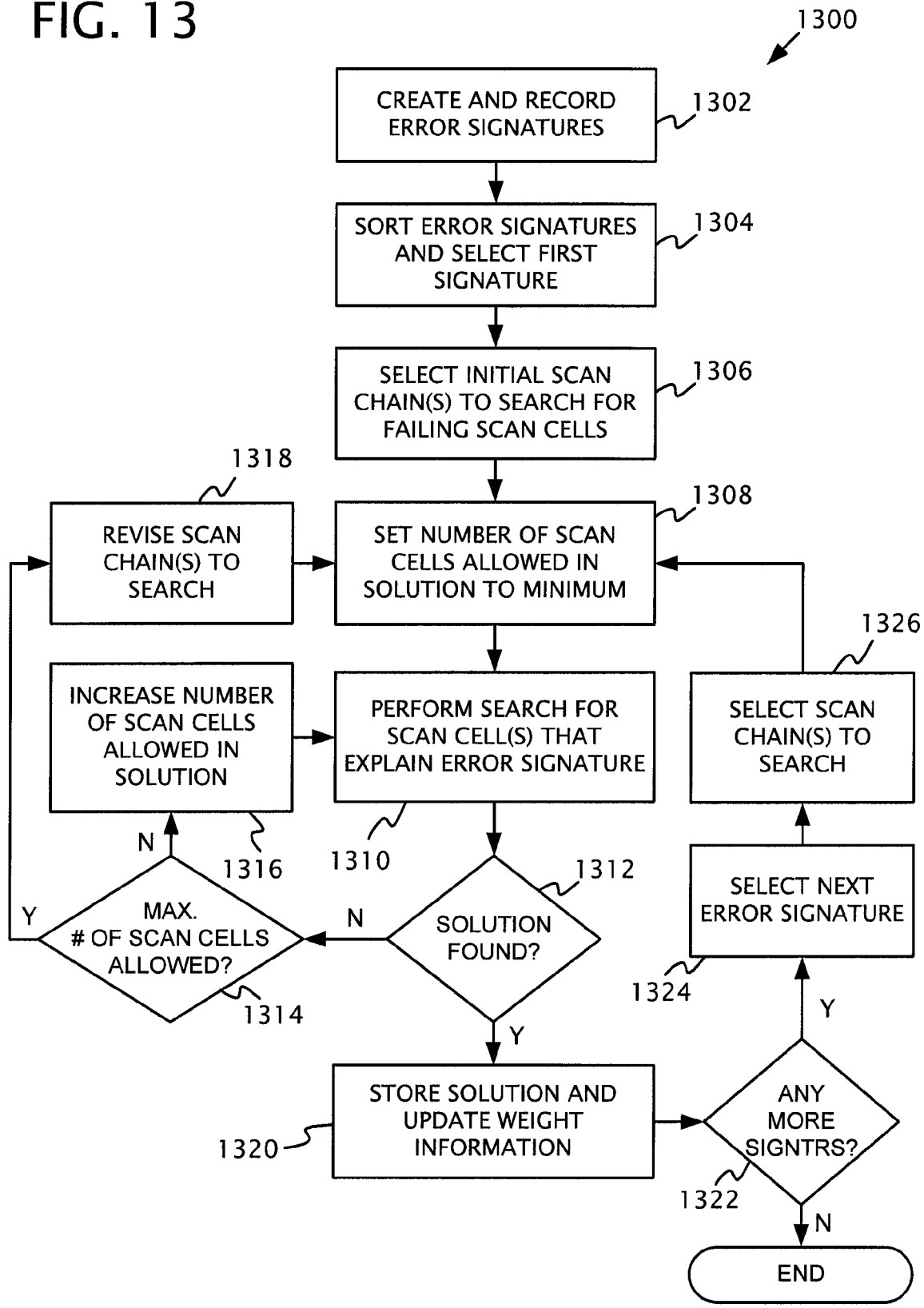
FIG. 13 is a flowchart of an exemplary overall methodology for fault diagnosis.

FIG. 13 is a flowchart 1300 showing an exemplary embodiment of an overall diagnostic methodology. At process block 1302, error signatures are received. For example, for each test pattern $t_i$ applied to a circuit-under-test, a corresponding signature $S_i$ as described above is recorded.

At process block 1304, the error signatures are sorted and further signatures to analyze are selected. For example, the number of error bits present in each signature can be computed and the sorting performed according to these numbers. The number of error bits occurring in each signature provides a rough estimation of error pattern complexity, and thus an indication of the degree of difficulty one may face when trying to locate the failing scan cells. It has been discovered through experimentation that, in a vast majority of cases, more complex error patterns imply more error bits in the corresponding error signatures (see also Table 1). Given the self-learning behavior of the exemplary scheme of FIG. 13, it is desirable to have all signatures put in order of the error bits they feature, from fewest to greatest, and the signatures selected in this order. Consequently, diagnosis can first be performed for cases in which the expected number of failing scan cells is relatively small. Subsequently, using the earlier results, the scheme will try to identify components of error patterns with larger numbers of failing cells. According to one particular implementation, and referring to the syntax used in the pseudocode shown in Tables 3 and 4, the variable n_Ones can be used to record the number of error bits for each signature $S_i$. The signatures $S_i$ can then be sorted in ascending order with respect to the number of "1"s they feature and the first error signature selected. Additionally, in some implementations, the initial location of the rightmost "1" in the selected error signature (or other error bit selected as the starting point for searching) can be determined. Further, an index value i used to count the error patterns being analyzed may be set to an initial value (e.g., "1").

At process block 1306, a scan chain is selected as a possible location of the failing scan cells. In one particular implementation, a single scan chain is chosen as the first scan chain in which the search is to be performed. As more fully discussed below, the selection of scan chains to search may favor scan chains known to have captured errors upon application of other test patterns. For example, in a subsequent search phase, the method may select multiple scan chains to search.

At process block 1308, the initial number of scan cells allowed to be part of a solution is set. In one particular implementation, for example, this number is set to the minimum number possible in view of the number of error bits in the error signature being considered. For example, assuming the presence of a convolutional compactor with injector polynomials of the form: $x^a + y^b + z^c$ and with reference to the terminology of the exemplary pseudocode in Tables 3 and 4, the number of scan cells allowed (max_cells) can be set as $\lceil \text{n\_Ones}/3 \rceil$ for a given error signature $S_i$.

At process block 1310, the search for the one or more scan cells that explain the error signature $S_i$ is performed. For example, any of the search techniques described above can be invoked to identify the one or more scan cells that captured the observed error in the error signatures $S_i$. Further, the search technique utilized can be enhanced using any one or combination of the techniques described above. According to one particular implementation, for example, the search and update functions as described in the pseudocode shown in Tables 3 and 4 are invoked. The search and update functions can further utilize any combination of the weight functions described above and/or the search-space pruning techniques described above. For example, and with reference to the syntax of the exemplary pseudocode, the search can be modified such that the variables C and P have specified values, such as 0.4 max_cells and 0.7 n_Ones, respectively. Note that in this embodiment, the search is executed for a given set of scan chains and a fixed number of scan cells. This limitation, however, can be removed or modified in certain implementations.

At 1312, a determination is made as to whether a solution is found. If a solution is found, then, at process block 1320, the solution is stored and any relevant weight information updated. The index i may also be increased at this point. At process block 1322, a determination is made as to whether any more error signatures remain to be considered. If so, then the next signature is selected at process block 1324, and the one or more scan chains to be searched selected at process block 1326. The selection of which scan chain(s) to search can depend on the updated weight information. For example, according to one exemplary embodiment, a scan chain is favored for selection if it was found to have hosted failing scan cells in previous iterations of the search procedure. In one particular implementation, the scan chain having the highest number of failing scan cells is selected first.

If a solution is not found at process bock 1312, then, at process block 1314, a determination is made as to whether the number of scan cells allowed to be in a solution is set to its maximum number. If not, the maximum number of scan cells allowed in a solution is increased at process block 1316, and the searching is repeated using the revised limit. For example, and referring to the exemplary pseudocode, the value of max_cells can be increased by some value (e.g., "1"). The value of max_cells can have a limited maximum value that can be, for example, predetermined. In this case, the value of max_cells would not be increased if the increase would result in the value being greater than the upper limit. Process block 1316 allows for the possibility that, for a given number of scan cells located in a predetermined scan chain, there is no adequate error pattern that could produce signature $S_i$. In such a case, the exemplary embodiment increases the maximum number of scan cells that should be considered and performs the search procedure again (e.g., invokes the search function again). Although not required, in the illustrated embodiment, the set of scan chains that can host failing scan cells remains unchanged. This procedure continues iteratively until the maximum number of scan cells reaches its upper limit.

If a solution is not found and if the maximum number of scan cells allowed in a solution has reached its limit, then, at process block 1318, a next scan chain or combination of scan chains that may host failing scan cells is selected, and the diagnostic procedure is repeated from process block 1308. In other words, if the exemplary method still fails to identify a set of scan cells receiving errors, then it selects a new set of one or more scan chains in which to search, and returns to process block 1308.

According to one exemplary implementation, the new candidate scan chains are determined as follows. Suppose there are s scan chains that have been identified as locations of errors after diagnosing previous error signatures. At process block 1318, a subset of the s scan chains with k members, for k=1, 2, . . . , r will be selected. For instance, in one implementation, all subsets of the s-set having k members are examined for values of k from 1 to r. In the results presented in this disclosure, for example, r was set to less than four and was found to produce quality diagnostic results. Using this scan cell selection technique helps to provide a preference to those scan chains that are most likely to be part of a final solution because of their occurrence in earlier solutions.

An error pattern, however, may result from an error captured in scan cells located in scan chains not recorded previously, and therefore not targeted in the exemplary manner shown above. To search these scan chains, and according to one exemplary embodiment, a single scan chain from the remaining N−s scan chains can be searched after the k-subsets have been examined. Further, the remaining scan chains can be added to the k-subsets examined earlier to form new (k+1)-subsets of scan chains.

According to one particular implementation, if a newly examined scan chain occurs a predetermined number of times in solutions for error signatures, it is added to the s-set of scan chains, thereby forming a revised (s+1)-set. Note that according to the illustrated embodiment, s is initially 0, and the exemplary technique first attempts to locate failing scan cells in one (then two, then three, etc.) of the N scan chains.

The exemplary technique described above can be modified and rearranged in a variety of ways depending on the application. For example, the exemplary embodiment can be modified so that in many cases the average successful diagnosis time remains bounded even though the number of error bits in the error signatures increase. Specifically, and according to one exemplary implementation, a given error signature can be divided into one or more clusters of erroneous signals, which are then individually diagnosed. This modification is based on the observation that erroneous signals typically occur in signatures as several clusters separated by a large number of bits not affected by faults. Consequently, the exemplary diagnostic techniques described herein can be performed individually for each cluster, rather than for the whole signature. In order to isolate such clusters quickly, one can identify error-free zones of a predetermined length in the signature (such as described above and illustrated in Table 6), and divide the signature accordingly.

Experimental Results

Several experiments were performed using embodiments of the disclosed diagnostic scheme. In the experiments, the exemplary diagnostic procedure comprised the procedure shown in FIG. 13, wherein the search and update functions of Table 3 and 4 were invoked as the search procedure. Further, the first error bit that was selected corresponded to the rightmost "1" in the error signature, and the number of failing scan cells allowed was initially set as $\lceil n\_Ones/3 \rceil$. Still further, the weight function shown in Equation (7) was utilized, with T=0.02A for purposes of determining the coefficient $S_i$. Moreover, the search space was controlled by setting the values of C and P to 0.4max_cells and 0.7n_Ones.

The experiments were conducted on several large ISCAS'89 benchmark circuits and industrial designs. The characteristics of the industrial design, including the number of gates, scan cells, and scan chains, are shown in Table 7. A commercial ATPG tool was used to generate the test sets used in the experiments. A measure termed "diagnostic coverage" was used as the basic figure of merit to assess performance of the exemplary schemes. Given a test set T, diagnostic coverage is defined as the percentage of faults that are diagnosable. A fault is said to be diagnosable if all scan cells affected by the respective fault are correctly identified using the diagnostic technique. Note that the test sets can detect faults several times and that the subsets of affected scan cells may differ each time. Let $T(f_i) \subset T$ be a subset of test patterns that detect fault $f_i$ and yield different error patterns. Also let $C(f_i, t_j)$ be the set of scan cells affected by fault $f_i$ when test pattern $t_j \in T(f_i)$ is applied, and $D(f_i, t_j)$ be the set of failing scan cells determined by the diagnostic procedure. The diagnostic coverage can then be measured in terms of basic diagnostic coverage (BDC) or, alternatively, in terms of compound diagnostic coverage (CDC), both of which are described below.

A fault is declared successfully diagnosed if there is at least one test pattern for which the corresponding failing scan cells were correctly identified in their entirety. Hence, the basic diagnostic coverage (BDC) is given by the following formula:

$$BDC = F^{-1} \sum_{i=1}^{F} d_i, \tag{8}$$

where F is the total number of faults, $d_i=1$ provided there exists $t_j$ such that $C(f_i, t_j) = D(f_i, t_j)$, and $d_i$ is equal to 0 otherwise.

Alternatively, given test patterns from $T(f_i)$ which detect fault $f_i$, diagnostic capacity can be determined as a fraction of the error patterns for which sets of failing scan cells were correctly identified. In this case, the compound diagnostic coverage (CDC) can be expressed as follows:

$$CDC = F^{-1} \sum_{i=1}^{F} \omega_i^{-1} \sum_{j=1}^{\omega_i} d_{ij}, \qquad (9)$$

where $\omega_i$ is the number of different error patterns caused by $f_i$ when test patterns from $T(f_i)$ are applied, $d_{ij}=1$ if $C(f_i, t_j)=D$ $(f_i, t_j)$, and $d_{ij}$ is equal to 0 otherwise. Recall that the second summation is governed by index j indicating test patterns that yield different error patterns.

In the experiments reported below in Table 7 for the ISCAS'89 benchmark circuits, single-output M-bit convolutional compactors with a minimum span between polynomial taps equal to M/4 were employed. These compactors were selected in part to illustrate how the design of the convolutional compactor can impact the diagnostic time and the quality of diagnosis. For each compactor, the number of memory elements M used to create its sequential portion is given.

For each circuit, Table 7 shows the number of gates, the number of memory elements, and the number of faults that propagate to the scan chains. Further, for each convolutional compactor, the corresponding basic diagnostic coverage (BDC) and the compound diagnostic coverage (CDC) values are given. As demonstrated in Table 7, very high BDC was achieved for all examined circuits. Moreover, only slightly lower CDC was observed, despite the variety of error patterns produced by those faults.

Further experiments were conducted on five industrial designs. Some representative results are presented in the bottom part of Table 7. In this experiments, 1,000 faults were randomly selected in each case and all sources of unknown states were masked. For each design, similar information is provided as before. As can be seen, a high BDC and CDC was achieved in all cases.

TABLE 8

The error patterns breakdown

| | Number of failing scan cells | | | | | | | |
|---|---|---|---|---|---|---|---|---|
| S | 1 | 2 | 3 | 4 | 5 | 6 | 7 | ≧8 |
| 1 | 100 | 61.18 | 41.71 | 40.75 | 41.73 | 42.38 | 40.78 | 34.47 |
| 2 | — | 38.82 | 46.57 | 41.31 | 34.64 | 34.18 | 37.17 | 33.24 |
| 3 | — | — | 11.72 | 14.83 | 17.55 | 15.51 | 13.73 | 18.78 |
| 4 | — | — | — | 3.11 | 5.31 | 6.18 | 5.94 | 6.79 |
| 5 | — | — | — | — | 0.77 | 1.29 | 1.43 | 2.78 |
| 6 | — | — | — | — | — | 0.46 | 0.52 | 0.90 |
| 7 | — | — | — | — | — | — | 0.43 | 0.51 |
| ≧8 | — | — | — | — | — | — | — | 2.62 |

The diagnostic coverage (DC) for each of the examined chips is shown in Table 9. In all cases, a single-output 128-bit convolutional compactor was simulated. Each row of the table corresponds to a given multiplicity mE of errors in the error patterns (as indicated in the first column). The multiplicity mE of error patterns indicates the number of failing scan cells in an error patterns. The second column #E indicates the number of observed error patterns for a given multiplicity mE. The next four columns report the corresponding diagnostic coverage in various forms. Specifically, the first two columns give the absolute number of cases diagnosed correctly together with the corresponding percentage of the total, while the second pair of columns reports a cumulative diagnostic coverage (the number of successfully identified error patterns of multiplicities up to a value represented by a respective row of the table) together with the corresponding percentage of the total. As can be seen, for error patterns having up to three failing scan cells, complete diagnostic coverage was achieved. For larger error patterns, the diagnos-

TABLE 7

Diagnostic coverage for ISCAS'89 circuits and industrial designs

| | CUT | | | Size (M) of single-output convolutional compactor | | | | | | | | | |
|---|---|---|---|---|---|---|---|---|---|---|---|---|---|
| | | | | 16 | | 32 | | 48 | | 64 | | 128 | |
| Name | Gates | Scan | Faults | BDC | CDC | BDC | CDC | BDC | CDC | BDC | CDC | BDC | CDC |
| s5378 | 3629 | 9 × 20 | 3878 | 96.11 | 91.32 | 97.22 | 94.62 | 97.37 | 95.32 | 97.96 | 96.96 | 97.96 | 96.97 |
| s9234 | 6577 | 10 × 22 | 6700 | 95.49 | 88.12 | 96.25 | 90.26 | 96.42 | 91.61 | 96.39 | 91.85 | 96.42 | 92.00 |
| s13207 | 10920 | 20 × 32 | 10806 | 94.92 | 91.27 | 95.83 | 92.60 | 95.82 | 92.86 | 95.98 | 93.41 | 95.98 | 93.58 |
| s15850 | 10840 | 20 × 27 | 11934 | 91.80 | 84.70 | 92.89 | 86.50 | 93.03 | 87.33 | 93.17 | 87.75 | 93.18 | 87.89 |
| s35932 | 16065 | 32 × 54 | 35545 | 99.78 | 99.73 | 99.86 | 99.76 | 99.96 | 99.86 | 99.96 | 99.88 | 99.96 | 99.91 |
| s38417 | 29394 | 32 × 52 | 34406 | 98.64 | 93.44 | 99.40 | 96.80 | 99.52 | 97.41 | 99.60 | 98.07 | 99.68 | 98.82 |
| s38584 | 25865 | 32 × 45 | 36073 | 95.26 | 91.99 | 95.47 | 92.46 | 96.42 | 93.88 | 96.45 | 94.15 | 96.46 | 94.39 |
| D1 | 506K | 50 × 373 | 1000 | 100.0 | 84.68 | 100.0 | 96.58 | 100.0 | 97.38 | 100.0 | 97.59 | 100.0 | 96.99 |
| D2 | 271K | 160 × 259 | 1000 | — | — | 98.28 | 93.43 | 98.78 | 95.83 | 98.99 | 96.44 | 98.68 | 95.88 |
| D3 | 1095K | 160 × 470 | 1000 | — | — | 100.0 | 99.86 | 99.90 | 99.85 | 99.90 | 99.90 | 99.90 | 99.90 |
| D4 | 302K | 160 × 116 | 1000 | — | — | 98.90 | 92.98 | 99.70 | 96.93 | 99.50 | 96.95 | 99.50 | 97.80 |
| D5 | 496K | 160 × 283 | 1000 | — | — | 94.76 | 88.00 | 94.15 | 86.90 | 94.46 | 86.55 | 93.53 | 85.86 |

The next group of experiments was performed to verify the effectiveness of the exemplary embodiment of the diagnostic technique using the same fail log information that was used in Tables 1 and 2 (100 scan chains, each 1050-bit long) and simulating convolutional compactors. Table 8 gives a more detailed breakdown of the error patterns collected for 370 faulty chips. More specifically, Table 8 shows the percentage of error patterns having a given number of failing scan cells that had failing scan cells located in S scan chains. For instance, an entry in the third row and the fifth column indicates that of the error patterns in which errors were captured in 5 scan cells, 17.55% of those error patterns included errors located in 3 different scan chains.

tic coverage decreased slightly, but it still remained above 95%. In only a few cases of large error patterns did the diagnostic coverage drop below 90%.

TABLE 9

Diagnostic coverage for 370 faulty chips

| mE | #E | Diagnostic coverage | | Cumulative DC | |
|---|---|---|---|---|---|
| 1 | 4760 | 4760 | 100.0 | 4760 | 100.0 |
| 2 | 5112 | 5111 | 100.0 | 9871 | 100.0 |
| 3 | 4426 | 4426 | 100.0 | 14297 | 100.0 |

TABLE 9-continued

Diagnostic coverage for 370 faulty chips

| mE | #E | Diagnostic coverage | | Cumulative DC | |
|---|---|---|---|---|---|
| 4  | 4009 | 3904 | 97.4 | 18201 | 99.4 |
| 5  | 3436 | 3326 | 96.8 | 21527 | 99.0 |
| 6  | 3192 | 3085 | 96.6 | 24612 | 98.7 |
| 7  | 2612 | 2512 | 96.2 | 27124 | 98.5 |
| 8  | 2160 | 2061 | 95.4 | 29185 | 98.2 |
| 9  | 1877 | 1822 | 97.1 | 31007 | 98.2 |
| 10 | 1543 | 1470 | 95.3 | 32477 | 98.0 |
| 11 | 1250 | 1171 | 93.7 | 33648 | 97.9 |
| 12 | 1024 | 939  | 91.7 | 34587 | 97.7 |
| 13 | 951  | 873  | 91.8 | 35460 | 97.5 |
| 14 | 879  | 796  | 90.6 | 36256 | 97.4 |
| 15 | 776  | 707  | 91.1 | 36963 | 97.3 |
| 16 | 582  | 513  | 88.1 | 37476 | 97.1 |
| 17 | 410  | 362  | 88.3 | 37838 | 97.0 |
| 18 | 303  | 258  | 85.1 | 38096 | 96.9 |
| 19 | 216  | 165  | 76.4 | 38261 | 96.8 |
| 20 | 156  | 112  | 71.8 | 38373 | 96.7 |

The total number of error patterns from all examined chips was 41117 (identical patterns for the same chip were counted only once). Among them there were 1503 (i.e., 3.65%) errors of multiplicity greater than 20.35% of the errors from this group were correctly identified.

Exemplary Embodiments for Diagnosis in the Presence of Unknown States

In the following subsection, exemplary techniques and architectures are described for modifying or supplementing the above-described embodiments in order to account for the possible presence of unknown states (sometimes referred to "X states") in the applied test patterns and the compressed test responses. Several of the described embodiments can be used with embedded deterministic test and support a very high quality of test by providing the ability to identify failing scan cells directly from the compacted test responses of the faulty circuits, even in the presence of X values. The ability of certain of the disclosed embodiments to perform diagnostic reasoning based on data collected during a single application of test patterns can simplify tester requirements as well as the overall manufacturing test flow.

Modifying the Search Procedure

The search procedure of any of the disclosed embodiments can be modified to account for the presence of unknown states in a recorded signature. For instance, according to one exemplary approach, one can replace the occurrences of the unknown states in a signature with successive binary combinations of error-free bits (for example, "0"s) and error bits (for example, "1"s) and then apply the search procedure to each modified signature (such as the exemplary procedure presented above) in order to determine locations of failing scan cells. For example, an error signature of 001XX would be replaced with 00100, 00101, 00110, 00111, and each signature analyzed. With an increasing number of unknown states, however, this approach can quickly become computationally infeasible.

According to another exemplary approach, diagnosis can be performed by modifying the search procedure such that it targets only those signature bits indicative of an error (for example, "1"s) and ignores those with unknown states. The exemplary search procedure can then terminate when the updated error signature becomes a vector comprising only bits set either to error-free bits (for example, "0") or unknown bits (for example, "X").

An example of a particular, non-limiting implementation of such a modified search procedure is shown in the pseudocode of Table 10 below. This particular implementation should not be construed as limiting in any way, however, as it may be varied in arrangement and detail without departing from the underlying principles of the disclosed technology.

TABLE 10

Pseudocode for an Exemplary "Select" Function

```
select (error) {
    if (error == −1) return true
    done = false
    ptr = Signature [error].drivers
    while (not done and ptr ≠ null){
        c = ptr → cell
        ptr = ptr → next
        if (not Scan_cells [c].selected) {
            Scan_cells [c].selected = true
            update_signature (c)
            if (select (locate (Signature))) done = true
            else {
                Scan_cells [c].selected = false
                update_signature (c)
            }
        }
    }
    return done
}
```

In this implementation, the modified search procedure is termed the "select" function. As with the exemplary search function described above, the function select in this example desirably is a recursive search function. In certain embodiments of the disclosed technology, the exemplary search function is invoked when a partial solution comprising one or more scan cells already exists.

According to one specific implementation of the search function, the error signature is updated to account for the contribution of a scan cell candidate by calculating the bit-wise sum modulo 2 of the original error signature and the error print associated with the selected scan cell candidate unless any of the signature bits are unknown (for example, set to "X"). In this case, the unknown bits remain "X"s regardless of the XOR operations performed on other bits. In other words, the following bit-wise equations are used when updating the signature: $1 \oplus 0 = 1$, $1 \oplus 1 = 0$, $1 \oplus X = X$. In this exemplary embodiment, the search function attempts to find a new scan cell from a list of drivers associated with an error bit of the signature (a signature bit set to "1") such that the error signature eventually becomes a vector which consists exclusively of error-free bits ("0"s) or unknown bits ("X"s). When this result is achieved, the search function terminates.

In an exemplary implementation, an auxiliary function "locate (Signature)" can be used to determine the location of an en-or bit in the signature being analyzed (a signature bit that is currently set to "1"). If there are no error bits, then the function can return an indication of this result (for example, a value of "−1"). Further, if the exemplary select function fails to find a consistent list of scan cells that capture errors, it can cancel decisions previously made (for example, returning the error signature to its previous status) and evaluate another scan cell candidate as a possible member of the solution set. Thus, as with the search procedure described above with respect to Table 3, the exemplary select function is a form of backtracking procedure. If the scan cells known to have contributed to the error bit under consideration (termed drivers in the exemplary pseudocode) have all been evaluated, for example, the exemplary select function backtracks by returning to its caller, which can repeat the process with a different selected scan cell candidate. In operation, a list of failing scan cells can be obtained by calling the select function with parameter error indicating the location of one of the error bits of the signature being considered.

An exemplary function update_signature (cell) uses the injector polynomial associated with the indicated scan cell to modify the content of the signature according to the 3-value calculus described above wherein unknown states are preserved in the signature. One particular, non-limiting example of this function is provided in the pseudocode of Table 11 below.

TABLE 11

Pseudocode for an Exemplary "Update_Signature" Function

```
update_signature (cell) {
    for tap = 1 to Fan_out {
        bit = Scan_cells [cell].injectors[tap]
        Signature[bit].value = Signature[bit].value ⊕ 1
    }
}
```

Embodiments of the exemplary search procedure can potentially recreate all possible scan cell configurations that might yield a given signature. For example, one can replace the first instruction of the exemplary select function with "return false" to carry on the search process. This property of the procedure can be used to achieve certain other desirable results, which are discussed below. However, with an increasing size of the compactor and an increasing number of scan cells, the corresponding search tree used in the search procedure can grow undesirably large, leading to unacceptable processing times. To reduce the solution space traversed by the search tree, any one or more of the techniques for enhancing the diagnostic search described above can be used with any implementation or alternative embodiment of the exemplary select function. Such techniques can be used, for instance, to effectively prune the diagnostic solution space.

In certain embodiments, the potential of having indistinguishable solutions can be reduced by using a sufficiently large compactor. Nevertheless, because of the possibility of "X" masking (that is, the masking of an error bit by an unknown value), direct application of the exemplary approach can potentially result in the identification of several equivalent causes of a recorded signature. Table 12 below illustrates this phenomenon.

TABLE 12

The average accuracy of diagnosis

| | The number of X states | | | | | | |
|---|---|---|---|---|---|---|---|
| \|E\| | 4 | 8 | 12 | 16 | 20 | 24 | 28 |
| 1 | 1.05 | 1.13 | 1.24 | 1.86 | 1.84 | 2.66 | 4.43 |
| 2 | 1.00 | 1.25 | 1.54 | 7.87 | 5.32 | 7.86 | 15.9 |
| 3 | 1.00 | 1.24 | 2.00 | 2.91 | 7.34 | 8.53 | 15.8 |
| 4 | 1.10 | 1.24 | 2.03 | 3.42 | 4.71 | 16.0 | 15.9 |
| 5 | 1.05 | 1.29 | 2.98 | 2.68 | 3.78 | 3.52 | 8.61 |
| 6 | 1.09 | 1.26 | 1.54 | 6.80 | 5.15 | 6.76 | 12.7 |
| 7 | 1.04 | 1.15 | 1.07 | 1.75 | 1.90 | 3.40 | 6.35 |
| 8 | 1.01 | 1.12 | 1.61 | 2.49 | 3.35 | 6.39 | 6.90 |
| 9 | 1.01 | 1.07 | 2.00 | 3.51 | 3.31 | 4.90 | 6.15 |
| 10 | 1.00 | 1.02 | 1.13 | 1.18 | 3.51 | 2.47 | 4.76 |
| Avg | 1.04 | 1.18 | 1.72 | 3.46 | 4.04 | 6.34 | 9.95 |

Table 12 summarizes the results of simulation experiments using the exemplary procedure illustrated in Tables 10 and 11 carried out for 10,000 randomly generated failing responses and a 128-bit single-output convolutional compactor working with 128 scan chains, each 160-bits long. Each entry in the table provides an average number of different solutions found by the algorithm before the actual error pattern was correctly determined. This quantity is given as a function of error multiplicity $|E|$ and the number of scan cells capturing unknown states. These cells were located in four, randomly chosen, scan chains. As can be seen, with the increasing number of unknown states, the average number of error patterns identified before the exemplary procedure found a solution matching the actual set of failing scan cells increased.

Single Signature-Based Diagnosis

As shown in the previous section, one can use modified embodiments of the exemplary search procedure to determine failing scan cells. Due to "X" masking, however, the quality of such diagnosis may not be acceptable. Therefore, a modified version of the search procedure (for example, that is still within the branch-and-bound framework) can be used. For purposes of this disclosure, this modified technique is sometimes referred herein as "single signature-based diagnosis" or "SSD." One feature of certain embodiments of the disclosed SSD method is to use a measure of likelihood that particular scan cells captured the actual errors observed. For example, and as more fully described above, a weight value associated with respective scan cell candidates and indicative of the likelihood that respective candidate is part of a solution can be used Given enough processing time, all possible causes of a given signature could be obtained. However, in order to reduce the processing time of the diagnostic procedure, the number of equivalent solutions found can be limited for each error signature considered. For purposes of this discussion, a possible solution to an error signature is sometimes referred to as a "candidate error pattern E" and refers to the set of one or more scan cells that explain the error signature. Further, and according to one exemplary embodiment, individual counters associated with each scan chain can be maintained. For example, given a scan chain s, the value of an associated counter $v(s)$ can indicate the number of occurrences of that scan chain in the error patterns identified for a particular test set. Further, and according to one particular implementation, if a given scan chain hosts more than one scan cell in the same error pattern, then the scan chain's contribution to the error pattern is counted only once. Accordingly, the value of the counter $v(s)$ can be characterized as being proportional to the probability that the corresponding scan chain belongs to one or more actual error patterns.

The value of the counters can then be used to guide the scan-cell candidate selection process in order to more quickly determine the most likely locations of failing scan cells. For example, for each candidate error pattern E obtained for a given signature and having multiplicity $|E|$, a weight $W(E)$ can be computed by summing the corresponding scan chain counters over all scan cells that constitute the error pattern. Additionally, the weight can be normalized with respect to the number of scan cells as follows:

$$W(E) = |E|^{-1} \sum_{c \in E} v(s), \qquad (10)$$

where scan chain s hosts memory element c. According to one particular embodiment, the error pattern with the largest weight is considered as the most likely solution.

By using the weight value $W(E)$, the error patterns obtained for previously processed error signatures can be used in subsequent diagnostic steps. For instance, experimental results have shown that, for many stimuli, faults propagate to the same scan cells, to nearby scan cells, or to the same scan chains. One can take advantage of this discovery by preferring scan cell candidates located in scan chains that host scan cells already determined to be likely sites of errors. Thus, the exemplary procedure described above with respect to Equation (10) desirably targets primarily scan chains whose occurrences in the earlier solutions make their associated counters visibly greater than counters associated with other scan chains. The test results reported below use this exemplary procedure and further require that a given scan chain have an associated counter value greater than µ+3σ before it is considered, where µ is the current average value taken over all scan chain counters, and σ is the standard deviation computed over the same counters.

In order to assess performance of the exemplary procedure using Equation (10), a "diagnostic coverage" figure (also discussed above) was used as the basic figure of merit to assess performance. Given a test set, diagnostic coverage is defined as the percentage of error patterns that are diagnosable. An error pattern is said to be diagnosable if all scan cells affected by this error can be correctly identified using a diagnostic algorithm. The diagnostic coverage numbers for the single signature-based method are reported in Tables 13-15 below. The reported experiments were run using fail log information collected during production scan testing of three industrial designs (Designs A, B, and C, respectively). As part of the analysis, simulation of the actual silicon failing responses from faulty chips was performed using a 128-bit single-output convolutional compactor providing a compression ratio as indicated in the table.

TABLE 13

Diagnostic Coverage of Design "A" Using an Exemplary SSD Method

| |E| | % E | Percentage of X states Compression ratio 128x | | | | |
|---|---|---|---|---|---|---|
| Design A | | 0.04 | 0.08 | 0.12 | 0.15 | 0.19 |
| 1 | 26.05 | 100.0 | 98.85 | 92.53 | 89.66 | 77.01 |
| 2 | 11.98 | 80.00 | 63.75 | 51.25 | 40.00 | 18.75 |
| 3 | 9.13 | 90.16 | 83.61 | 73.77 | 70.49 | 55.74 |
| 4 | 8.53 | 89.47 | 70.18 | 66.67 | 40.35 | 45.61 |
| 5 | 5.84 | 82.05 | 64.10 | 53.85 | 35.90 | 17.95 |
| 6 | 6.89 | 89.13 | 58.70 | 56.52 | 34.78 | 30.43 |
| 7 | 6.89 | 76.09 | 47.83 | 43.48 | 19.57 | 13.04 |
| 8 | 4.64 | 61.29 | 45.16 | 19.35 | 6.45 | 6.45 |
| 9 | 3.29 | 59.09 | 22.73 | 22.73 | 9.09 | 0.00 |
| 10 | 2.99 | 35.00 | 20.00 | 5.00 | 0.00 | 0.00 |
| Cumulative | | 85.24 | 71.35 | 63.19 | 51.56 | 41.32 |

TABLE 14

Diagnostic Coverage of Design "B" Using an Exemplary SSD Method

| |E| | % E | Percentage of X states Compression ratio 136x | | | | |
|---|---|---|---|---|---|---|
| Design B | | 0.02 | 0.04 | 0.06 | 0.07 | 0.09 |
| 1 | 57.88 | 99.47 | 97.36 | 95.43 | 91.04 | 89.46 |
| 2 | 22.08 | 94.93 | 81.11 | 69.59 | 57.60 | 41.94 |
| 3 | 6.41 | 90.48 | 73.02 | 53.97 | 53.97 | 50.79 |
| 4 | 5.29 | 73.08 | 61.54 | 57.69 | 38.46 | 32.69 |
| 5 | 1.22 | 83.33 | 66.67 | 66.67 | 33.33 | 58.33 |
| 6 | 0.92 | 88.89 | 77.78 | 22.22 | 66.67 | 55.56 |
| 7 | 3.15 | 51.61 | 38.71 | 48.39 | 35.48 | 16.13 |
| 8 | 0.92 | 88.89 | 66.67 | 44.44 | 66.67 | 33.33 |
| 9 | 1.12 | 100.0 | 72.73 | 63.64 | 63.64 | 45.45 |
| 10 | 0.20 | 100.0 | 100.0 | 100.0 | 100.0 | 100.0 |
| Cumulative | | 94.56 | 87.28 | 81.64 | 75.18 | 69.33 |

TABLE 15

Diagnostic Coverage of Design "C" Using an Exemplary SSD Method

| |E| | % E | Percentage of X states Compression ratio 100x | | | | |
|---|---|---|---|---|---|---|
| Design C | | 0.02 | 0.05 | 0.07 | 0.10 | 0.12 |
| 1 | 37.52 | 99.68 | 98.92 | 96.98 | 95.10 | 92.11 |
| 2 | 21.47 | 95.95 | 81.97 | 70.03 | 59.43 | 48.67 |
| 3 | 8.47 | 94.81 | 82.08 | 68.70 | 60.13 | 50.65 |
| 4 | 9.65 | 79.36 | 63.97 | 57.81 | 48.23 | 43.10 |
| 5 | 3.32 | 86.75 | 76.49 | 66.56 | 51.32 | 35.43 |
| 6 | 2.42 | 88.18 | 80.45 | 70.00 | 61.36 | 46.82 |
| 7 | 2.07 | 84.04 | 77.13 | 72.87 | 58.51 | 46.81 |
| 8 | 1.66 | 72.85 | 66.23 | 56.95 | 44.37 | 31.13 |
| 9 | 2.32 | 71.56 | 68.25 | 58.29 | 43.60 | 42.18 |
| 10 | 2.67 | 53.91 | 51.85 | 50.21 | 41.15 | 26.75 |
| Cumulative | | 92.55 | 85.17 | 78.49 | 71.46 | 64.37 |

As indicated in the first column, each row of Tables 13-15 corresponds to a given multiplicity |E| of error patterns (the number of failing scan cells that constitute the recorded error patterns). The second column % E provides the percentage of observed error patterns of a given size. The next columns report the corresponding diagnostic coverage for five different quantities of "X" states. In each column, a cumulative diagnostic coverage is also provided. The unknown states were injected into two groups of scan cells. The first group comprised unknown cells that remained constant sources of unknown states for all test patterns. The second group comprised scan cells catching unknown values occasionally, depending on the test pattern applied. In both cases, the actual locations of cells having unknown values were selected randomly. Scan cells that captured erroneous signals were excluded.

As can be seen from tables 13-15, as the number of "X" states increased, the diagnostic coverage dropped. This effect is less evident for error patterns of relatively small multiplicity, but it becomes more evident for larger error patterns. From Table 13-15, it can observed that a more robust solution is desirable in certain instances in order to more efficiently handle the ambiguities introduced by the presence of unknown states in recorded signatures.

Alternating-Signature-Based Diagnosis

As indicated earlier, faults often propagate to the same scan cells when different test patterns are applied. This observation can be used to guide the diagnostic search by preferably selecting cells located in scan chains hosting cells already identified as capturing errors. This observation can also be used to increase the accuracy of diagnosis by using one or more additional signatures. For purposes of this discussion, however, reference will be made to the generation of only a second signature, though it should be understood that any of the embodiments described can be modified to generate additional signatures. The second signature can be collected, for example, for every other test pattern (in a so-called "per pattern" mode) or in parallel with the first signature (in a so-called "per cycle" mode).

Figure 16:
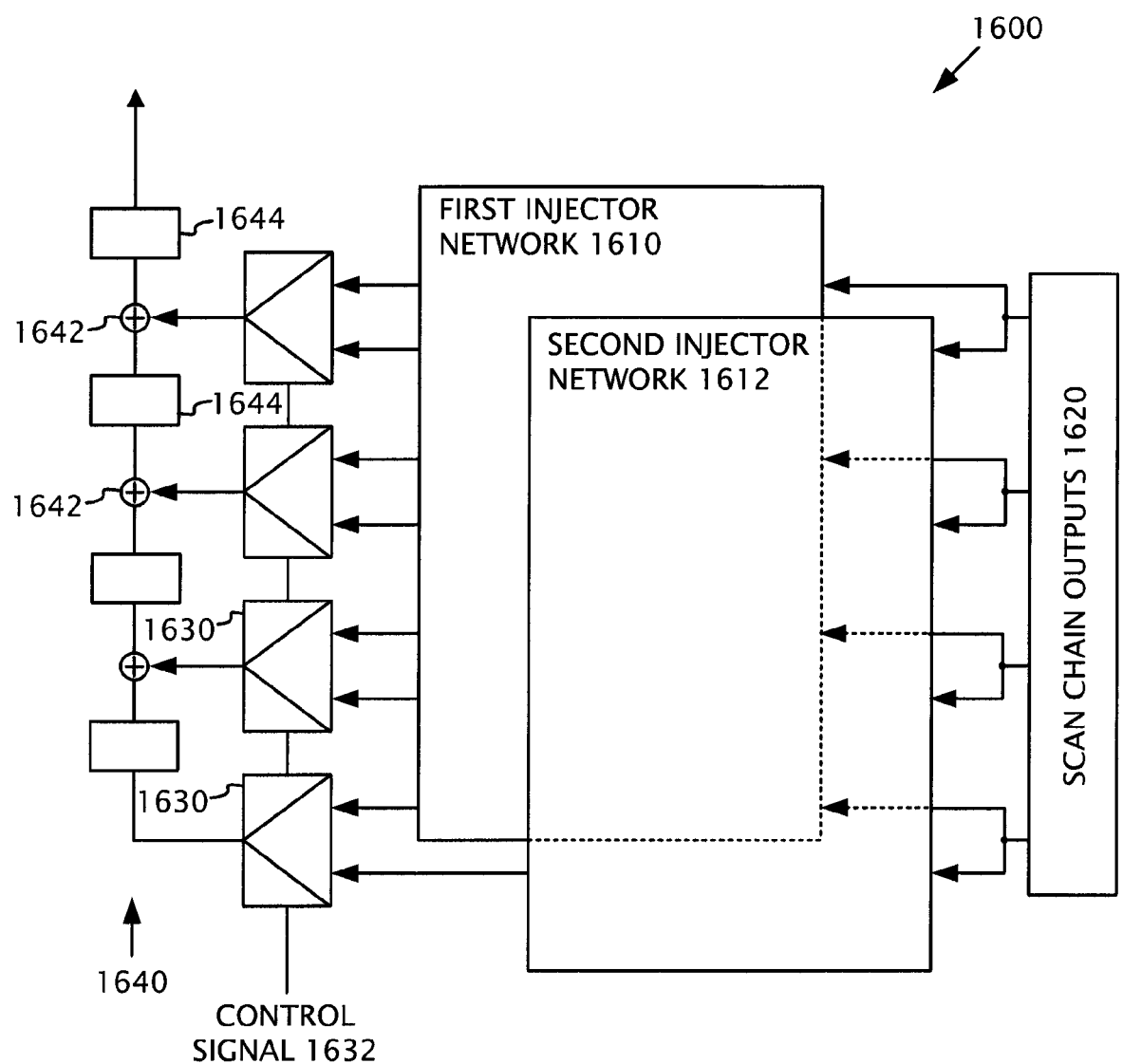
FIG. 16 is a block diagram showing a first exemplary embodiment of a compactor as may be used to enhance fault diagnosis in the presence of unknown states.

Assume, for example, that two consecutive test patterns detect a fault and that the resulting error patterns are identical. The chances of correctly identifying the failing scan cells for such patterns are significantly increased if, instead of producing two identical signatures, two different signatures were generated using two different sets of injector polynomials. An exemplary compactor implementation for producing multiple signatures is shown in FIG. 16. In particular, FIG. 16 illustrates a form of convolutional compactor embodiment, though other compactors (such as other feedback-free compactors or spatial compactors) can be used in other embodiments. In particular, FIG. 16 shows compactor 1600 comprising a first injector network 1610 and a second injector network 1612 (for example, two XOR networks) coupled to receive test response values from scan chain outputs 1620. In the illustrated embodiment, the first injector network 1610 and the second injector network 1612 implement different injector polynomials and therefore different compaction functions. Multiplexers 1630 are configured to receive the outputs from the injector networks 1610, 1612 and to selectively output values from one of the injector networks 1610, 1612 in response to a control signal 1632 (for example, a control signal that alternates the delivery of the output between the injectors with every other test pattern for two or more test patterns). The multiplexers 1630 output values from the respective injector network 1610, 1612 selected by the control signal 1632 into a register 1640. As shown in FIG. 16, three of the four values output from the multiplexers 1630 are input into the register 1640 via gates 1642 (for example, XOR gates). The register 1640 shown in FIG. 16 comprises four memory elements 1644, though this number will vary depending on the size of the injector network and the number of desired compactor outputs. For example, it should be understood that the single register implementation shown in FIG. 16 is an exemplary implementation only and that the compactor can alternatively be implemented using two or more registers. In other embodiments, however, the register 1640 is absent and the multiplexers 1630 directly output the values from the injector networks 1610, 1612. Furthermore, multiple additional injector networks can be coupled to the scan chain outputs 1620 to produce additional signatures. In such embodiments, the multiplexers can be higher-order multiplexers (for example, 3-to-1 multiplexers, 4-to-1 multiplexers, and so on).

According to one exemplary mode of operation, when odd test patterns are applied, the first injector network 1610 is used to generate a signature. In addition, in this mode, while the second injector network is used to generate a signature for even test vectors. In the illustrated embodiment, the multiplexers 1630 are used to make the proper selection of injector polynomials (implemented in the injector networks 1610, 1612) during each test phase.

According to one exemplary embodiment, diagnostics using signatures collected from two independent sets of injector polynomials can be performed as follows. For each odd-numbered signature, one or more solutions are generated (as discussed above using, for example, an embodiment of the select function). Each solution is checked against signatures obtained for neighboring even-numbered test patterns. For instance, this analysis can be performed by simulating a candidate error pattern (for example, one of the solutions for the odd signature) using the set of injector polynomials used to produce the even-numbered signature. If the newly generated signature matches one of the signatures obtained for the even test patterns, the scan cells of the candidate error pattern can be designated or output as a solution (for example, regardless of data collected by their associated counters) for the respective error signatures analyzed. Thus, in this example, solutions to odd-numbered test signatures are checked against even-numbered test signatures. In other embodiments, however, solutions to even-numbered test signatures can be checked against odd-numbered test signatures. Other combinations, orders, and arrangements of producing solutions and checking them against signatures are also possible.

In certain embodiments, the scan chains and/or scan cells identified by this procedure are given a higher (or the highest) priority as the search procedure continues for the next test patterns. It should be noted, however, that matching two signatures does not always succeed even if they are produced by the same errors. This is because different unknown states can occur as two different test vectors are applied. The exemplary method can accordingly be modified in order to allow for partial matching in which some predetermined number of bits may differ (for example, 1, 2, and so on) or to repeat test vectors so that responses are obtained from each test vector input through each respective one of the injector networks 1610, 1612. Implementations of this approach are described below with respect to FIGS. 18 and 19.

Tables 16-18 report results of experiments conducted on the aforementioned industrial faulty chips using the diagnostic approach described above using two independent injector networks. For purposes of this disclosure, this exemplary diagnostic scheme is referred to herein as "alternating signature-based diagnosis" or "ASD." As can be observed, the average results (in terms of diagnostic coverage) are better than the SSD technique.

TABLE 16

Diagnostic Coverage of Design "A" Using an Exemplary ASD Method

| |E| | % E | Percentage of X states Compression ratio 128x | | | | |
|---|---|---|---|---|---|---|
| Design A | | 0.04 | 0.08 | 0.12 | 0.15 | 0.19 |
| 1 | 26.05 | 100.0 | 98.85 | 94.25 | 89.66 | 82.18 |
| 2 | 11.98 | 92.50 | 72.50 | 62.50 | 42.50 | 21.25 |
| 3 | 9.13 | 96.72 | 85.25 | 83.61 | 70.49 | 55.74 |
| 4 | 8.53 | 89.47 | 66.67 | 63.16 | 40.35 | 49.12 |
| 5 | 5.84 | 87.18 | 74.36 | 56.41 | 30.77 | 20.51 |
| 6 | 6.89 | 93.48 | 76.09 | 65.22 | 36.96 | 34.78 |
| 7 | 6.89 | 84.78 | 65.22 | 47.83 | 26.09 | 13.04 |
| 8 | 4.64 | 77.42 | 51.61 | 16.13 | 9.68 | 6.45 |
| 9 | 3.29 | 59.09 | 31.82 | 27.27 | 18.18 | 13.64 |
| 10 | 2.99 | 35.00 | 20.00 | 10.00 | 15.00 | 5.00 |
| Cumulative | | 89.93 | 76.56 | 67.36 | 53.30 | 44.79 |

TABLE 17

Diagnostic Coverage of Design "B" Using an Exemplary ASD Method

| |E| | % E | Percentage of X states Compression ratio 136x | | | | |
|---|---|---|---|---|---|---|
| Design B | | 0.02 | 0.04 | 0.06 | 0.07 | 0.09 |
| 1 | 57.88 | 99.30 | 98.59 | 97.89 | 93.32 | 94.90 |
| 2 | 22.08 | 94.93 | 90.32 | 83.87 | 71.89 | 53.00 |
| 3 | 6.41 | 98.41 | 98.41 | 90.48 | 84.13 | 74.60 |
| 4 | 5.29 | 96.15 | 94.23 | 82.69 | 63.46 | 61.54 |
| 5 | 1.22 | 91.67 | 66.67 | 75.00 | 16.67 | 50.00 |
| 6 | 0.92 | 88.89 | 66.67 | 55.56 | 33.33 | 33.33 |
| 7 | 3.15 | 96.77 | 87.10 | 74.19 | 64.52 | 38.71 |
| 8 | 0.92 | 88.89 | 88.89 | 66.67 | 55.56 | 33.33 |
| 9 | 1.12 | 100.0 | 81.82 | 90.91 | 72.73 | 45.45 |
| 10 | 0.20 | 100.0 | 100.0 | 100.0 | 100.0 | 100.0 |
| Cumulative | | 97.74 | 95.18 | 91.69 | 83.38 | 78.46 |

TABLE 18

Diagnostic Coverage of Design "C" Using an Exemplary ASD Method

| |E| | % E | Percentage of X states Compression ratio 100x | | | | |
|---|---|---|---|---|---|---|
| Design C | | 0.02 | 0.05 | 0.07 | 0.10 | 0.12 |
| 1 | 37.52 | 99.44 | 98.89 | 97.74 | 96.95 | 94.58 |
| 2 | 21.47 | 97.49 | 91.75 | 85.45 | 75.56 | 65.27 |
| 3 | 8.47 | 96.36 | 94.68 | 91.17 | 85.45 | 74.55 |
| 4 | 9.65 | 94.07 | 92.93 | 88.48 | 78.68 | 69.21 |

TABLE 18-continued

Diagnostic Coverage of Design "C" Using an Exemplary ASD Method

| |E| | % E | Percentage of X states Compression ratio 100x | | | | |
|---|---|---|---|---|---|---|
| Design C | | 0.02 | 0.05 | 0.07 | 0.10 | 0.12 |
| 5 | 3.32 | 89.40 | 87.09 | 79.80 | 68.54 | 51.99 |
| 6 | 2.42 | 89.09 | 85.45 | 82.73 | 72.73 | 59.55 |
| 7 | 2.07 | 89.36 | 84.57 | 78.19 | 68.62 | 52.66 |
| 8 | 1.66 | 72.85 | 68.21 | 63.58 | 49.67 | 31.79 |
| 9 | 2.32 | 69.19 | 62.09 | 53.08 | 45.50 | 35.07 |
| 10 | 2.67 | 51.03 | 47.74 | 39.92 | 31.69 | 21.40 |
| Cumulative | | 94.61 | 92.11 | 88.35 | 82.57 | 74.98 |

Figure 17:
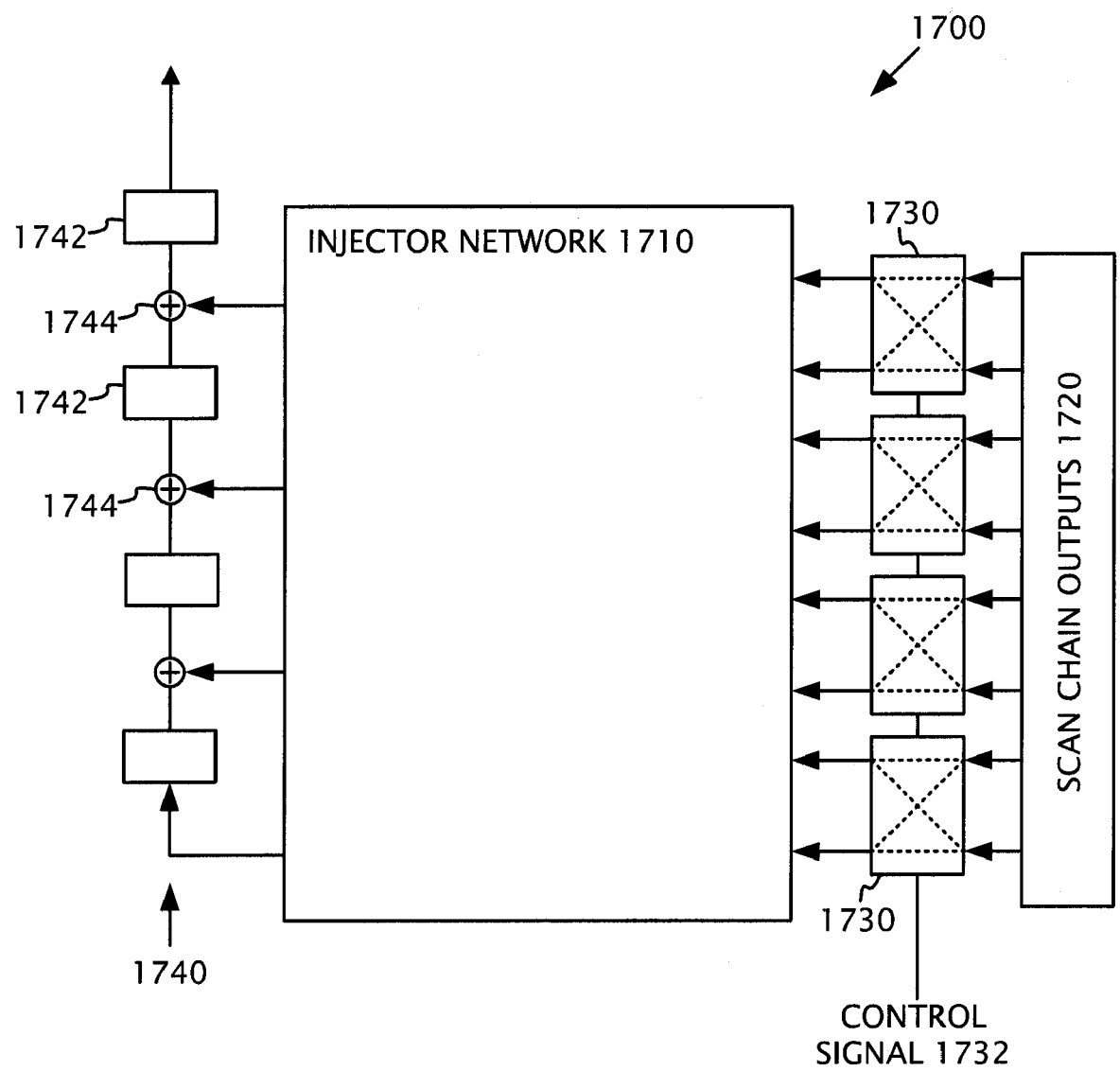
FIG. 17 is a block diagram showing a second exemplary embodiment of a compactor as may be used to enhance fault diagnosis in the presence of unknown states.

Results similar to those presented in Tables 16-18 can also be achieved with a single injector network. FIG. 17 is a block diagram of a compactor 1700 configured for such functionality. In particular, compactor 1700 comprises a single injector network 1710 having inputs coupled to respective pairs of scan chain outputs 1720 via a selection circuit. In the illustrated embodiment, the selection circuit comprises switches 1730 (for example, 2×2 modular switches). The outputs of the injector network 1710 are coupled in the illustrated embodiment to a register 1740 comprising multiple serially connected memory elements 1742. For example, some of the values output from the injector network 1710 can be input into the register 1740 via gates 1744. In other embodiments, however, the register 1740 is absent and the injector network 1710 directly outputs the values from the injector networks. In the illustrated embodiment, the switches 1730 are configured to operate in either a straightforward pass-through mode, or a swap interconnection mode in which the pairs of values output from the scan chain outputs 1720 are coupled to different inputs of the injector network 1710, thus providing two different input configurations into the injector network. In FIG. 17, a single control signal 1732 is used to control how the scan chain outputs are coupled to the inputs of the XOR network for a given test pattern. As a result, every scan chain can be output into two different injector polynomials (defined within the injector network 1710). Thus, for instance, odd test patterns can be loaded into the injector network according to a first input configuration and even test patterns can be loaded according to a second input configuration. The compactor 1700 can therefore implement two different compaction functions.

The particular embodiment shown in FIG. 17 should not be construed as limiting, however, as other variations of the compactor using the disclosed principles of operation are possible. For instance, the switches need not be connected to adjacent scan chain outputs or to just two outputs, but may be coupled to any set of two or more scan chains. Moreover, the switches 1720 may be part of a selection circuit that connects the injector network to the scan chain outputs in multiple additional ways, such that additional input configurations can be used.

Parallel-Signature-Based Diagnosis

Figure 18:
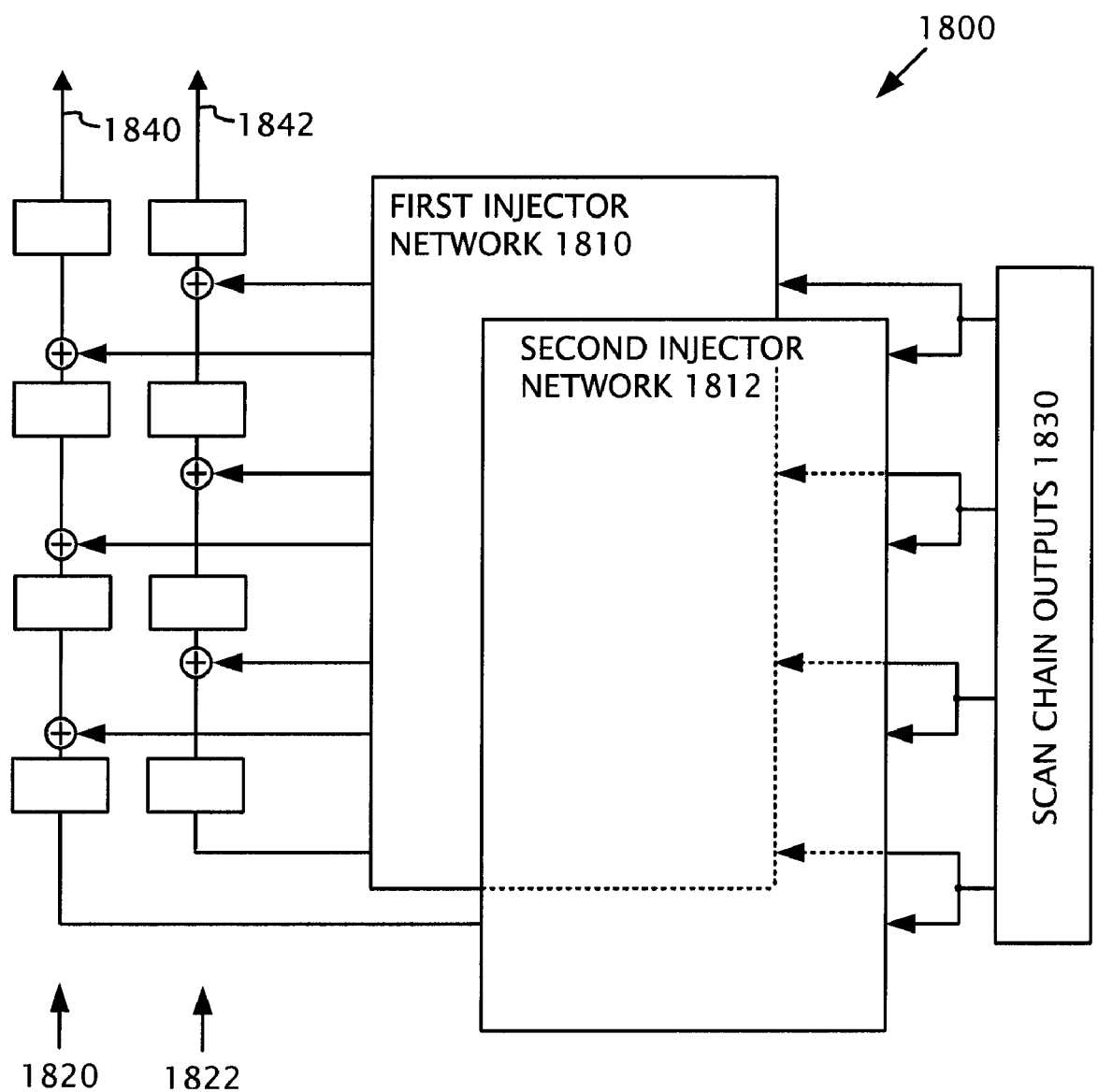
FIG. 18 is a block diagram showing a third exemplary embodiment of a compactor as may be used to enhance fault diagnosis in the presence of unknown states.

Two or more signatures may also be produced from the same test response (error pattern). FIG. 18 shows an exemplary compactor 1800 configured to produce two signatures from the same test response. In the particular exemplary implementation shown in FIG. 18, two convolutional compactors configured to perform different compaction function work in parallel to generate two independent signatures. Additional compactors can be used to produce additional independent signatures from the same inputs. Specifically, two sets of identical test response values output from the scan chain outputs 1830 and simultaneously input into a first injector network 1810 and into a second injector network 1812. The outputs of the first and second injector networks 1810, 1812 are coupled to respective registers 1820, 1822, which output two respective compacted test responses 1840, 1842. It should be understood that the single register implementation shown in FIG. 18 is an exemplary implementation only and that the compactors can alternatively be implemented using two or more registers per compactor. In other embodiments, however, one or more of the registers 1820, 1822 is absent and values are directly output from the injector networks 1810, 1812. As a result of the exemplary architecture illustrated in FIG. 18, two signatures are output from the compactor 1800. These signatures can be, in turn, used to narrow a solution space, thus allowing an accurate identification of failing scan cells. For example, given two signatures $S_1$ and $S_2$, a solution obtained for $S_1$ can be subsequently simulated with respect to the second set of polynomials to see whether it is able to produce $S_2$. According to one exemplary implementation, if the solution being analyzed produces the same signature, it is accepted as the solution and the procedure proceeds to the next signatures; otherwise, another solution is determined and analyzed.

One of the underlying rationales for the approach illustrated by the exemplary compactor 1800 is the observation that, given a pair of signatures $S_1$ and $S_2$ that are originally obtained due to an error pattern of multiplicity k and two sets of injector polynomials, one can determine two different sets of possible solutions (each set comprising multiple error pattern candidates) that explain the respective signatures. Although both sets may comprise a large number of error pattern candidates, it has been observed that the intersection of the two sets is extremely unlikely to consist of more than one error pattern. Numerous Monte Carlo experiments were run to confirm this fact for single-output 32-, 64-, and 128-bit convolutional compactors providing 50×, 100×, and 200× compression. Each result in these experiments was obtained as follows. First, up to 50 different error patterns of multiplicity k=1, . . . , 6 were randomly generated, followed by computation of corresponding signatures $S_1$ and $S_2$. Next, 250,000 different solutions for each $S_1$ were determined. Despite the very large number of solutions for each $S_1$, only one configuration out of 250,000 was able to produce signature $S_2$ in each examined case. Consequently, a solution obtained as a product of two sets generated as shown above can be regarded, with an extremely high probability, as the actual solution for the locations of the scan cells that capture errors associated with the signatures.

Figure 19:
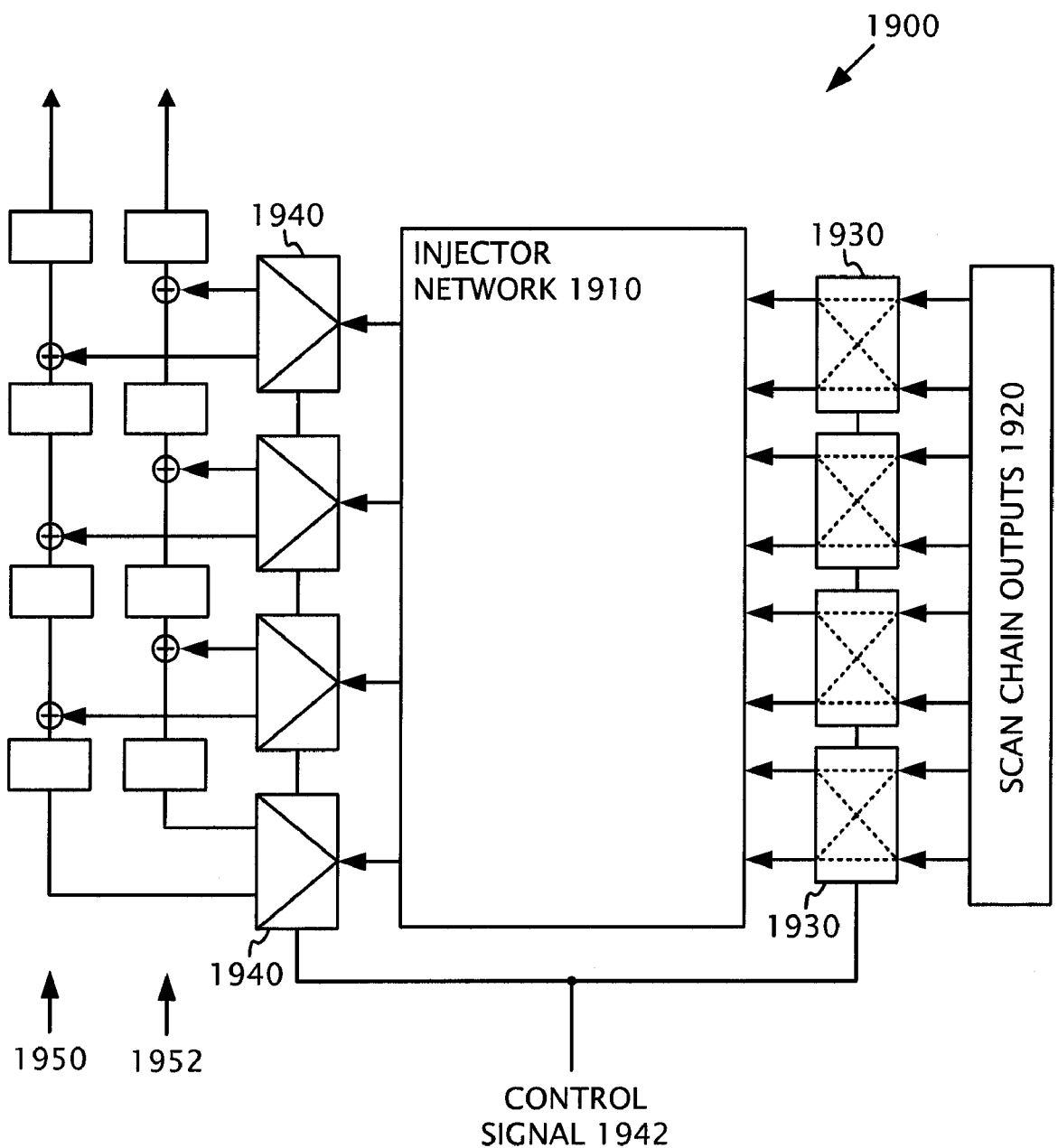
FIG. 19 is a block diagram showing a fourth exemplary embodiment of a compactor as may be used to enhance fault diagnosis in the presence of unknown states.

Similar results can also be achieved with a single injector network. For example, FIG. 19 shows one exemplary architecture of a compactor configured to produce two signatures using one injector network. In particular, compactor 1900 comprises a single injector network 1910 having inputs coupled to respective pairs of scan chain outputs 1920 via a selection circuit (which can comprise switches 1930, such as 2×2 modular switches as in the illustrated embodiment). The outputs of the injector network 1910 are coupled in the illustrated embodiment to demultiplexers 1940 (for example, 1×2 demultiplexers). The demultiplexers 1940 are configured to selectively load one of either a first register 1950 or a second register 1952. In other embodiments, the registers 1950, 1952 are absent and the demultiplexers 1940 directly output values from the compactor 1900. In the illustrated embodiment, the switches 1930 and the demultiplexers 1940 are configured to operate jointly in response to a single control signal 1942 used to indicate how the scan chain outputs are to be coupled to the injector network 1910 and which of the registers 1950, 1952 should be loaded for a given test pattern. As a result, every scan chain can be output into two different injector polynomials (defined within the injector network 1910) and output to one of two different registers 1950, 1952. Thus, the injector network 1910 can be used to implement two different compaction functions. According to one exemplary operation of the compactor 1900, a single scan shift cycle is used to store successive bits of both signatures. For example, the control line 1942 can be pulsed twice as fast as the scan chain clocking system and the clocks operating the registers 1950, 1952 timed so that the compacted results are properly loaded into the registers 1950, 1952.

The particular embodiment shown in FIG. 19 should not be construed as limiting, however, as other variations of the compactor using the disclosed principles of operation are possible. For instance, the switches need not be connected to adjacent scan chain outputs or to just two outputs, but may be coupled to any set of two or more scan chains. Moreover, the switches 1930 may be part of a selection circuit that connects the injector network to the scan chain outputs in multiple additional ways, such that additional input configurations can be used. In such embodiments producing additional signatures, higher-order demultiplexers can be used to selectively output values form the injector into additional registers or outputs (for example, 1-to-3 demultiplexers, 1-to-4 demultiplexers, and so on).

Producing two signatures will typically double the output data volume. The desired compaction ratio can still be achieved, however, by increasing the number of scan chains and shortening each scan chain. For example, to maintain the compaction ratio from a single signature implementation, the number of scan chains can be doubled and the length of each scan chain can be reduced by one half.

According to one exemplary implementation, "parallel signature based diagnosis" or "PSD" diagnostics sequentially resolves increasingly complex signatures (reflecting an increased number of errors) based on information gathered when analyzing signatures having a smaller number of erroneous signals. In general, signatures having a smaller number of erroneous signals are more easily and quickly searched using, for example, an embodiment of the exemplary search procedure described above with respect to Table 10. Analyzing these signatures first can be desirable, however, because little information is typically known about already determined locations of at least some failing scan cells.

One particular, non-limiting implementation of a method for performing PSD diagnostics (which comprises a modification of the methodology described above with respect to FIG. 13) proceeds as follows. For each test pattern $t_i$, signatures $S_1$ and $S_2$ are recorded and their bit-wise logic sum $LS_i$ computed. The signatures $LS_i$ are sorted (for instance, in an ascending order) with respect to the number of errors they feature. The number of errors (for example, "1"s) occurring in each signature provides a rough estimation of the number of scan cells affected by a fault. Consequently, the number of errors in each signature can be used to at least partially assess the degree of difficulty of processing and performing diagnosis on the error signature. For a signature $LS_i$ (selected, for example, according to the order determined above), the original signatures $S_1$ and $S_2$ are retrieved and one of the two signatures selected. For instance, the signature with the larger number of error bits can be selected (for example, the signature that provides more error-related information in spite of masking caused by mutual relationships between errors and unknown states). A search procedure can then be performed. For example, an embodiment of the select function described above with respect to Table 10 or its equivalent can be performed. In certain embodiments, the search procedure only considers scan cell candidates in a limited number of scan chains that may host failing scan cells (a set of one or more scan chains less than all scan chains) in such embodiments (and as more fully described above), the search procedure can be repeated as necessary using new scan chains and corresponding scan cells until a solution is found. If a solution is found and the solution obtained produces the corresponding, non-selected signature as well, then the solution can be accepted. The solution may then be recorded, for instance, in a list of failing scan cells. All relevant information concerning the most likely locations of failing scan cells can then be updated and the process can be repeated for the next error signature. Otherwise, the search procedure is repeated to generate another solution. Any of the various techniques discussed above for reducing the search space or otherwise enhancing the diagnostic search can be used with any implementation or alternative embodiment of this exemplary diagnostic methodology.

The experimental results presented below illustrate the ability of the exemplary scheme described above to recreate original sites of failing scan cells for successive test patterns based on collected test responses. Again, the experiments were conducted on several industrial designs using the fail log information. A diagnostic coverage figure was again employed as a basic figure of merit to access performance of the scheme.

In order to ensure a fair comparison between the PSD scheme and other possible diagnostic schemes described herein, the reported experiments were conducted for the same compression ratios. Therefore, test data regarding locations of failing scan chains was reformatted by doubling the number of scan chains and, consequently, the scan chains themselves were shortened by half.

TABLE 19

The average accuracy of diagnosis of Design "A"
Using an Exemplary PSD Method

| |E| | % E | Percentage of X states Compression ratio 128x | | | | |
|---|---|---|---|---|---|---|
| Design A | | 0.04 | 0.08 | 0.12 | 0.15 | 0.19 |
| 1 | 26.05 | 100.0 | 100.0 | 100.0 | 98.28 | 94.83 |
| 2 | 11.98 | 100.0 | 98.75 | 98.75 | 97.50 | 86.25 |
| 3 | 9.13 | 100.0 | 98.36 | 98.36 | 96.72 | 83.61 |
| 4 | 8.53 | 100.0 | 100.0 | 87.72 | 80.70 | 78.95 |
| 5 | 5.84 | 89.74 | 84.62 | 87.18 | 79.49 | 56.41 |
| 6 | 6.89 | 95.65 | 89.13 | 91.30 | 63.04 | 45.65 |
| 7 | 6.89 | 82.61 | 76.09 | 69.57 | 58.70 | 43.48 |
| 8 | 4.64 | 87.10 | 80.65 | 70.97 | 45.16 | 32.26 |
| 9 | 3.29 | 68.18 | 59.09 | 63.64 | 40.91 | 4.55 |
| 10 | 2.99 | 70.00 | 65.00 | 45.00 | 35.00 | 30.00 |
| Cumulative | | 94.62 | 92.01 | 89.58 | 81.77 | 71.18 |

TABLE 20

The average accuracy of diagnosis of Design "B"
Using an Exemplary PSD Method

| |E| | % E | Percentage of X states Compression ratio 136x | | | | |
|---|---|---|---|---|---|---|
| Design B | | 0.02 | 0.04 | 0.06 | 0.07 | 0.09 |
| 1 | 57.88 | 100.0 | 99.82 | 98.95 | 95.78 | 92.27 |
| 2 | 22.08 | 100.0 | 100.0 | 93.09 | 91.71 | 77.42 |
| 3 | 6.41 | 100.0 | 98.41 | 92.06 | 85.71 | 71.43 |
| 4 | 5.29 | 100.0 | 98.08 | 86.54 | 86.54 | 65.38 |

TABLE 20-continued

The average accuracy of diagnosis of Design "B"
Using an Exemplary PSD Method

| |E| | % E | Percentage of X states Compression ratio 136x | | | | |
|---|---|---|---|---|---|---|
| Design B | | 0.02 | 0.04 | 0.06 | 0.07 | 0.09 |
| 5 | 1.22 | 100.0 | 100.0 | 50.00 | 58.33 | 75.00 |
| 6 | 0.92 | 100.0 | 88.89 | 77.78 | 77.78 | 44.44 |
| 7 | 3.15 | 100.0 | 93.55 | 87.10 | 61.29 | 16.13 |
| 8 | 0.92 | 88.89 | 44.44 | 22.22 | 22.22 | 11.11 |
| 9 | 1.12 | 100.0 | 81.82 | 54.55 | 27.27 | 18.18 |
| 10 | 0.20 | 100.0 | 50.00 | 50.00 | 50.00 | 50.00 |
| Cumulative | | 99.90 | 98.56 | 94.05 | 90.46 | 81.44 |

TABLE 21

The average accuracy of diagnosis of Design "C"
Using an Exemplary PSD Method

| |E| | % E | Percentage of X states Compression ratio 100x | | | | |
|---|---|---|---|---|---|---|
| Design C | | 0.02 | 0.05 | 0.07 | 0.10 | 0.12 |
| 1 | 37.52 | 100.0 | 99.94 | 99.62 | 97.83 | 93.26 |
| 2 | 21.47 | 99.64 | 99.33 | 97.03 | 92.11 | 83.50 |
| 3 | 8.47 | 96.49 | 96.23 | 91.69 | 85.06 | 71.17 |
| 4 | 9.65 | 91.79 | 90.08 | 86.43 | 77.65 | 61.69 |
| 5 | 3.32 | 76.16 | 73.51 | 69.54 | 57.62 | 50.33 |
| 6 | 2.42 | 87.27 | 83.18 | 76.82 | 57.27 | 37.73 |
| 7 | 2.07 | 78.72 | 74.47 | 62.23 | 51.60 | 27.13 |
| 8 | 1.66 | 68.87 | 58.94 | 53.64 | 35.10 | 23.18 |
| 9 | 2.32 | 64.93 | 57.35 | 46.92 | 30.81 | 12.80 |
| 10 | 2.67 | 54.73 | 48.97 | 42.39 | 27.98 | 11.11 |
| Cumulative | | 94.27 | 93.13 | 90.51 | 84.73 | 75.38 |

The diagnostic coverage numbers are shown in Tables 19-21. The compactor scheme illustrated in FIG. 19 was used to collect the signature data (wherein the injector network is remapped in order to produce two signatures). As can be seen, the results are better than those presented in Tables 12-18.

Further experiments using the PSD method were conducted on an industrial design for which real locations of "X" states were available. The design featured 128 scan chains, each 3062 bits long. The scan cells affected by the "X" states were determined individually for 2,501 test patterns applied. The corresponding distribution of "X" states with respect to the number of affected scan chains is shown in Table 22. In particular, the second and fourth rows of Table 22 indicate the number of cases in which the sources of "X" states in a respective pattern were confined to k scan chains.

TABLE 22

Distribution of "X" States in Scan Chains of Exemplary Test Circuits

| | k | | | | | | | | |
|---|---|---|---|---|---|---|---|---|---|
| | 0-2 | 3 | 4 | 5 | 6 | 7 | 8 | 9 | 10 | 11 |
| # of cases | 0 | 470 | 342 | 68 | 82 | 135 | 220 | 242 | 191 | 122 |

| | k | | | | | | | | |
|---|---|---|---|---|---|---|---|---|---|
| | 12 | 13 | 14 | 15 | 16 | 17 | 18 | 19 | 20 | 21 |
| # of cases | 133 | 126 | 113 | 92 | 83 | 45 | 27 | 7 | 2 | 1 |

The experimental results with respect to the diagnostic coverage (DC) for 1,055 actual faulty chips manufactured according to the design are shown in Table 23. For purposes of the experiments reported in Table 23, a single-output 128-bit convolutional compactor was simulated. The total number of different error patterns in all examined chips amounted to 13,769 (identical patterns were counted only once). Among them there were 427 (about 3.1%) with errors of multiplicity greater than 20. This information is presented in the first two columns of Table 23. The actual results (the absolute number of properly diagnosed errors and the corresponding percentage) are reported in the columns labeled "diagnostic coverage." The next two columns provide the cumulative diagnostic coverage (the total number of successfully identified en-or patterns of multiplicities up to a value represented by a respective row of the table) and the corresponding percentage. As can be seen, for error patterns up to an error multiplicity of 7, diagnostic coverage greater than 90% was achieved. For larger error patterns, the diagnostic coverage gradually decreased. The number of errors of greater multiplicity was, however, relatively small. Despite this decrease, however, the cumulative diagnostic coverage for all examined errors still remained above 92 percent. Finally, certain error patterns could not be correctly identified as at least one of the affected scan cells (those comprising a given error pattern) was unobservable due to the presence of unknown states. The number of such cases for each multiplicity is listed in column "MC" of Table 23.

TABLE 23

Diagnostic coverage for industrial design with pre-determined locations of X states

| |E| | #E | Diagnostic coverage | | Cumulative DC | | MC |
|---|---|---|---|---|---|---|
| 1 | 3545 | 3525 | 99.44 | 3525 | 99.44 | 5 |
| 2 | 2735 | 2689 | 98.32 | 6214 | 98.95 | 8 |
| 3 | 1764 | 1726 | 97.85 | 7940 | 98.71 | 12 |
| 4 | 1350 | 1282 | 94.96 | 9222 | 98.17 | 4 |
| 5 | 908 | 864 | 95.15 | 10086 | 97.90 | 3 |
| 6 | 694 | 639 | 92.07 | 10725 | 97.54 | 0 |
| 7 | 513 | 467 | 91.03 | 11192 | 97.25 | 2 |
| 8 | 424 | 353 | 83.25 | 11545 | 96.75 | 5 |
| 9 | 291 | 227 | 78.01 | 11772 | 96.30 | 6 |
| 10 | 236 | 156 | 66.10 | 11928 | 95.73 | 1 |
| 11 | 173 | 102 | 58.96 | 12030 | 95.23 | 5 |
| 12 | 142 | 81 | 57.04 | 12111 | 94.80 | 2 |
| 13 | 97 | 48 | 49.48 | 12159 | 94.46 | 2 |
| 14 | 101 | 51 | 50.50 | 12210 | 94.12 | 1 |
| 15 | 90 | 45 | 50.00 | 12255 | 93.81 | 0 |
| 16 | 92 | 36 | 39.13 | 12291 | 93.43 | 5 |
| 17 | 60 | 28 | 46.67 | 12319 | 93.22 | 1 |
| 18 | 51 | 17 | 33.33 | 12336 | 92.99 | 2 |
| 19 | 39 | 13 | 33.33 | 12349 | 92.81 | 0 |
| 20 | 37 | 15 | 40.54 | 12364 | 92.67 | 2 |

Exemplary Computing Environments

Figure 14:
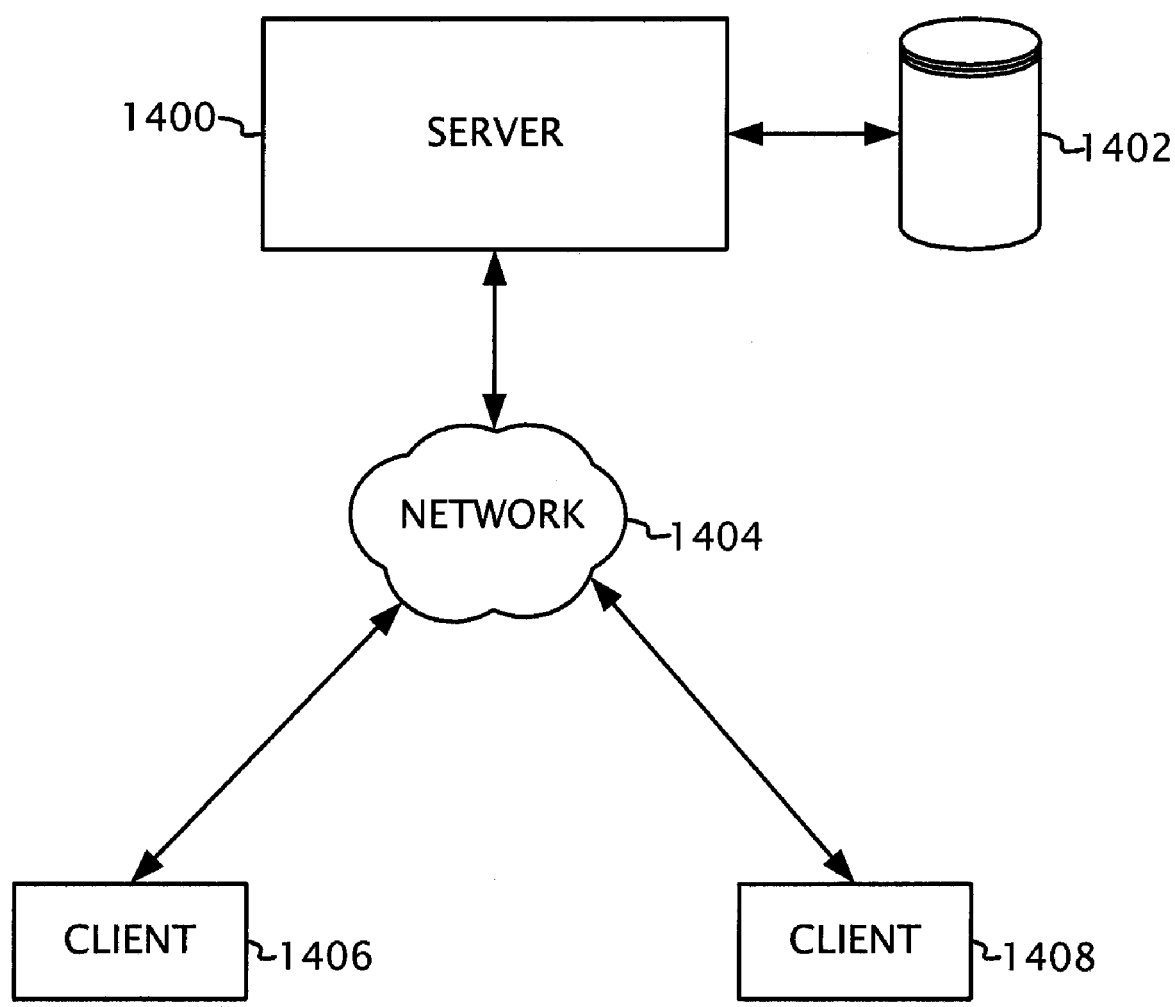
FIG. 14 is a block diagram showing an exemplary computer network as may be used to perform any of the disclosed methods.
Figure 15:
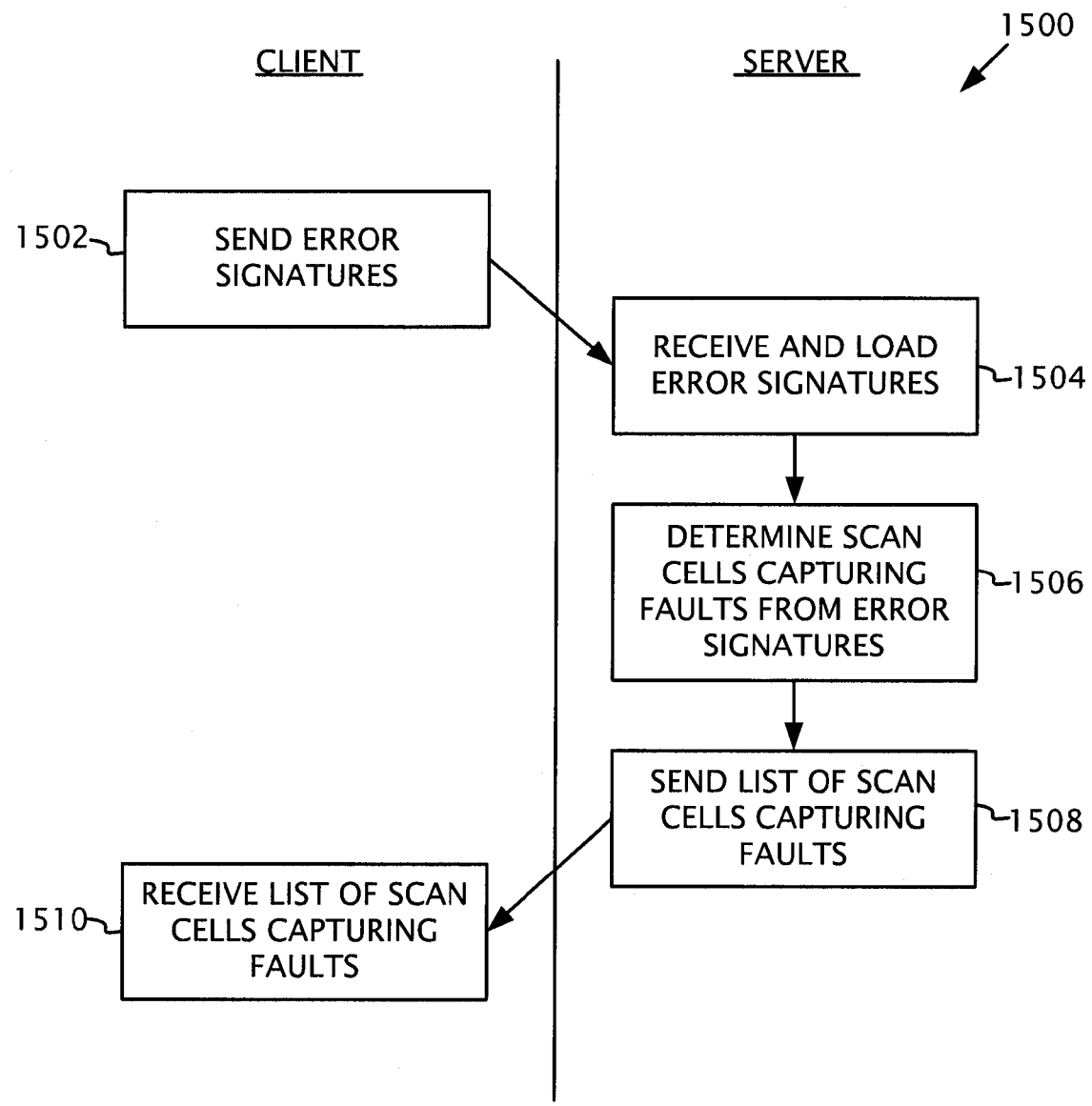
FIG. 15 is a flowchart of a method for fault diagnosis utilizing the network of FIG. 14.

Any of the aspects of the technology described above can be performed using a distributed computer network. FIG. 14 shows one such exemplary network. A server computer 1400 can have an associated storage device 1402 (internal or external to the server computer). The server computer 1400 can be coupled to a network, shown generally at 1404, which can comprise, for example, a wide-area network, a local-area network, a client-server network, the Internet, or other such network. One or more client computers, such as those shown at 1406, 1408, can be coupled to the network 1404 using a network protocol. In one example, the client computer can be configured to receive compressed test responses or error signatures from a tester on a production floor (e.g., the client computer can be part of the tester, remotely coupled to the tester, or receive compressed test responses stored on one or more computer-readable media). FIG. 15 shows an example of how the client computer can then interface with the server computer 1400 in order to perform fault diagnosis. FIG. 15 shows that a database or data structure containing the error signatures can be analyzed according to any of the embodiments disclosed herein using a remote server computer, such as the server computer 1400 shown in FIG. 14. At process block 1502, for example, the client computer sends the errors signatures or other appropriate data concerning the compressed test responses. Information concerning the architecture of the compactor can be sent as part of this process as well. In process block 1504, the error signatures are received and loaded by the server computer. In process block 1506, fault diagnosis is performed using any of the disclosed embodiments. At process block 1508, the server computer sends the result of the diagnostic procedure (e.g., the scan cells capturing faults) to the client computer, which receives the results at process block 1510. It should be apparent to those skilled in the art that the example shown in FIG. 15 is not the only way to perform fault diagnosis using multiple computers. For instance, the errors signatures or other data associated with the compressed test responses can be stored on one or more computer-readable media that is not on a network and that is sent separately to the server (e.g., a CD-Rom, DVD, or portable hard drive). Or, the server computer can perform only a portion of the fault diagnostic procedure.

Having illustrated and described the principles of the disclosed technology, it will be apparent to those skilled in the art that the disclosed embodiments can be modified in arrangement and detail without departing from such principles. In view of the many possible embodiments, it will be recognized that the illustrated embodiments include only examples and should not be taken as a limitation on the scope of the disclosed technology. Rather, the disclosed technology includes all novel and nonobvious features and aspects of the various disclosed apparatus, methods, systems, and equivalents thereof, alone and in various combinations and subcombinations with one another.

The invention claimed is:

1. One or more computer-readable storage devices storing computer-executable instructions which when executed by a computer cause the computer to perform a method the method comprising:
   receiving at least one error signature comprising multiple bits, the bits of the error signature comprising one or more error bits that indicate errors in a compressed test response produced by a compactor in a circuit-under-test;
   evaluating plural potential-error-bit-explaining scan cell candidates using a search tree; and
   determining whether one or more of the evaluated scan cell candidates explain the error bits in the error signature and thereby constitute one or more failing scan cells.

2. The one or more computer-readable storage devices of claim 1, wherein the method further comprises selecting the error signature from a list of error signatures, the selection being based at least partially on the number of errors in the error signature.

3. The one or more computer-readable storage devices of claim 1, wherein the act of receiving at least one error signature comprises receiving an error signature corresponding to a compressed test response for a single applied test pattern.

4. The one or more computer-readable storage devices of claim 1, wherein the act of receiving at least one error signature comprises receiving an error signature corresponding to the initial compressed test response for one or more applied test patterns.

5. The one or more computer-readable storage devices of claim 1, wherein the method further comprises prioritizing the order in which the scan cell candidates are evaluated using the search tree, the order being at least partially dependent on one or more of (a) whether the respective scan cell candidates were previously determined to be failing scan cells, (b) whether the respective scan cell candidates are in a scan chain having one or more scan cells that were previously determined to be failing scan cells, (c) the number of error bits in the error signature that are determined in part by scan cells output during the same time period as the respective scan cell candidates, (d) whether the error signature received matches a generic error pattern indicative of two or more errors masking one another in the compactor, or (e) weights assigned to the scan cell candidates, the weights corresponding to a likelihood that a respective scan cell candidate is at least a part of a solution group of one or more failing scan cells that explains the error bits in the one or more error signature.

6. The one or more computer-readable storage devices of claim 1, wherein the act of receiving at least one error signature comprises receiving at least first and second error signatures, and wherein the act of determining further comprises determining whether the one or more failing scan cells determined to explain the error bits in the first error signature also explain error bits of the second error signature, the second error signature being different from the first error signature.

7. The one or more computer-readable storage devices of claim 1, wherein the act of receiving at least one error signature further comprises receiving at least one error signature with one or more unknown bits that indicate unknown values at corresponding bit locations of the compressed test response.

8. The one or more computer-readable storage devices of claim 1, wherein the method further comprises storing a list of the one or more failing scan cells and using the list to locate a defect in the circuit-under-test.

9. One or more computer-readable storage devices storing computer-executable instructions which when executed by a computer cause the computer to perform a method the method comprising:
   receiving an error signature comprising multiple bits, the bits of the error signature comprising one or more error bits that indicate errors in a compressed test response produced by a compactor in a circuit-under-test;
   selecting at least one error bit of the error signature;
   selecting at least one scan cell candidate from a set of scan cells known to contribute to the bit of the compressed test response corresponding to the selected at least one error bit; and
   determining whether the selected at least one scan cell candidate explains the selected at least one error bit in the error signature by updating the error signature to include the contribution of the at least one selected error bit.

10. The one or more computer-readable storage devices of claim 9, wherein the act of determining further comprises, if the selected at least one scan cell candidate does not explain the selected at least one error bit in the error signature, using the updated error signature as the error signature and iteratively repeating the method at least one time.

11. The one or more computer-readable storage devices of claim 10, wherein the method further comprises backtracking to an earlier iteration if no solution is found, the solution being one or more scan cells that explain the presence of the selected at least one error bit of one error signature.

12. The one or more computer-readable storage devices of claim 10, wherein the method further comprises backtracking to an earlier iteration if progress toward a solution does not meet a threshold after a predetermined number of scan cell candidates have been selected and determined not to explain the selected at least one error bit.

13. The one or more computer-readable storage devices of claim 9, wherein the act of updating the error signature is performed by computing a bit-wise modulo-two sum of the error signature and an error print associated with the selected at least one scan cell candidate.

14. The one or more computer-readable storage devices of claim 9, wherein the method further comprises diagnosing a defect in the circuit-under-test using one or more scan cells determined to explain the presence of the selected at least one error bit of one error signature.

15. A system for diagnosing faults in a circuit-under-test, comprising:
- means for receiving at least one error signature comprising multiple bits, the bits of the error signature comprising one or more error bits that indicate errors in a compressed test response;
- means for evaluating plural potential-error-bit-explaining scan cell candidates using a search tree; and
- means for determining whether one or more of the evaluated scan cell candidates explain the error bits in the error signature and thereby constitute one or more failing scan cells.

16. The system of claim 15, further comprising means for selecting the error signature from a list of error signatures, the selection being based at least partially on the number of errors in the error signature.

17. The system of claim 15, wherein the means for receiving at least one error signature comprises means for receiving an error signature corresponding to a compressed test response for a single applied test pattern.

18. The system of claim 15, further comprising means for prioritizing the order in which the scan cell candidates are evaluated using the search tree, the order being at least partially dependent on one or more of (a) whether the respective scan cell candidates were previously determined to be failing scan cells, (b) whether the respective scan cell candidates are in a scan chain having one or more scan cells that were previously determined to be failing scan cells, (c) the number of error bits in the error signature that are determined in part by scan cells output during the same time period as the respective scan cell candidates, (d) whether the error signature received matches a generic error pattern indicative of two or more errors masking one another in the compactor, or (e) weights assigned to the scan cell candidates, the weights corresponding to a likelihood that a respective scan cell candidate is at least a part of a solution group of one or more failing scan cells that explains the error bits in the one or more error signature.

19. The system of claim 15, wherein the means for receiving at least one error signature comprises means for receiving at least first and second error signatures, and wherein the act of determining further comprises determining whether the one or more failing scan cells determined to explain the error bits in the first error signature also explain error bits of the second error signature, the second error signature being different from the first error signature.

20. The system of claim 15, wherein the means for receiving at least one error signature further comprises means for receiving at least one error signature with one or more unknown bits that indicate unknown values at corresponding bit locations of the compressed test response.

* * * * *